United States Patent

Yoshihara et al.

[11] Patent Number: 5,898,909
[45] Date of Patent: Apr. 27, 1999

[54] ULTRA HIGH FREQUENCY RADIO COMMUNICATION APPARATUS

[75] Inventors: Kunio Yoshihara; Kouhei Morizuka; Mitsuo Konno; Yasuo Ashizawa; Junko Akagi; Yasuhiro Kuriyama; Motoyasu Morinaga; Eiji Takagi; Yasushi Shizuki; Yuji Iseki; Takeshi Hanawa; Takeshi Miyagi, all of Kanagawa, Japan

[73] Assignee: Kabushiki Kaisha Toshiba, Kawasaki, Japan

[21] Appl. No.: 08/720,379

[22] Filed: Sep. 27, 1996

[30] Foreign Application Priority Data

Sep. 29, 1995 [JP] Japan ................................. 7-253304
Jul. 10, 1996 [JP] Japan ................................. 8-180846

[51] Int. Cl.⁶ ...................................................... H04B 1/38
[52] U.S. Cl. .............................................. 455/73; 455/90
[58] Field of Search ............................. 455/66, 73, 78, 455/80, 82, 83, 90, 128, 347, 300, 301, 351, 575; 361/814, 816; 257/723, 724, 679

[56] References Cited

U.S. PATENT DOCUMENTS 5,423,080  6/1995  Perret et al. .............................. 455/90
5,448,110  9/1995  Tuttle et al. ............................. 257/723
5,513,382  4/1996  Agahi-Kesheh et al. ................. 455/82

FOREIGN PATENT DOCUMENTS 0171228      8/1986  Japan ........................................ 455/73
404-159825   6/1992  Japan ........................................ 455/73
WO89/05067   6/1989  WIPO ....................................... 455/73

Primary Examiner—Thanh Cong Le
Attorney, Agent, or Firm—Foley & Lardner

[57] ABSTRACT

Disclosed is an ultra high frequency radio communication apparatus having: a receiver antenna; a transmitter antenna; an IC chip being electrically connected to the receiver antenna and the transmitter antenna; a substrate on which the receiver antenna, the transmitter antenna and the IC chip are mounted; an input terminal for inputting to the IC chip a base band input signal; an output terminal for outputting a base band output signal from the IC chip; and a control signal terminal for inputting a control signal for controlling the IC chip to the IC chip. The IC chip is placed in a shielding space such that the cut-off frequency of the shielding space is higher than the frequency of a carrier signal for radio communication.

22 Claims, 47 Drawing Sheets

ULTRA HIGH FREQUENCY RADIO COMMUNICATION APPARATUS

BACKGROUND OF THE INVENTION

1. Field of the Invention

The present invention relates to an ultra high frequency band radio communication apparatus employing a band of ultra high frequencies.

2. Description of the Prior Art

Ultra high frequency band radio communication apparatuses are known as using a milliwave band or quasi-milliwave band of ultra high frequencies over 10 GHz. Any conventional ultra high frequency radio communication apparatus comprises a combination of circuit blocks made of component assemblies for both transmitter and receiver functions.

FIG. 1 illustrates an ultra high frequency device 1 of a fundamental type for use as a high-frequency high-power amplifier in such a conventional apparatus, in which one or more semiconductor chips C which act as a high-frequency high-power amplifier are installed in a package P. The package P has two feed through members T provided at both longitudinal ends thereof for input and output of signals of ultra high frequencies as extending outwardly of the package P. The feed through T is often used as a coaxial connector for connection of its package P. The ultra high frequency device 1 is coupled by a coaxial cable with a relevant connector or a high frequency printed circuit board to an antenna, an oscillator circuit, a frequency converter circuit, and others, thus constituting a transmitter and receiver combination.

FIG. 2 shows a transmitter module 2 which contains a semiconductor chip having functions of a plurality of the semiconductor chips C of the package device 1 illustrates in FIG. 1 and has the functions for transmission in a package P'. The transmitter module 2 includes, as shown in FIG. 3, a semiconductor chip C1 functioning as an oscillator circuit (OSC), a semiconductor chip C2 functioning as a modulator circuit, and a semiconductor chip C3 functioning as a power amplifier circuit (PA) in the package P'. Each of the semiconductor chips forms a circuit block having a particular function.

The semiconductor chips C1, C2, and C3 are shaped of substantially 2 mm square and installed in the package P' which serves as a shielding from the outside and has inner compartments defined by partitions extending from the side wall thereof. As the semiconductor chips C1, C2, and C3 are located in their respective compartments of the package P', they are joined to one another by coaxial members or microwave transmission lines hence creating the transmitter module 2. The receiver module including a low noise high frequency amplifier circuit (LNA) and a demodulator circuit may also be constructed by the same manner.

The shielding of each of the semiconductor chips C1, C2, and C3 from the other in the transmitter module 2 is designed for preventing interference between any two adjacent semiconductor chips and also, generation of cavity resonance on the carrier frequency caused by extension of the space. If the package P' has non of the partitions shown in FIG. 2 with the semiconductor chips all being located in a large single space, the generation of cavity resonance will possibly be increased.

FIG. 4 shows another type of the conventional transmitter module. The transmitter module 3 of FIG. 4 includes a semiconductor chip C1 of an oscillator circuit, a semiconductor chip C2 of a modulator circuit, and a semiconductor chip C3 of a power amplifier circuit joined in a cascade connection in a package P''. The size of the semiconductor chips is 1.5 mm to 2 mm square. The semiconductor chip C3 is connected by a transmission line to the connector G of a wave guide of which output is joined to an antenna. Since loss in the wave guide is generally smaller than that in the transmission line, the output of circuit blocks in the transmitter module 3 can be transmitted with minimum loss from the wave guide to the antenna. The above construction is not limited to the transmitter but may be applied to the receiver module with equal success. In the receiver module of the same construction as of FIG. 4, semiconductor chips are connected from a voltage-controlled oscillator circuit (VCO) to a buffer amplifier circuit (BUF), a frequency converter circuit (MIX), and a low noise amplifier circuit (LNA) as shown in FIG. 5.

Although the semiconductor chips C1, C2, and C3 in the transmitter module 3 of FIG. 4 are not shielded separately, they may be operable as their overall dimensions are small enough.

The conventional devices or modules of the foregoing types are however unfavorable to satisfy serious requirements including downsizing and cost saving of the ultra high frequency radio communication apparatus, while every up to date electronic or electric apparatus is required to reduce its size to a minimum.

More particularly, the conventional device 1 shown in FIG. 1 carries only a part of the entire arrangement of a common radio communication apparatus and when it is used, the radio communication apparatus will be bulky in the size and costly to some extent.

The transmitter module 2 shown in FIG. 2 includes a plurality of devices similar to the device of FIG. 1 and allows the radio communication apparatus to be smaller in the size as compared with the use of the device of FIG. 1. The transmitter module 2 has however the semiconductor chips of different sizes shielded separately in its package which is thus maintained in a considerable size, hardly reducing the overall dimensions as well as the production cost. Also, the transmitter module 2 has to be joined to other modules including a receiver and an antenna with the use of bulky wave guides, coaxial cables, or high frequency circuit board, hence causing the radio communication apparatus to stay heavy.

The transmitter module 3 shown in FIG. 4 may be reduced to a smaller size than the transmitter module 2 of FIG. 2. However, the transmitter module 3 also has to be joined to other modules including a receiver and an antenna with the use of bulky wave guides, coaxial cables, or high frequency circuit board, hence contributing to the incomplete downsizing of the radio communication apparatus.

SUMMARY OF THE INVENTION

With these problems in mind, therefore, it is an object of the present invention, for eliminating the above disadvantages, to provide an ultra high frequency radio communication apparatus which is smaller in the overall size and lower in the production cost.

In order to achive the above-mentioned object, an ultra high frequency radio communication apparatus according to the present invention comprises: a receiver antenna; a transmitter antenna; an IC chip being electrically connected to the receiver antenna and the transmitter antenna; a substrate on which the receiver antenna, the transmitter antenna and the IC chip are mounted; an input terminal for inputting to the IC chip a base band input signal; an output terminal for outputting a base band output signal from the IC chip; and a control signal terminal for inputting a control signal for controlling the IC chip to the IC chip.

Another ultra high frequency radio communication apparatus according to the present invention comprises: a receiver antenna; a transmitter antenna; an IC chip being electrically connected to the receiver antenna and the transmitter antenna; a substrate on which the receiver antenna, the transmitter antenna and the IC chip are mounted; an input terminal for inputting a base band input signal to the IC chip; an output terminal for outputting a base band output signal from the IC chip; a control signal terminal for inputting to theIC chip a control signal for controlling the IC chip; and a shielding device for producing a shielding space such that the cut-off frequency of the shielding space is higher than the frequency of a carrier signal for radio communication in such a manner that the IC chip is located in the shielding space.

Another ultra high frequency radio communication apparatus according to the present invention comprises: a package having a constriction portion such that the cut-off frequency of the constriction portion is higher than the frequency of a carrier signal for radio communication; a receiver antenna; a transmitter antenna; an IC chip being electrically connected to the receiver antenna and the transmitter antenna; an input terminal for inputting a base band input signal to the IC chip; an output terminal for outputting a base band output signal from the IC chip; a control signal terminal for inputting to the IC chip a control signal for controlling the IC chip; and a substrate installed in the package in which the receiver antenna, the transmitter antenna and the IC chip are mounted on the substrate in such a manner that the IC chip is located in the constriction portion.

In accordance with the above construction, the ultra high frequency radio communication module of the present invention is applicable in the form of a transmitter-receiver module for radio communications LAN with two, transmitter and receiver, antennas, which prevents relative interference of the two antennas with each other, ensures a stable action of its RF circuit, and connects the RF circuit directly to the two antennas hence minimizing the overall size and offering a high performance. More specifically, the ultra high frequency radio communication module of the present invention can thus be reduced in the production cost as well as the overall size and utilized in a small sized personal computer or personal data terminal.

BRIEF DESCRIPTION OF THE DRAWINGS

The features and advantages of the ultra high frequency radio communication apparatus according to the present invention over the proposed will be more clearly understood from the following description of the preferred embodiments of the present invention taken in conjunction with the accompanying drawings in which like reference numerals designate the same or similar elements or sections throughout the figures thereof and in which.

DETAILED DESCRIPTION OF THE PREFERRED EMBODIMENTS

An ultra high frequency radio communication apparatus comprises semiconductor chips including essential circuits for processing transmitting and received signals, a transmitter antenna, and a receiver antenna. The quality of processed signals in the circuits is affected by interactions between the semiconductor chips and the transmitter and/or receiver antenna, interference between the transmitter antenna and the receiver antenna, and resonance in the spaces of installation. It may also be declined by interaction between the semiconductor chips which include corresponding signal processing circuits. For example, an output signal from PA is partially fed back to OSC due to the interaction between the two semiconductor chips, and its subsequent output may be affected, decreasing the quality. For preventing the above drawback, the transmitter and receiver antennas are physically separated from a package in which the semiconductor chips for signal processing are installed, and connected as separate components.

There have been proposed a variety of approaches to minimize the overall size of the ultra high frequency radio communication apparatus of a type. So far, a possible arrangement in which the transmitter and receiver antennas are mounted together with the semiconductor chips for signal processing in one single package or a transmitter and receiver module is not attempted because the prescribed drawback is hardly overcome. The present invention is directed towards such a transmitter-receiver module having the transmitter and receiver antennas mounted together with the semiconductor chips for signal processing in one single package which is one of the best means for minimizing the size of the ultra high frequency radio communication apparatus.

Figure 1:
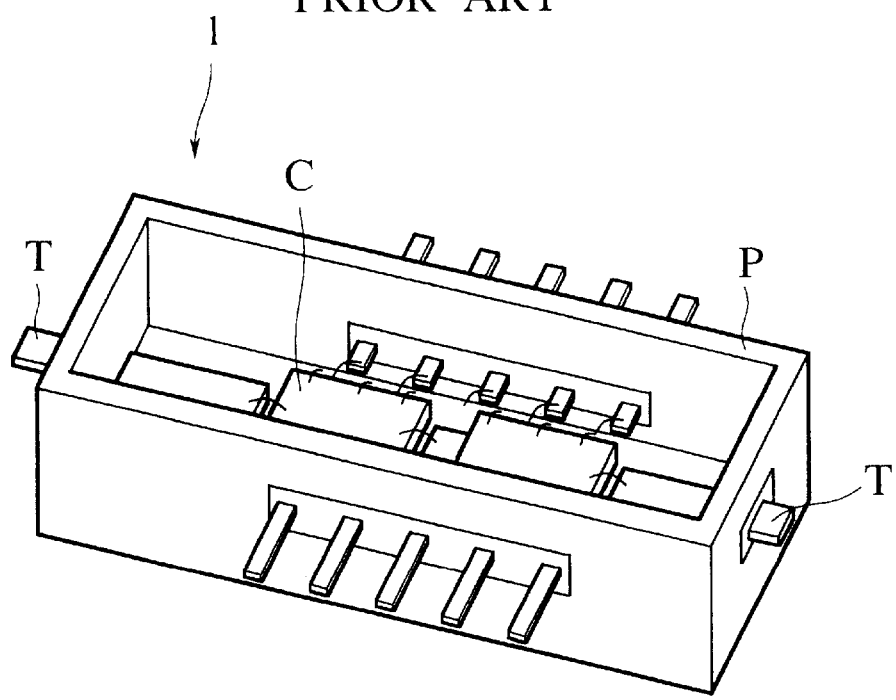
FIG. 1 is a schematic perspective view of a conventional high frequency device.
Figure 2:
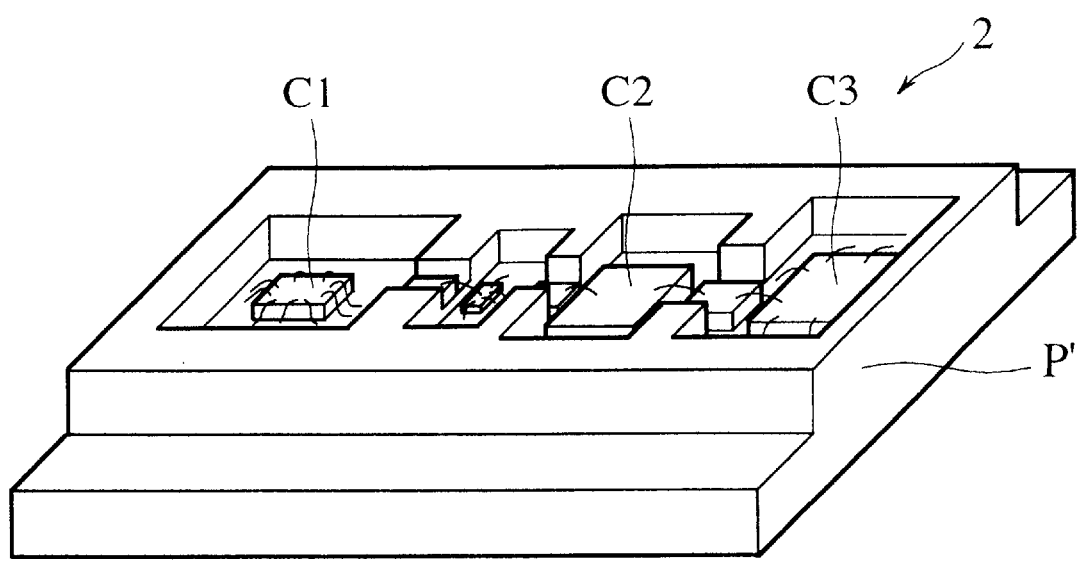
FIG. 2 is a schematic perspective view of a conventional transmitter module.
Figure 3:
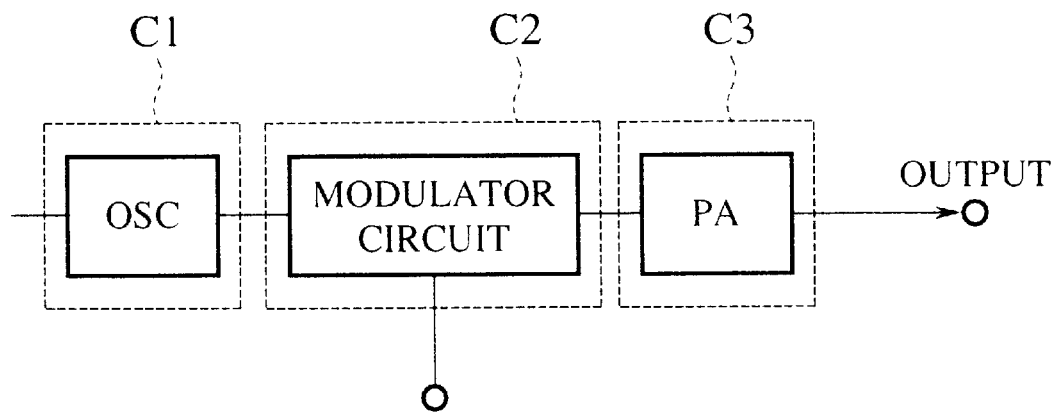
FIG. 3 is a block diagram of a circuit of the transmitter module shown in FIG. 2.
Figure 4:
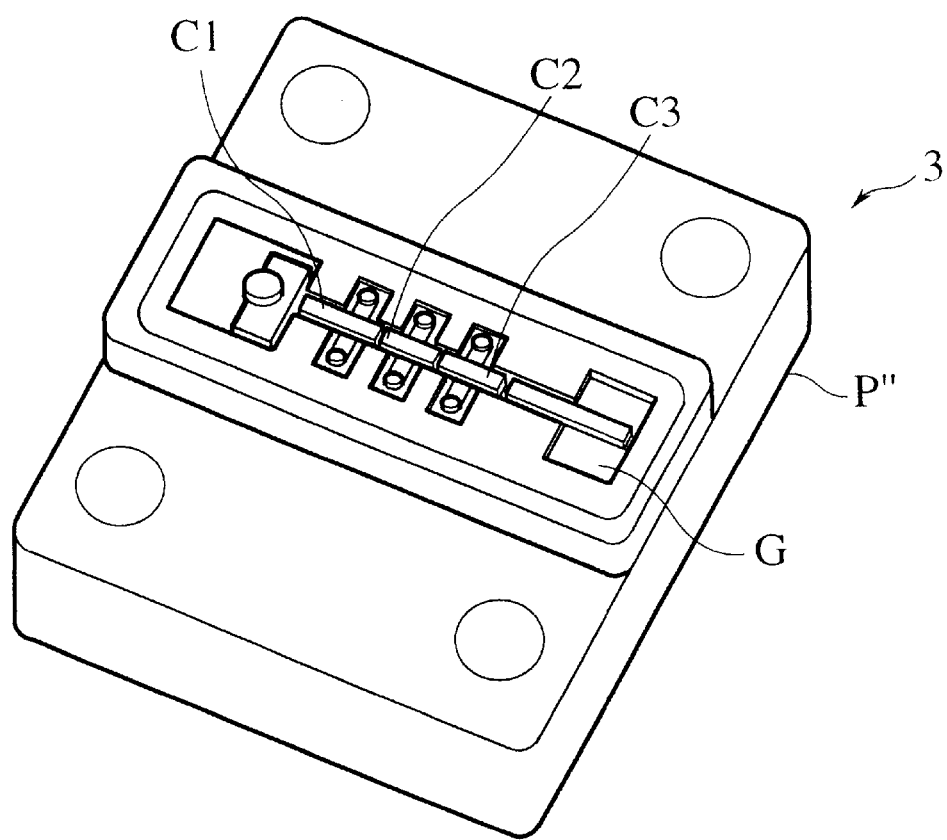
FIG. 4 is a schematic perspective view of another conventional transmitter module.
Figure 5:
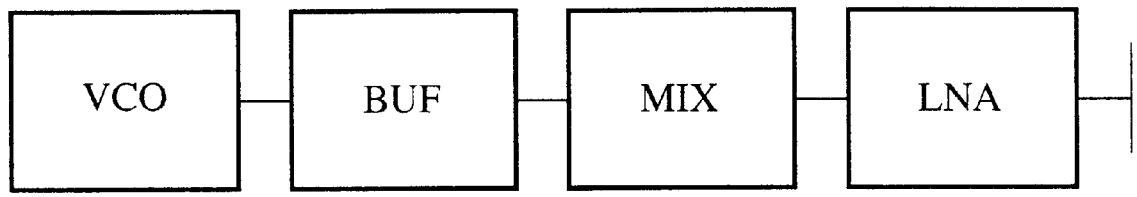
FIG. 5 is a block diagram of a circuit of a receiver module for which the transmitter module shown in FIG. 4 is changed to use.
Figure 6:
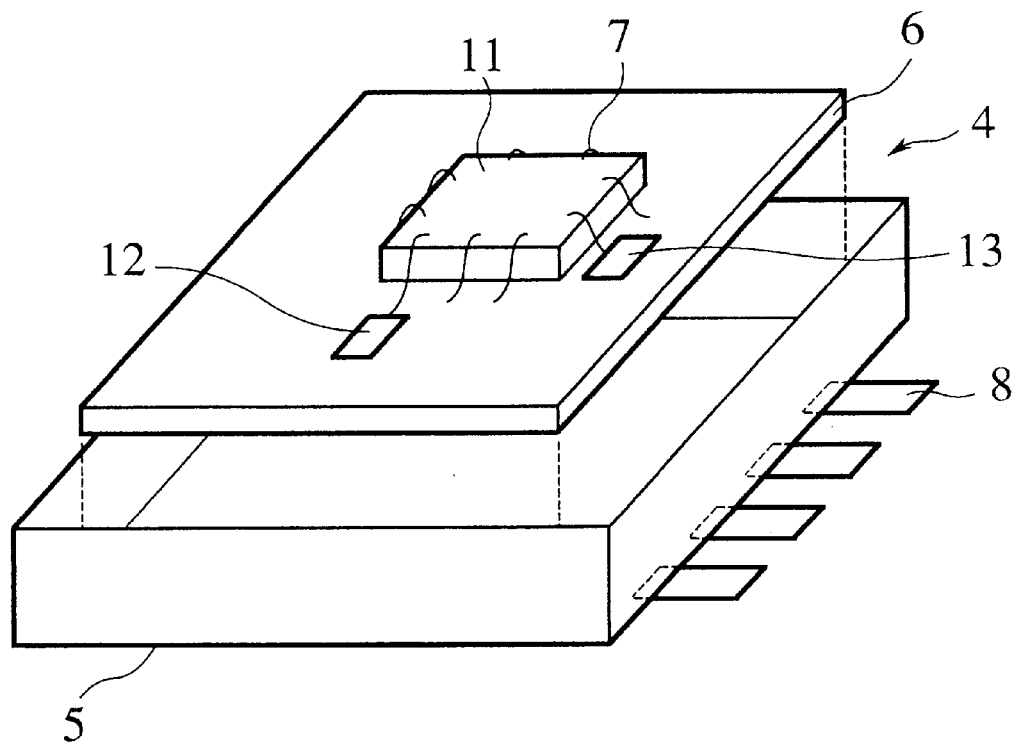
FIG. 6 is a schematic perspective view of a radio communication module according to the present invention.
Figure 7:
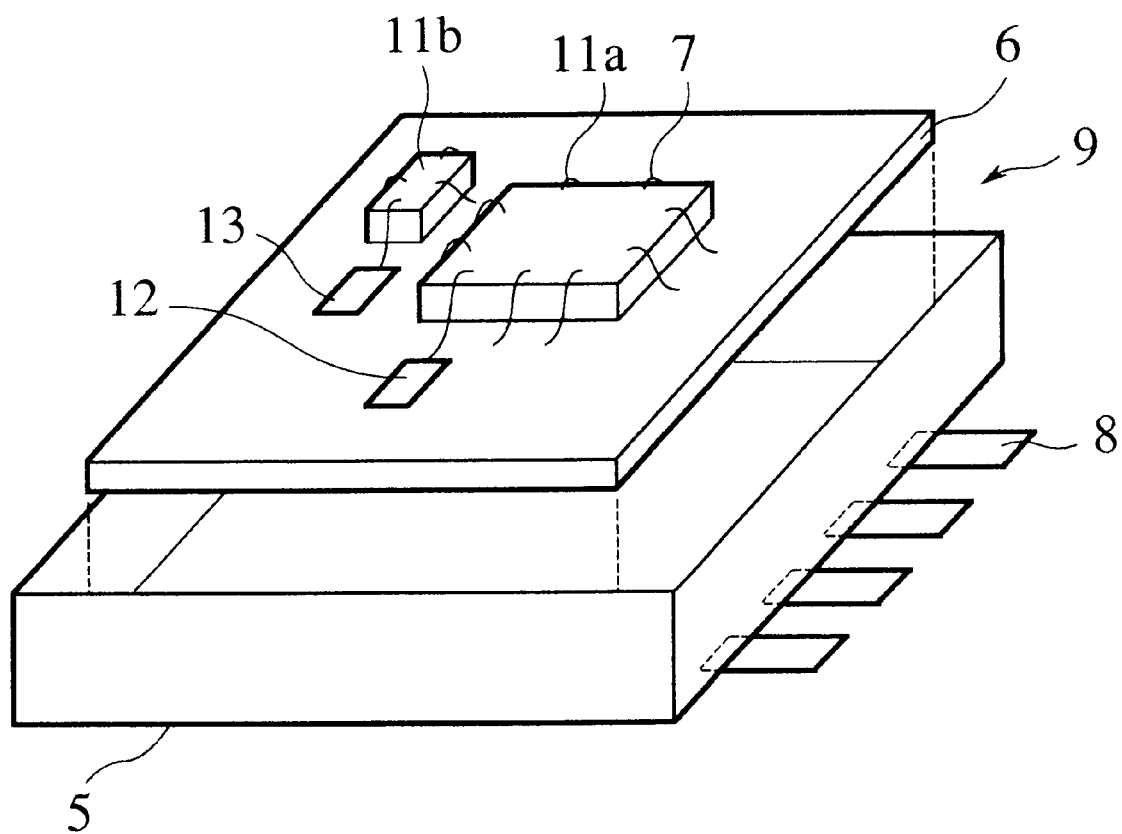
FIG. 7 is a schematic perspective view of another radio communication module according to the present invention.

The basic construction of the ultra high frequency radio communication apparatus according to the present invention substantially comprises a transmitter-receiver radio communication module as shown in FIG. 6 or 7. As shown, semiconductor chips 11, 11a and 11b connected by bonding wires 7 to a transmitter antenna 12 and a receiver antenna 13 are mounted on a single substrate 6 which is installed in a package 5 provided with input and output terminals 8, hence constituting the transmitter-receiver radio communication module 4 or 9. Accordingly, the transmitter-receiver radio communication apparatuses 4 and 9 will be fabricated by a small number of steps.

The arrangement in which the components in the package are mechanically isolated from each other and which may affect the downsizing is effectively realized by the present invention as will be described below in the form of preferred embodiments.

The embodiments of the present invention permit semiconductor chips to be mounted in a space of a wave guide mode of which cut-off frequency is greater than the carrier frequency used for signal transmission, thus minimizing the interaction between the semiconductor chips and the transmitter and receiver antennas, as well as the generation of cavity resonance and the interference between the two antennas.

(First Embodiment)

Figure 8:
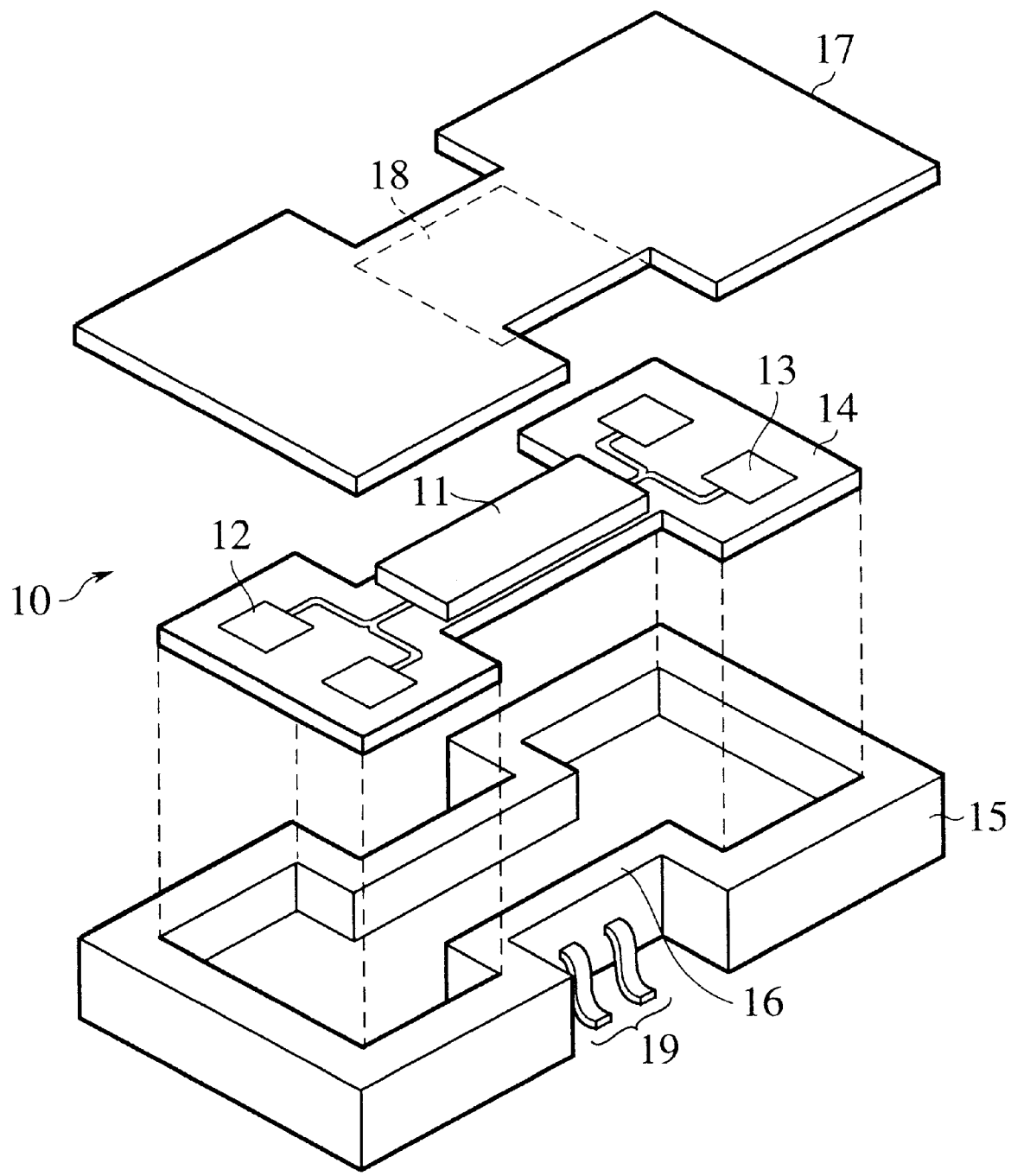
FIG. 8 is an exploded perspective view showing the first embodiment of the radio communication module according to the present invention.
Figure 9A:
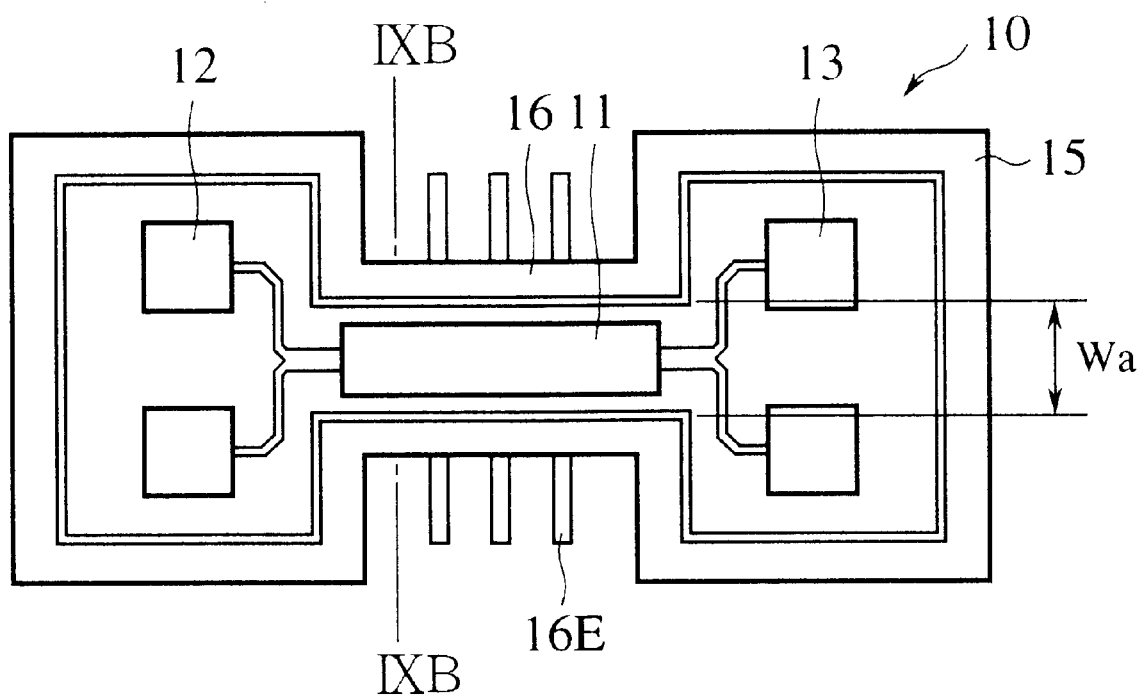
FIG. 9A is an upper view of the radio communication module shown in FIG. 8.
Figure 9B:
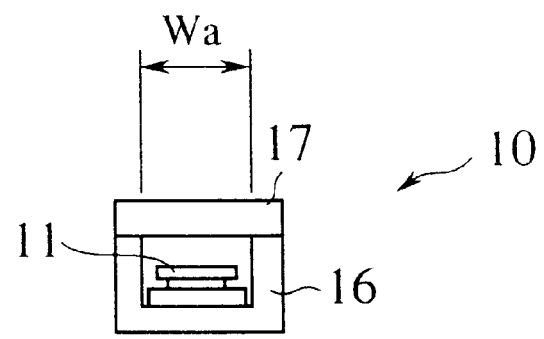
FIG. 9B is a cross sectional view taken along the line IXB—IXB of FIG. 9A.

FIGS. 8, 9A and 9B show a radio communication module 10 according to the first embodiment of the present invention which comprises an IC chip 11 functioning as a transmitter and a receiver, a transmitter antenna 12, and a receiver antenna 13 all mounted on a single substrate 14 and installed in an electrically conductive package 15 as shown in a perspective view of FIG. 8.

The package 15 may be formed of a cobal material plated with gold. The IC chip 11 may include a circuit having transistors such as HEMT on a GaAs base, and the transmitter and receiver antennas 12, 13 may be patch antennas made by having a pattern of gold on a Teflon substrate.

The package 15 has an inner space not divided but arranged to a specific shape having a constriction portion 16 at a longitudinal center of the package 15. It is thus assumed that the inner space of the package 15 consists of three regions: the constriction portion 16 at the center and two regions at both sides. The IC chip 11 is installed in the constriction portion 16 while the transmitter antenna 12 and the receiver antenna 13 are located in the two side regions respectively. The IC chip 11, transmitter antenna 12, and receiver antenna 13 are covered for protection with a non-conductive cap 17 closing the package 15 from above. The cap 17 has a conductive layer 18 provided on an inner surface thereof facing the constriction portion 16.

The package 15 also has input and output terminals 19 for transmitting a base band signal to and from the IC chip 11 and feeding a power source potential and control signals. The input and output terminals 19 handle non of high frequency communications signals. The IC chip 11, transmitter antenna 12, and receiver antenna 13 are electrically connected to one another by transmission lines such as microstrips other than wave guides.

FIG. 9A is an upper view of the radio communication module 10 (with the cap 17 removed) and FIG. 9B is a cross sectional view taken along the line IXB—IXB of FIG. 9A showing the constriction portion 16.

As apparent from FIG. 9B, the constriction portion 16 of the package 15 and the conductive layer 18 of the cap 17 form in a combination a wave guide structure to which the IC chip 11 is located. The wave guide structure is designed so that its cut-off frequency is greater than (the highest of) the frequency of a communications signal, whereby electromagnetic waves of the communications signal are prevented from entering the wave guide structure, i.e. the constriction portion 16. This avoids undesired interaction between the IC chip 11 in the constriction portion 16 and the transmitter and receiver antennas 12, 13. More specifically, the constriction portion 16 acts as not a wave guide but an isolating means for the IC chip 11, hence preventing electromagnetic waves across the transmitter antenna 12 from entering into the IC chip 11 as a feedback and affecting the IC chip 11. The constriction portion 16 is interposed between the transmitter antenna 12 and the receiver antenna 13 which are thus prevented from interfering with each other.

As described above, the transmitter-receiver module of the embodiment is designed so that the IC chip, the transmitter antenna, and the receiver antenna are isolated from each other physically and clearly in the single package, and when it is used as the ultra high frequency radio communication apparatus, its overall size can be minimized.

(Second Embodiment)

Figure 10:
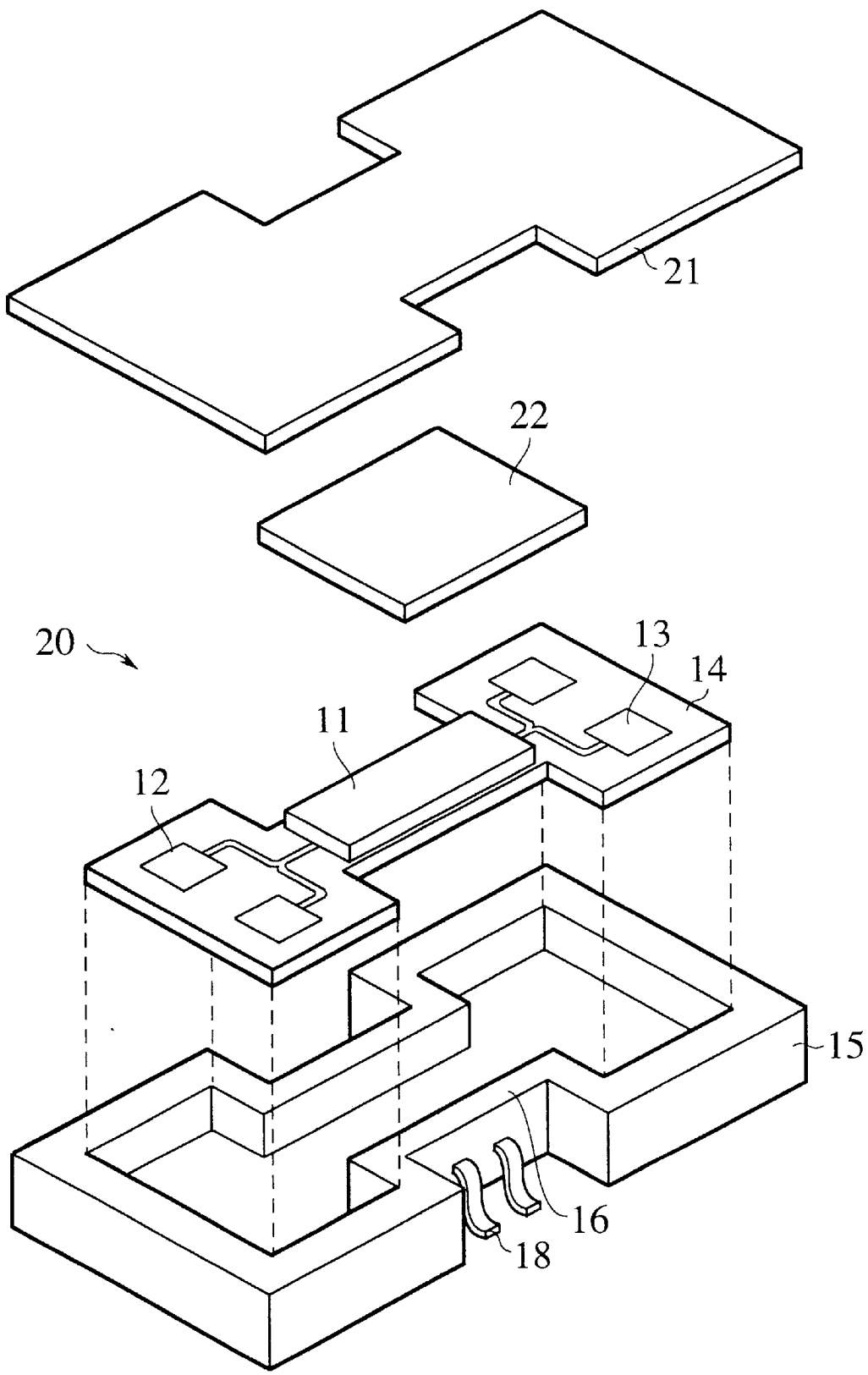
FIG. 10 is an exploded perspective view showing the second embodiment of the radio communication module according to the present invention.

FIG. 10 is an exploded perspective view of a radio communication module 20 showing the second embodiment of the present invention, in which the cap 17 provided with the conductive layer 18 shown in FIG. 9 is replaced by a combination of a non-conductive outer cap 21 and a conductive inner cap 22. Similar to the radio communication module 10 of FIG. 9, the inner cap 22 is used to cover the constriction portion 16 thus forming a wave guide structure. More particularly, the outer cap 21 physically protects two antennas 12 and 13 as well as an IC chip 11, and the inner cap 22 prevents electromagnetic buffering between the antennas 12 and 13 and the IC chip 11. This arrangement provides the same effect as of the first embodiment without applying any conductive layer on the inner surface of the cap.

(Third Embodiment)

Figure 11:
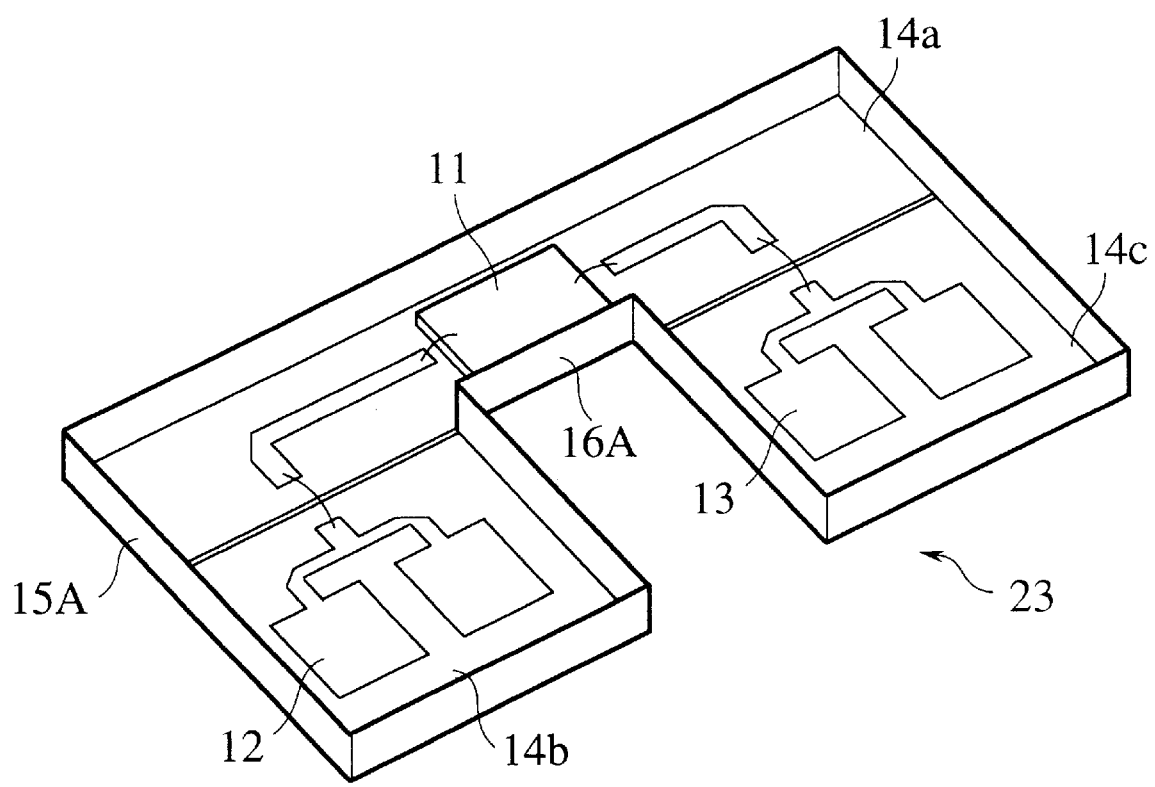
FIG. 11 is a schematic perspective view showing the third embodiment of the radio communication module according to the present invention.

FIG. 11 is a perspective view of a radio communication apparatus 23 showing the third embodiment of the present invention, in which a cap member is not shown but provided appropriately as a modification of the cap illustrated in FIG. 9 or 10. The module 23 includes a package 15A having a C-shaped inner space and a substrate, on which an IC chip 11 and two antennas 12 and 13 are mounted, consisting of three segments: a substrate segment 14a extending across a reduced region 16A of the package 15A for carrying the IC chip 11 thereon, a substrate segment 14b for carrying the transmitter antenna 12 thereon, and a substrate segment 14c for carrying the receiver antenna 13 thereon. The substrate segments 14a, 14b, and 14c may be made by having patterns of gold on an alumina base.

For assembly, the substrate segments 14a, 14b and 14c on which the IC chip 11 and the two antennas 12 and 13 are mounted respectively are installed separately in the package 15A before they are joined together for electrically connecting the IC chip 11 and the two antennas 12 and 13 to one another. This allows the IC chip 11 and two antennas 12 and 13 to be inspected or tested individually prior to the installation and the connection. The installation of the substrate segments 14A, 14B, and 14C into the package 15A will also be carried out with ease because they are separated.

The substrate assembly of this embodiment may be of a single plate similar to that of the first or second embodiment. It is also possible to shift the substrate of the first or second embodiment to segments such as the substrate segments of the third embodiment. The substrate of any form may be applied to the radio communication module so long as it provides a single mounting plane in the package.

The third embodiment can minimize the interference between the two antennas and between the IC chip and either of the antennas in addition to the advantage described above.

The directivity of a left-to-right symmetrically shaped antenna is normal to the plane on which the antenna is located. If the two antennas are oriented in the same direction, they may interfere with each other. While their directivity is changed by modifying their shape, the two antennas are commonly arranged to have slightly different shapes from the same symmetrical shape so that their directivities are at a small angle to each other.

However, in the third embodiment, the two antennas 12 and 13 are located off the input and output lines of the IC chip 11 and will thus be minimized in the interference with each other and facilitated in the adjustment for directivity. Also, the wall of the package interferes between the IC chip 11 and the two antennas 12 and 13 which hence are prevented from affecting each other.

(Fourth Embodiment)

Figure 12:
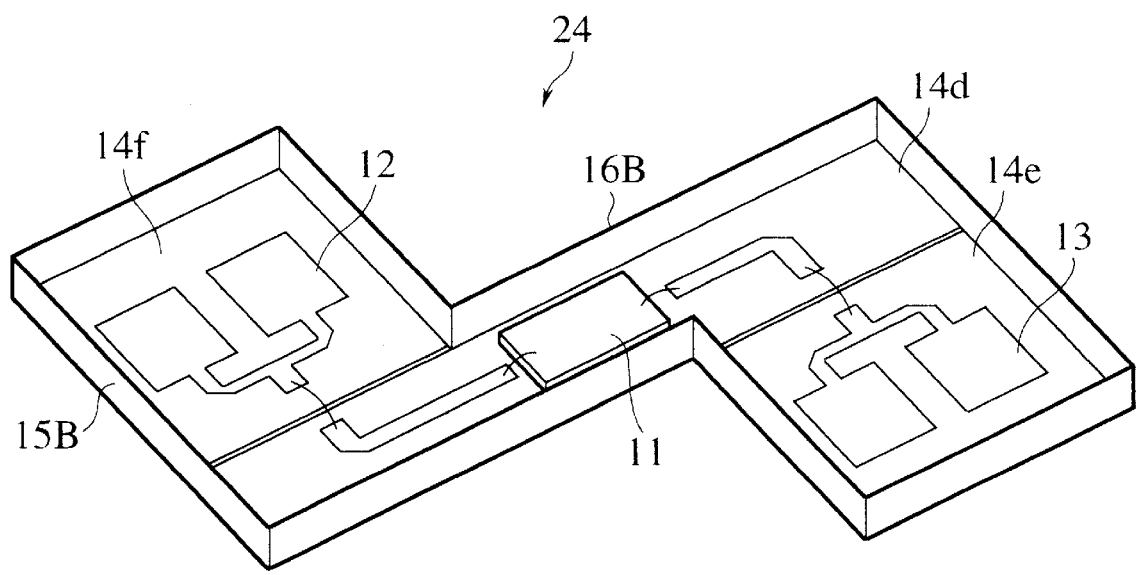
FIG. 12 is a schematic perspective view showing the fourth embodiment of the radio communication module according to the present invention.

FIG. 12 shows a radio communication module 24 according to the fourth embodiment of the present invention, in which the arrangement of the two antennas in the third embodiment is modified for attenuating further the interference between the two antennas. Although a cap is not shown in FIG. 12, the cap employed in the first or second embodiment may be used with its shape modified.

In this embodiment, a package 15B is arranged in a centrosymmetrical shape, having three substrate segments 14d, 14e, and 14f at corresponding locations. The two, transmitter and receiver, antennas 12 and 13 are centrosymmetrical with respect to the IC chip 11 as located along a diagonal line of the IC chip 11.

As the two antennas 12 and 13 are disposed off the directions of the input and output lines of the IC chip 11, their directivities create minimum interference therebetween as described in the third embodiment. Also, the centrosymmetry arrangement with respect to the IC chip 11 extends the distance between the two antennas 12 and 13 thus decreasing the effect of side-lobe interference.

(Fifth Embodiment)

Figure 13:
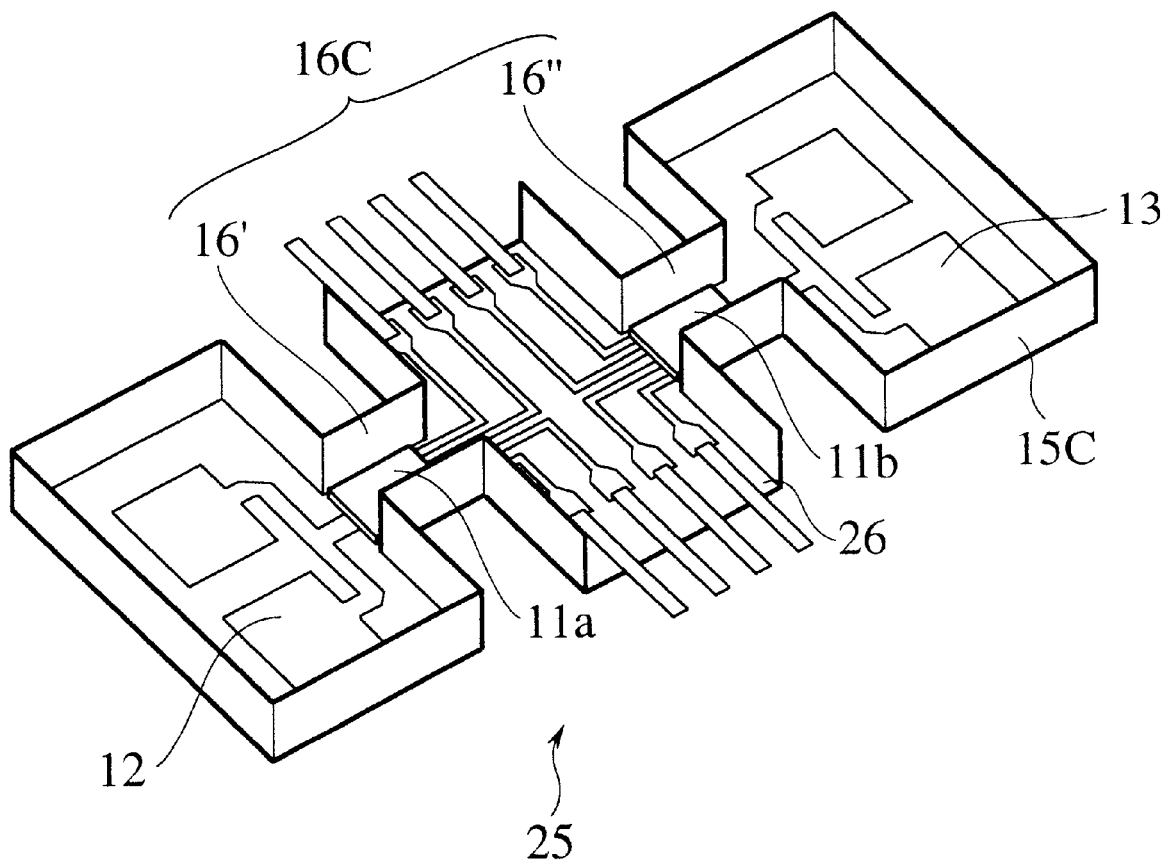
FIG. 13 is a schematic perspective view showing the fifth embodiment of the radio communication module according to the present invention.

FIG. 13 is a perspective view of a radio communication module 25 showing the fifth embodiment of the present invention, in which a constriction portion 16C consists of a first constriction portion 16' and a second constriction portion 16" to which two, transmitter and receiver, IC chips 11a, 11b are allocated respectively. A portion of a substrate 26 between the two constriction portion 16' and 16" is used for connection to the outside. Although a cap is not shown in FIG. 13, it is provided with either a conductive layer on a non-conductive body thereof or a conductive inner cap thereof to cover thoroughly the first and second constriction portions 16', 16".

The fifth embodiment also minimizes the interference between the transmitter and the receiver and offers a higher freedom for connection to the outside hence allowing a variety of modifications to meet any application.

(Sixth Embodiment)

Figure 14A:
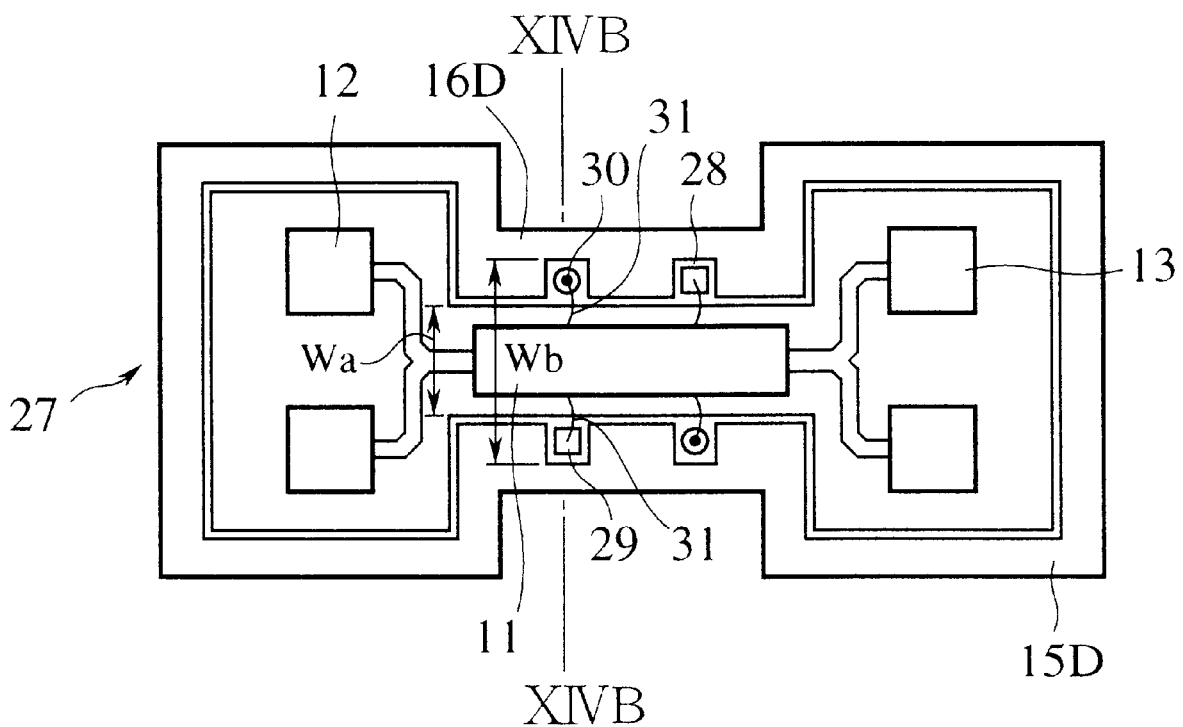
FIG. 14A is an upper view showing the sixth embodiment of the radio communication module according to the present invention.
Figure 14B:
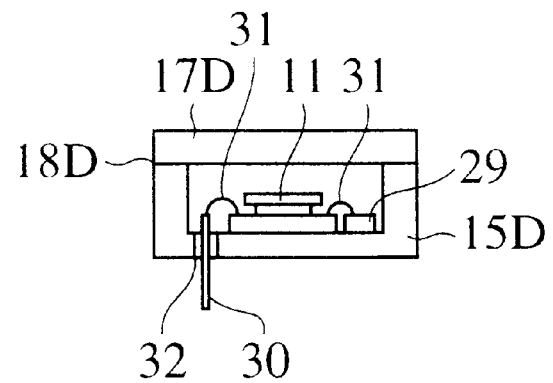
FIG. 14B is a cross sectional view taken along the line XIVB—XIVB of FIG. 14A.

FIGS. 14A and 14B show a radio communication module 27 according to the sixth embodiment of the present invention. More specifically, FIG. 14A is an upper view of the same (with a cap not shown), and FIG. 14B is a cross sectional view taken along the line XIVB—XIVB of FIG. 14A. As apparent, like components are denoted by like numerals as of the first embodiment and will be explained in no more details. The radio communication module 27 shown in FIGS. 14A and 14B is differentiated from the radio communication module 10 of the first embodiment shown in FIG. 8 by the fact that a constriction portion 16D has recesses 28 provided in the inner side wall thereof. The recesses 28 are designed to accommodate passive components including a chip capacitor 29 and a feed through 30. The constriction portion 16D also has through holes 32 provided in the bottom thereof for allowing the feed through 30 to extend from the inside to the outside of the package 15D. The recesses 28 permit the width of the constriction portion 16D to increase from Wa to Wb, whereby the cut-off frequency is lower than that of the constriction portion 16 of the first embodiment. With consideration of this phenomenon, the dimensions of the recess 28 may be determined to prevent the electromagnetic waves of the communications signal frequency from assaulting the IC chip 11.

The radio communication module 27 of this embodiment provides the same advantage as of the radio communication module 10 of the first embodiment and also, allows the chip capacitor 29 to be located adjacent to the IC chip 11, thus ensuring the stable circuitry operation of the same. Furthermore, input and output electrodes are located close to the semiconductor chip 11 so that relevant loss caused by the feed through 30 and the through hole 32 can be minimized.

(Seventh Embodiment)

Figure 15:
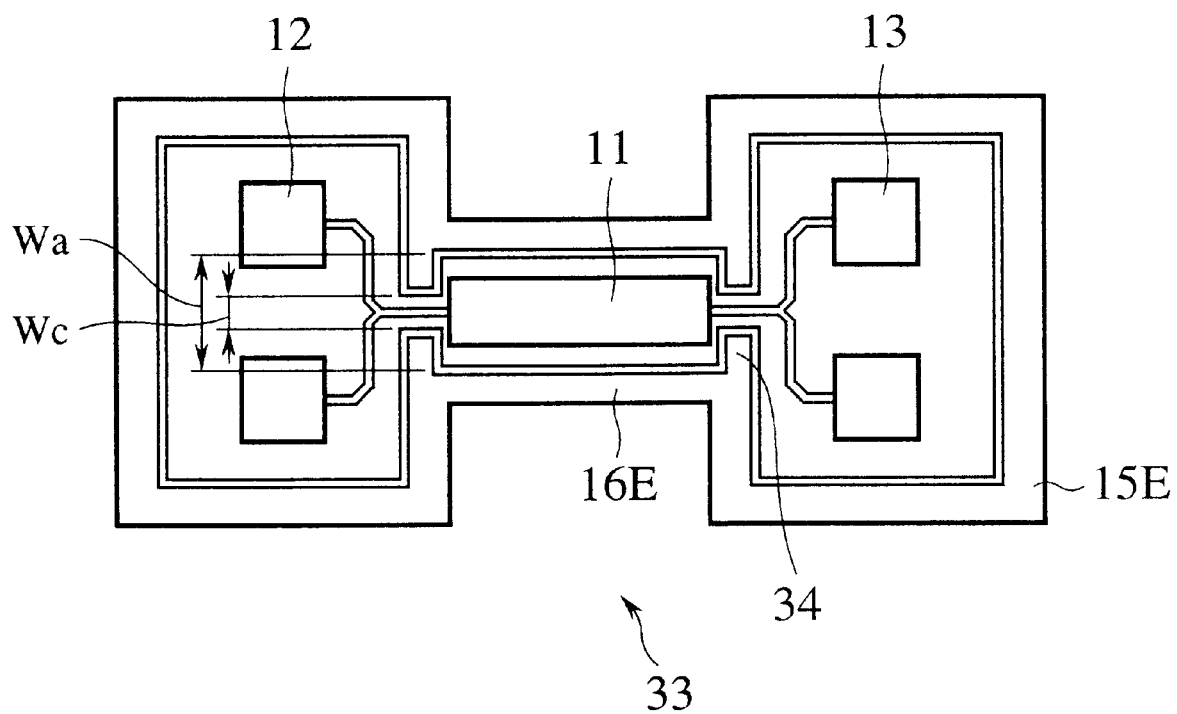
FIG. 15 is an upper view showing the seventh embodiment of the radio communication module according to the present invention.

FIG. 15 is an upper view of a radio communication module 33 showing the seventh embodiment of the present invention. The radio communication module 33 is differentiated from the radio communication module 10 of the first embodiment by the fact that projections 34 are provided on the inner side wall of a package 15E so that the width of a constriction portion 16E having a maximum of Wa is as small as Wc at both ends.

As described with the first embodiment, the constriction portion 16E prevents the electromagnetic waves of the communications signal frequency from entering a semiconductor chip 11. In common, the electromagnetic waves of any frequency even smaller than the cut-off frequency may slightly move in through the both ends of the constriction portion 16E. The radio communication module 33 of the seventh embodiment has the width at both the ends of the constriction portion 16E reduced to as small as Wc, hence controlling the entrance of unwanted electromagnetic waves to a minimum level as compared with the constriction portion 16 of the first embodiment.

(Eighth Embodiment)

Figure 16:
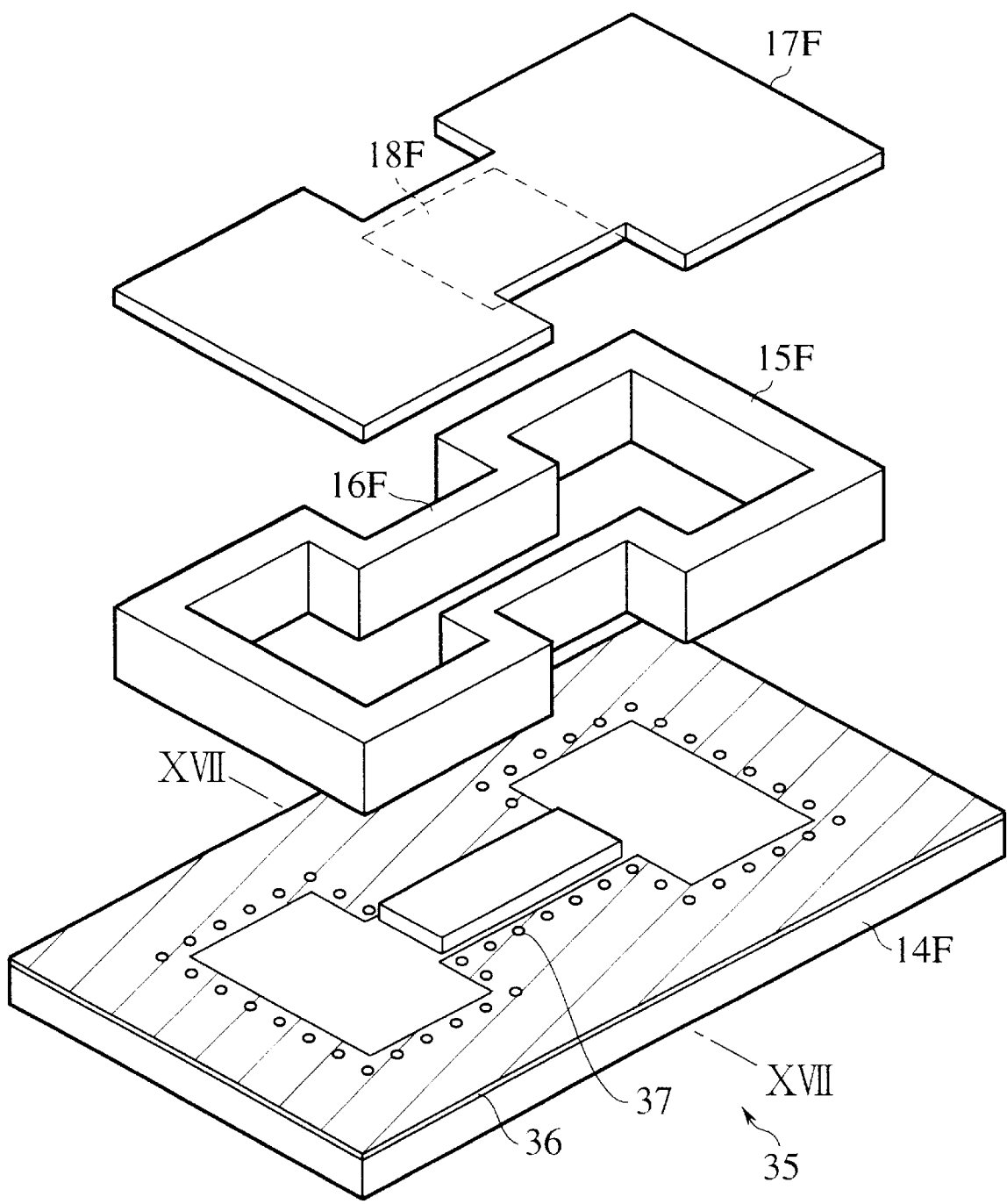
FIG. 16 is an exploded perspective view showing the eighth embodiment of the radio communication module according to the present invention.
Figure 17:
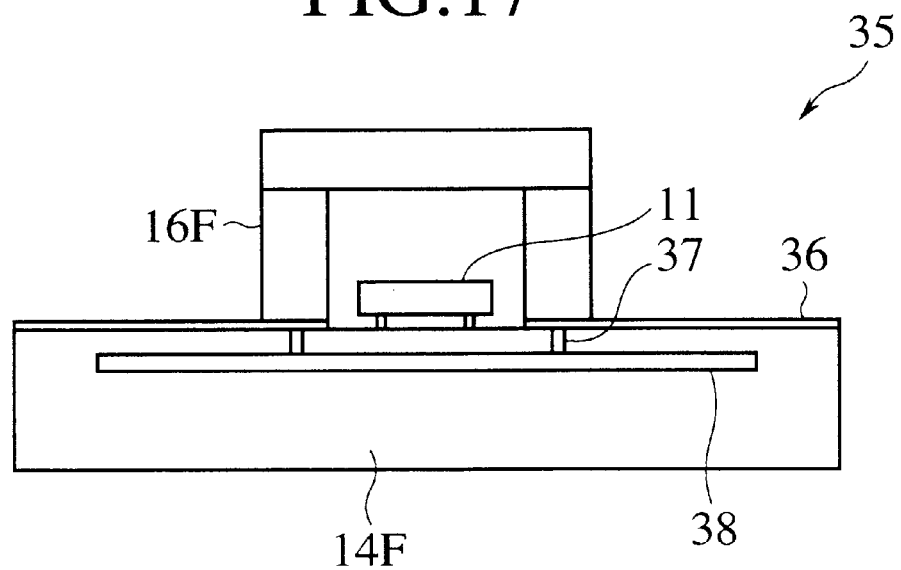
FIG. 17 is a cross sectional view taken along the line XVII—XVII of the radio communication module of FIG. 16.

A radio communication module 35 according to the eighth embodiment is illustrated in FIGS. 16 and 17. FIG. 16 is an exploded perspective view of the radio communication module 35 and FIG. 17 is a cross sectional view taken along the line XVII—XVII of FIG. 16.

While the first to seventh embodiments employ the substrate on which the antennas and semiconductor chips are mounted and which is installed in the conductive package, this embodiment allows the substrate to serve as a bottom plate of the package of which side wall is composed of a conductive framework 15F mounted on the substrate. More specifically, the substrate 14F contains a ground layer 38 which corresponds to the bottom of the package having a constriction portion of the above-described embodiments, as shown in FIG. 17. An antenna pattern including a transmitter antenna 12 and a receiver antenna 13 and a wiring pattern for connecting the semiconductor chips (both not shown) are mounted together with a peripheral ground pattern 36 on the substrate 14F. The peripheral ground pattern 36 and the ground sheet 38 are electrically connected to each other by vias 37. The mounting of the conductive framework 15F having the constriction portion 16F on the substrate 14F produces an equivalent of the package, including the framework 15F, the ground pattern 36, the vias 37, and the ground sheet 38. A cap 17F has a conductive layer 18F provided in the inner surface thereof facing the constriction portion 16F, similar to that of the first embodiment.

This embodiment allows the package to be constructed by no intricate components and will contribute to the lower manufacturing cost of the radio communication module 35.

(Ninth Embodiment)

Figure 18:
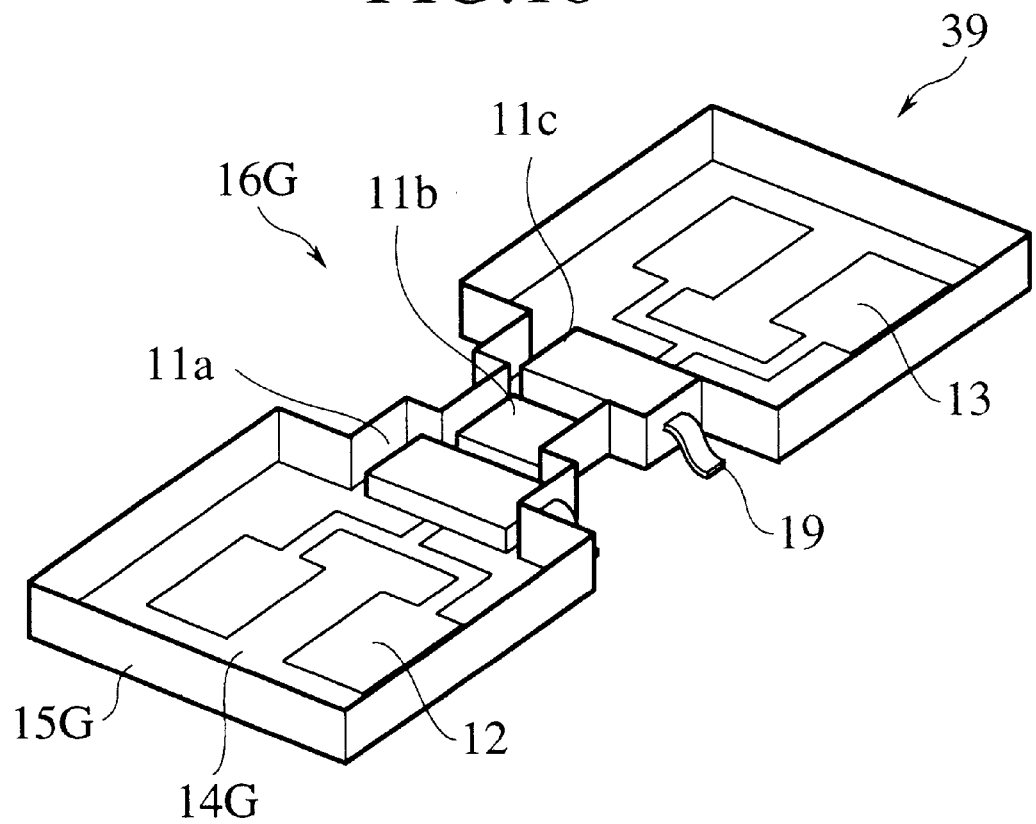
FIG. 18 is a schematic perspective view showing the ninth embodiment of the radio communication module according to the present invention.

FIG. 18 shows a radio communication module 39 according to the ninth embodiment (with a cap not shown). This embodiment is differentiated from the first embodiment by the fact that three semiconductor chips 11a, 11b and 11c of different sizes are allocated to their respective widths of a constriction portion 16G. More particularly, the semiconductor chip 11b at the center is smaller in width than the two other chips 11a and 11c at both ends. A center of the constriction portion 16G is shaped narrower than the two ends to match the size of the semiconductor chip 11b.

Preferably, the semiconductor chip 11b in the center of the constriction portion 16G of the embodiment is an oscillator while the two other semiconductor chips 11a and 11c are a transmitter and a receiver respectively connected to their respective transmitter and receiver antennas 12 and 13.

As described with the seventh embodiment, the electromagnetic waves of a frequency lower than the cut-off frequency may enter the two openings (at both ends) of the constriction portion 16G in proportion to the width (namely, cross section) of the same. The ninth embodiment allows the constriction portion 16G to be minimized at the center, hence preventing the electromagnetic waves from the transmitter 11a and transmitter antenna 12 to the receiver chip 11c and protecting the isolation of each semiconductor chip.

(Tenth Embodiment)

Figure 19A:
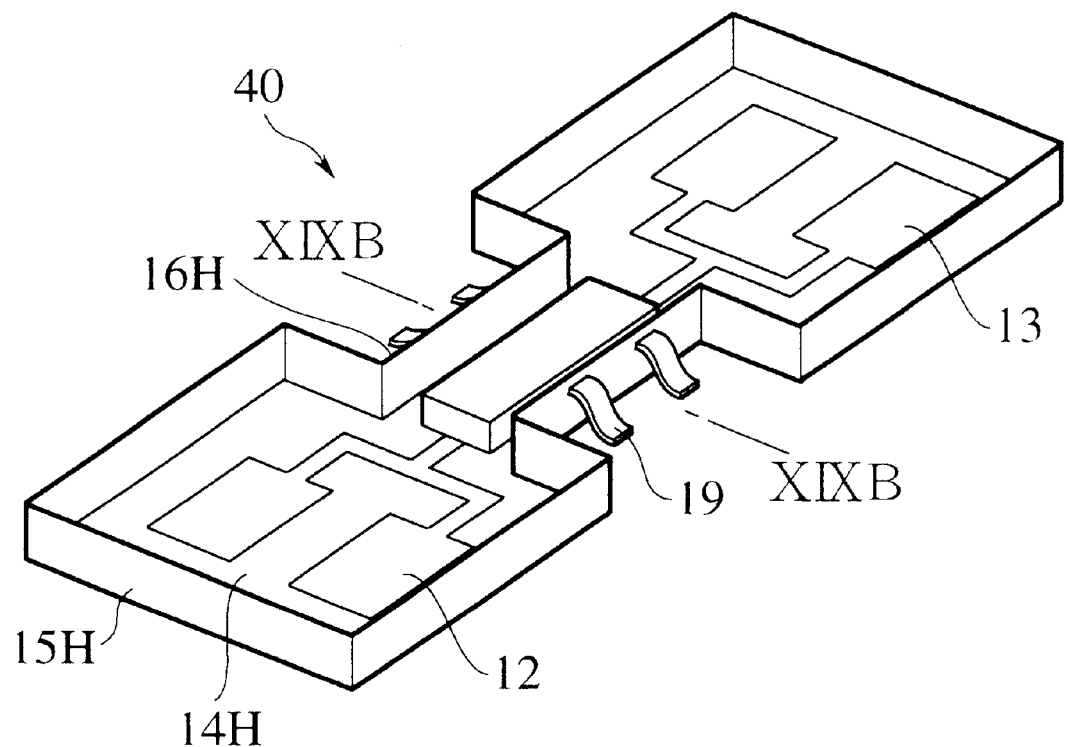
FIG. 19A is a schematic perspective view showing the tenth embodiment of the radio communication module according to the present invention.
Figure 19B:
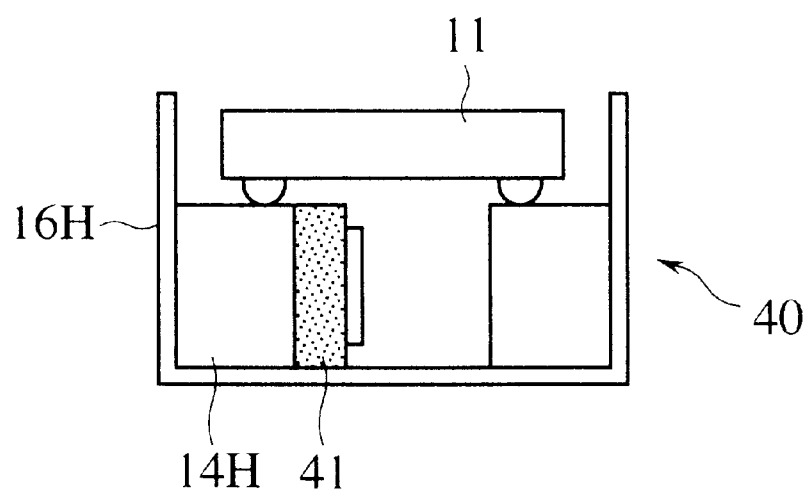
FIG. 19B is a cross sectional view taken along the line XIXB—XIXB of FIG. 19A.

FIGS. 19A and 19B illustrate a radio communication module 40 according to the tenth embodiment. FIG. 19A is a perspective view of the module 40 (with a cap not shown) and FIG. 19B is a cross sectional view taken along the line XIXB—XIXB of FIG. 19A.

In this embodiment, a semiconductor chip 11 including a transmitter circuit and a receiver circuit in a combination is mounted in a constriction portion 16H together with a resonator 41 electromagnetically joined to the transmitter circuit of the semiconductor chip 11. The resonator 41 may be of a strip or disk shape.

As shown in FIG. 19B, the resonator 41 is vertically mounted in an opening provided beneath the semiconductor chip 11 in a substrate 14H which is installed in a package 15H. The width of a wave guide structure developed in the constriction portion 16H is greater than the height.

Accordingly, the resonator 41 allows its electric and magnetic fields to be at right angles to the electric and magnetic fields in the constriction portion 16H in a minimum propagation mode, preventing the electromagnetic waves from a transmitter antenna 12 from being transmitted through the resonator 41 to a receiver side, and protecting the isolation of the semiconductor chip 11.

This arrangement may be applied to the ninth embodiment by having the resonator opening beneath the transmitter chip 11a.

(Eleventh Embodiment)

Figure 20A:
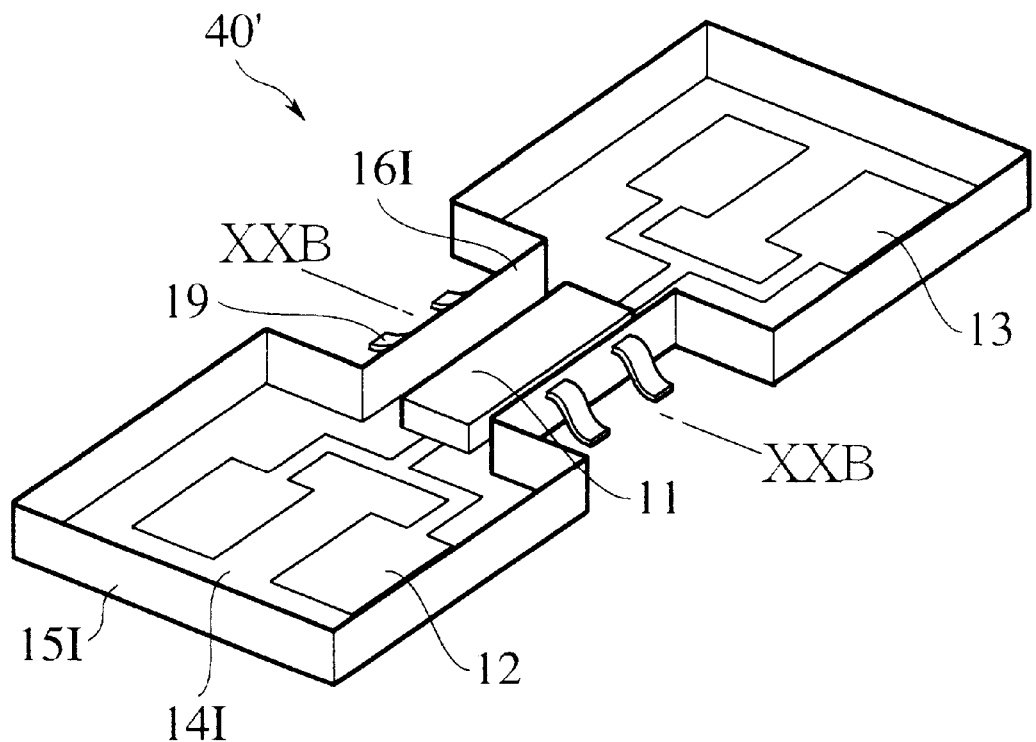
FIG. 20A is a schematic perspective view showing the eleventh embodiment of the radio communication module according to the present invention.
Figure 20B:
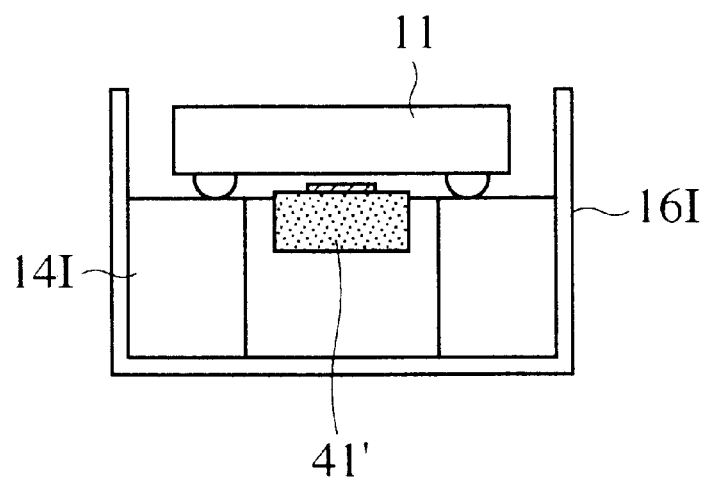
FIG. 20B is a cross sectional view taken along the line XXB—XXB of FIG. 20A.

FIGS. 20A and 20B show a radio communication module 40' according to the eleventh embodiment of the present invention. FIG. 20A is a perspective view of the module 40' (with a cap not shown) and FIG. 20B is a cross sectional view taken along the line XXB—XXB' of FIG. 20A.

This embodiment is a modification of the tenth embodiment in which a resonator 41' and a substrate 14I are mounted in a different manner while a package 15I and its constriction portion 16I are provided in the same manner as of the tenth embodiment.

More specifically, the resonator 41' is located adjacent to and in parallel with a semiconductor chip 11 as biased from the center of the constriction portion 16I to a receiver antenna 13. In this case, the electric and magnetic fields of the resonator 41' in its minimum propagation mode is aligned to those of the constriction portion 16I. However, the resonator 41' is located in the receiver side where input and output of power are relatively small and will be less affected by the electromagnetic waves from the transmitter side. Also, the power from the receiver antenna 13 is far smaller than that from the transmitter antenna and will give negligible effects on the transmitter side. It is understood that this embodiment like the ninth embodiment may employ more than one of the semiconductor chips with equal success.

(Twelfth Embodiment)

Figure 21:
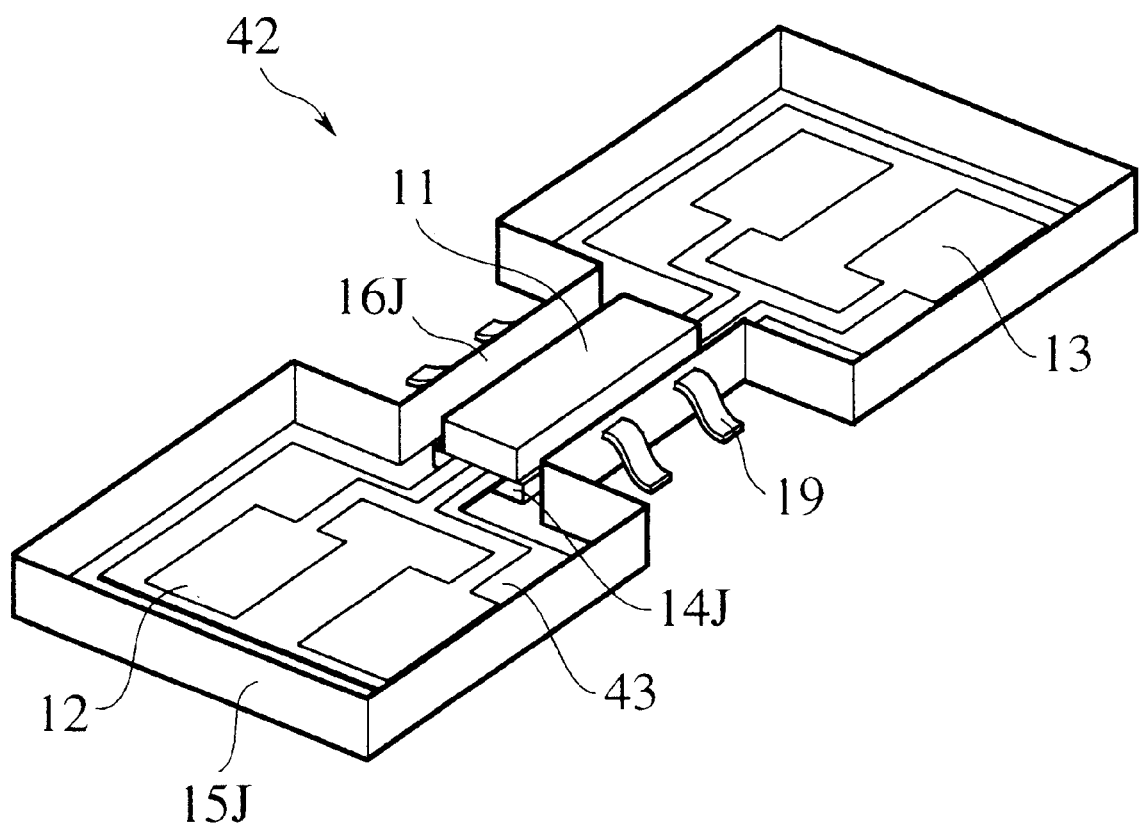
FIG. 21 is a schematic perspective view showing the twelfth embodiment of the radio communication module according to the present invention.

A radio communication module 42 according to the twelfth embodiment of the present invention (with a cap removed) is illustrated in FIG. 21.

This embodiment employs a transmitter antenna 12 and a receiver antenna 13 of a TAB 43. The TAB 43 is assembled to a substrate 14J installed in a constriction portion 16J of a package 15J. The antennas 12 and 13 of the TAB 43 are flexible and can be adjusted to shift their directivity. Although the TAB 43 is commonly as thin as tens of microns, it may be formed in multi-layer to set a distance of more than 100 microns between the antenna pattern and the ground pattern for increasing the radiant efficiency of the antennas 12 and 13.

(Thirteenth Embodiment)

Figure 22:
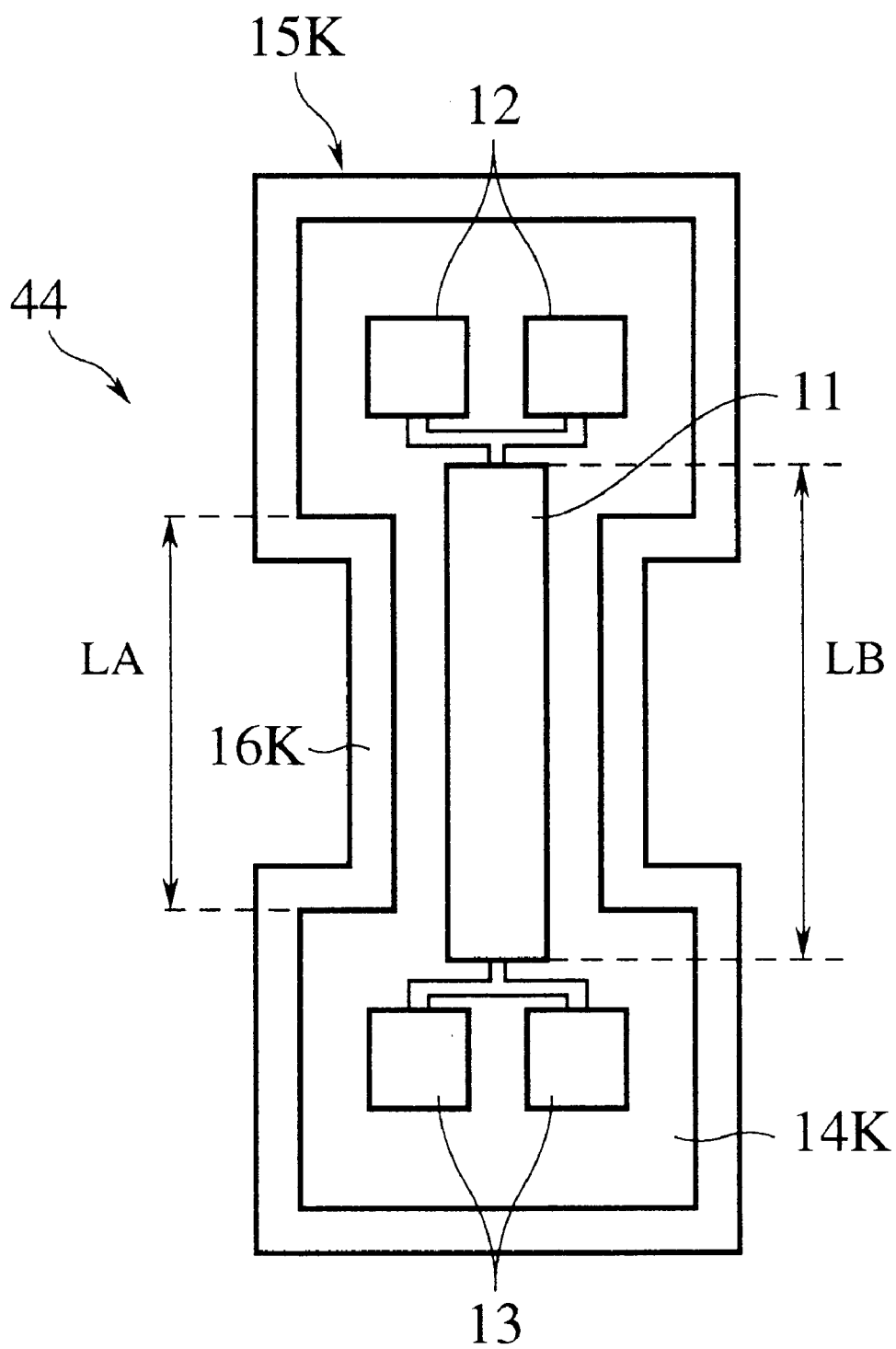
FIG. 22 is a schematic upper view showing the thirteenth embodiment of the radio communication module according to the present invention.

A radio communication module 44 according to the thirteenth embodiment of the present invention (with a cap removed) is illustrated in FIG. 22, in which the length LA of a constriction portion 16K of a package 15K is shorter than the length LB of an IC chip 11 mounted on a substrate 14K.

It is common that the length LA of the constriction portion is generously extended to thoroughly hold the IC chip within the constriction portion as it determines the electrical separation between both ends. In other words, the length LA is settled larger than the length LB of the IC chip. However, this also increases the distance from the chip to transmitter and receiver antennas and thus transmission lines between the same, whereby loss in the transmitting power or declination in the level of a received signal occurs. Along the transmission lines, a high frequency of quasi-milliwave (over 10 GHz) will has more loss than a lower frequency. Particularly, the noise level characteristic of the receiver is affected largely and directly by loss made in series to the receiver antenna. In other words, any redundancy of the length of the transmission lines will impair or decline the performance (e.g. the minimum receiving sensitivity) of the radio communication module. For avoiding such a drawback, the IC chip should be located not far from the antennas. This embodiment has the length LA of the constriction portion smaller than the length LB of the IC chip (LA<LB) for minimizing the loss along the transmission lines, as shown in FIG. 22.

Although the constriction portion 16K is short by a difference of the length between the IC chip 11 and the constriction portion 16K and thus declines the electric separation between the transmitter side and the receiver side, the difference in the total effect is as small as negligible. The electromagnetic waves from outside may enter through both ends of the constriction portion 16K but it can be offset by the installation of common input and output pads at both edges of the IC chip 11 thus hardly affecting its inner circuit.

(Fourteenth Embodiment)

Figure 23:
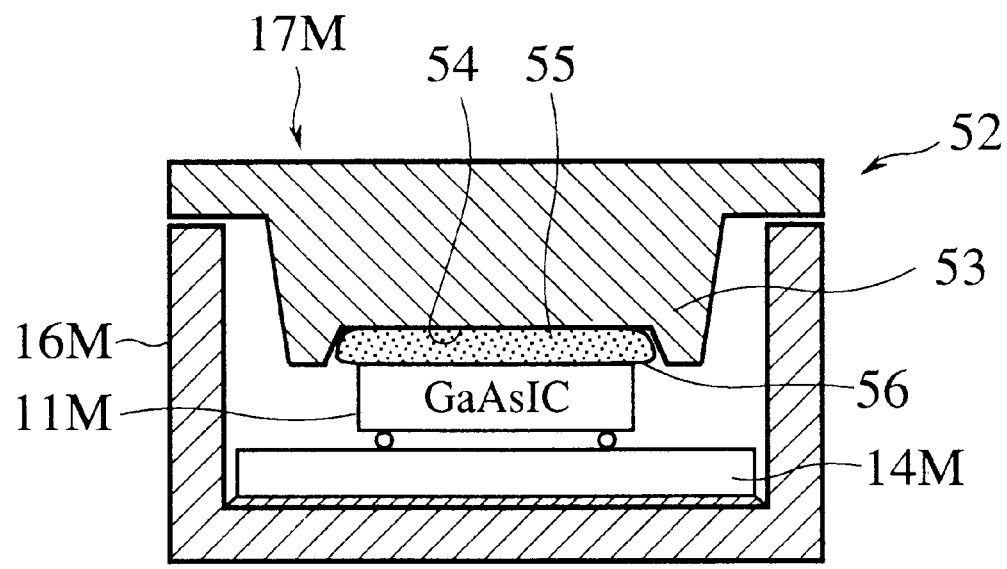
FIG. 23 is a schematic cross sectional view of a constriction portion of the radio communication module of the fourteenth embodiment of the present invention.

A radio communication module 52 according to the fourteenth embodiment of the present invention (with a cap removed) is shown in FIG. 23, in which the radiation of heat from a semiconductor chip is concerned. The substantial arrangement of this embodiment is similar to any of those described with the first to thirteenth embodiments except that shown in a vertical cross sectional view of a constriction portion 16M of FIG. 23.

Commonly, for radiation of heat from a bump-mounted (or flip-chip bonding) semiconductor chip, the semiconductor chip is closely backed up by a radiator metal, and the gap between the chip and the metal is filled with a thermal compound or the like. This allows a highly dielectric material such as GaAs to occupy both upper and lower regions of a space defined in a metal casing, thus declining the cut-off frequency in the wave guide structure. If this common manner is employed with the embodiment, the input and output terminals of the semiconductor chip can hardly be isolated. Also, the electric field is intensified about the center of the wave guide structure by the radiator metal thus causing unwanted oscillation.

FIG. 23 shows an example in which the electric field is prevented from being intensified by the radiator metal. A metal cap 17M has a radiator portion 53 thereof extending downwardly close to the back of an IC chip 11M. Moreover, the radiator portion 53 is provided with a recess 54 which faces the chip 11M and is filled with a highly thermal conductive material 55 (thermal compound) encapsulated in a thin rubber pouch 56.

Accordingly, as the highly conductive radiator portion 53 is spaced from the IC chip 11M, it prevents the electric field from being intensified.

The thermal compound 55 in the pouch 56 is flexible and can be adjusted to eliminate any production error and reclaim an optimum distance between the radiator portion 53 and the IC chip 11M with ease during the assembly or maintenance. Also, the thermal compound 55 in the pouch 56, having a resiliency when urged under a proper pressure by the cap 17M, increases the tightness to the radiator portion 53 as well as the IC chip 11M. When the thermal compound 55 has a fluidity, the pressure of the cap 17M acts uniformly over the IC chip 11M, eliminating a point of stress and contributing to the higher reliability of the flip-chip bonding which is known to have a low structural strength.

(Fifteenth Embodiment)

Figure 24:
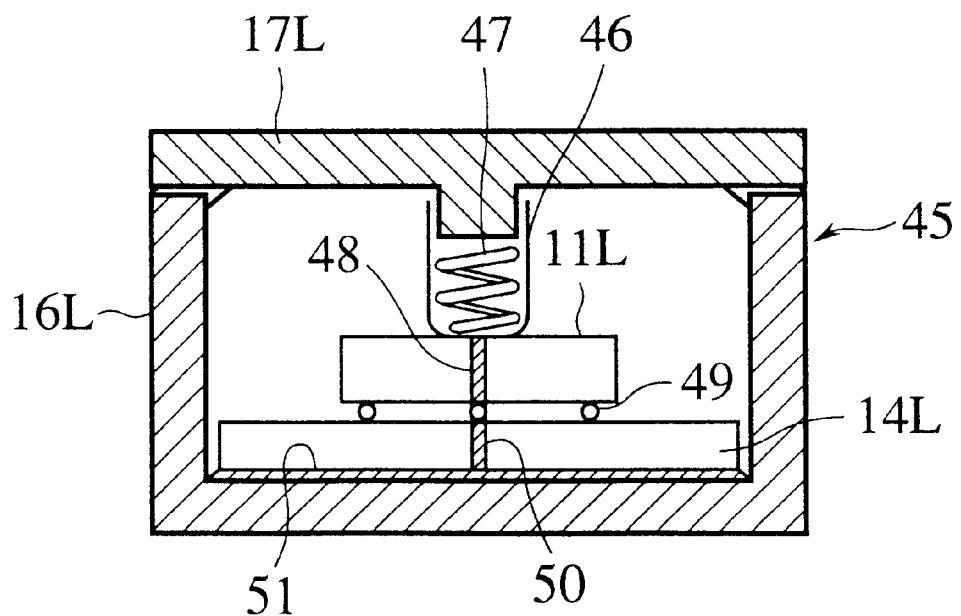
FIG. 24 is a schematic cross sectional view of a constriction portion of the radio communication module of the fifteenth embodiment of the present invention.

A radio communication module 45 according to the fifteenth embodiment of the present invention is shown in FIG. 24, in which the radiation of heat from a semiconductor chip is concerned. The substantial arrangement of this embodiment is also similar to any of those described with the first to thirteenth embodiments except that shown in a vertical cross sectional view of a constriction portion 16L of FIG. 24.

In this embodiment, a metal pillar 46 extending downward from a metal cap 17L is provided with an urging member such as a spring 47 so that it stays in contact with the back of a bump-mounted (flip-chip bonding) IC chip 11L for radiation of heat.

However, such an ultra high frequency as causing cavity resonance in a metal casing allows an electric field to be intensified about a dielectric material (e.g. GaAs having a dielectric constant of about 13) of the IC chip 11L between the metal pillar 46 and the bottom of the constriction portion 16L, whereby the fundamental mode frequency in the wave guide structure is declined, lowering the resonance frequency. For solving the above drawback, a means is provided for electrically connecting between the metal pillar 46 of the cap 17L and the bottom of the constriction portion 16L. More particularly, the electrically connecting means is a path extending along a through hole 48 provided in the IC chip 11L, a bump 49, and a through hole 50 provided in a substrate 14L. The IC chip 11L is mounted on the substrate 14L in such a manner that the two through holes 48 and 50 are communicated to each other by the bump 49 for electrically connecting the metal pillar 46 to the bottom or ground plane of the constriction portion 16L. A plurality of the paths are aligned at equal intervals lengthwisely of the constriction portion 16L and the IC chip 11L.

Accordingly, the inner space of the constriction portion 16L is divided by the electrically connecting path into two subspaces which are surrounded by the conductive materials, hence increasing the resonance frequency for cavity resonance and then the cut-off frequency in the wave guide structure. Also, the IC chip 11L made of a highly dielectric material is located off the center of each subspace so that the resonance frequency is increased to as high as two times.

The above advantages will further be enhanced by favorable alignment of the paths with an optimum number and an optimum distance. Although the other inner regions of the constriction portion 16L where the IC chip 11L is absent furnish no path across the IC chip, the metal pillar 46 may be extended directly to the substrate or the bottom of the package. The embodiment is not limited to the flip-chip bonding but can be applied with equal success to any face-up wire bonding installation for enhancing the radiation of heat and increasing the cavity resonance frequency. If a conductive chip such as a silicon IC is used for the semiconductor chip 11L, the through hole 48 may be omitted. The substrate 14L is not limited to a ceramic material but may be selected from other inorganic materials or organic materials including epoxy resin, teflon resin, polyimide resin and the like. The through hole 50 also serves as a thermal via for attenuating the resistance to propagation of heat from the substrate to the package.

(Sixteenth Embodiment)

Figure 25:
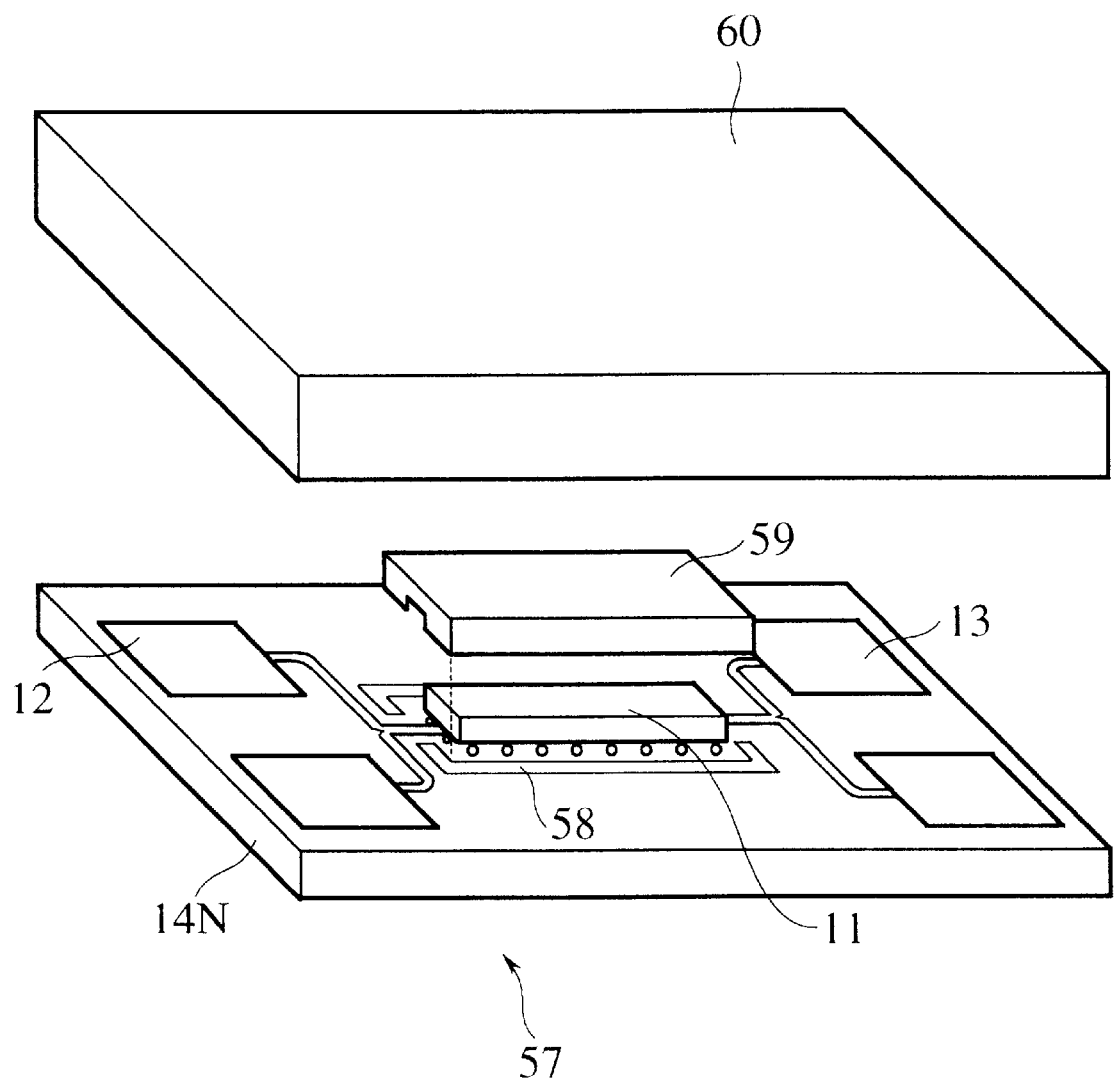
FIG. 25 is an exploded perspective view showing the sixteenth embodiment of the radio communication module according to the present invention.

A radio communication module 57 according to the sixteenth embodiment of the present invention is illustrated in FIG. 25 in which the isolation of a semiconductor chip by a wave guide structure is realized using a simpler arrangement.

The radio communication module 57 includes a transmitter antenna 12, a receiver antenna 13, a substrate 14 N containing multilayer interconnection, a pattern of terminals (pads on bump) for connection of the semiconductor chip 11, and transmission lines for connection between the semiconductor chip 11 and the two antennas 12 and 13, which all are mounted on the substrate 14N. The semiconductor chip 11 which is connected by flip-chip bonding to the substrate 14N is surrounded by a seal ring 58 except the area for the transmission lines to the antennas, and these transmission lines are formed by patterning a thin metal layer at a thickness of 5 $\mu$m or less as an uppermost wiring layer of the substrate. The seal ring 58 is connected to a conductive layer embedded in the substrate 14N.

When the semiconductor chip 11 has been mounted on the substrate 14N as followed by installation of a box-shaped metal cap 59, it is encompassed with the wave guide structure formed by the seal ring 58, the metal cap 59 and the conductive layer in the substrate 14N. The wave guide structure has the same function as of the constriction portion 16 of the previous embodiment as is designed so that the cut-off frequency is higher than the carrier frequency.

The cap 59 has a notch for preventing short-circuit between the transmission lines and metal cap 59. The notch may be substituted with a strip of insulating material. Alternatively, the transmission lines may partially be embedded in the substrate 14N. After the cap 59 is installed, the semiconductor chip 11 and the two antennas 12 and 13 are protected with a cover cap 60 made of a low dielectric, non-conductive material placing over the substrate 14N.

On the opposite surface to the mounting surface of the substrate 14N formed are bumps through which input signals, output signals and control signals are transmitted.

Although the radio communication module 57 includes no side wall of a package as shown in the foregoing embodiments, the cover cap 60 can provide the function of the side wall with its corresponding material and shape for electromagnetically separating the two antennas from each other and determining their directivity. A metal member such as a wave director may also be used for the cover cap 60. The cover cap 60 may have openings for exposing only the antennas to the outside of the cover cap 60.

In the radio communication module 57, the pattern of wiring on the substrate 14N is formed at once by a known photographic process, whereby the overall steps of production requiring an accuracy will be minimized. For the substrate 14N, ceramic boards such as an alumina board and an aluminum nitride board, resin boards (a print circuit board), metal-cored boards and the like can be utilized.

The forgoing embodiments allows the semiconductor chip to be shielded in the wave guide structure of which cut-off frequency is higher than the carrier frequency. For the purpose, the wave guide structure should be small in cross section. Therefore, the semiconductor chips for transmitter and receiver circuits are strictly limited to a small number. More specifically, one or two, or three at best, of the semiconductor chips are preferably used as disclosed in the prescribed embodiments. When one or two of the semiconductor chip are shielded in only a package as shown in FIG. 6 or 7, the inner space of the package remains relatively small and free from cavity resonance. As the number of the semiconductor chips is less, their installation will contribute to the increase of the shielding effect as well as the downsizing.

The radio communication module 4 shown in FIG. 6 includes a single semiconductor chip of transmitter and receiver circuits shielded in a package. In addition to the semiconductor chip 7 which is made of GaAs and sized to a 2 mm square, provided for constituting the radio communication module 4 are the transmitter antenna 12 and the receiver antenna 13 both sized to 1 to 2.5 mm square, the high frequency circuit substrate 6 of alumina ceramics or the like, and the package 5 made of Kovar (Fe-Ni-Co alloy), 42 alloy, Cu, or Al and sized to 4 to 5 mm square. The radio communication module 4 of FIG. 6 has the semiconductor chip 7 including main circuit blocks for transmitting and receiving signals and is thus favorable for the downsizing as compared with any conventional module. Also, the antennas 12 and 13 are installed in the package 5 without extending to the outside, hence contributing to the downsizing.

Figure 26:
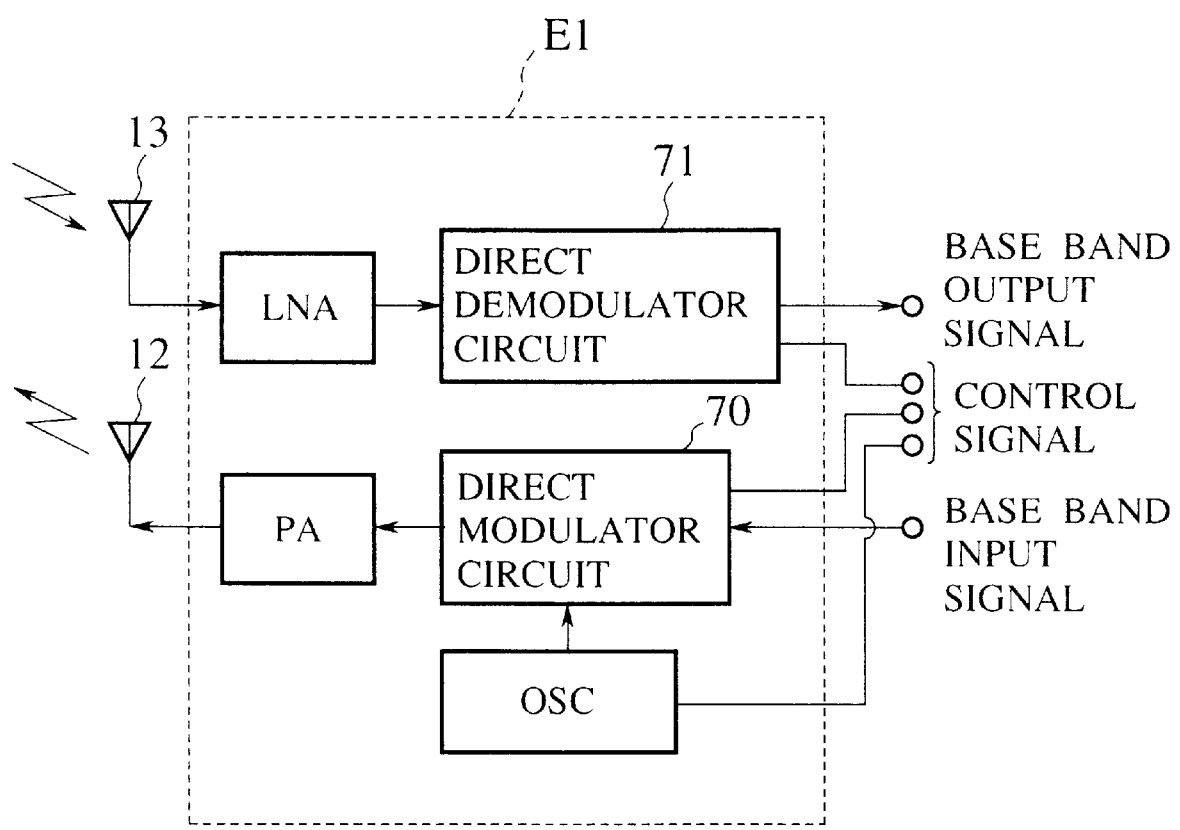
FIG. 26 is a block diagram of a circuit of a semiconductor chip in the radio communication module of the present invention.

FIG. 26 shows a circuit arrangement of the semiconductor chip including both the transmitter and receiver circuits and contributing to the downsizing of the radio communication apparatus. The circuit arrangement El comprises a receiver means including a low noise high frequency amplifier circuit (LNA) and a direct demodulator circuit 71 connected to the LNA, and a transmitter means including a direct modulator circuit 70, an oscillator circuit (OSC) for controlling the direct modulator circuit 70, and a power amplifier circuit (PA) connected to the direct modulator circuit 70. The LNA is coupled to the receiver antenna 13, and the PA is coupled to the transmitter antenna 12. The direct demodulator circuit 71 is provided for transmitting a base band signal, and the direct modulator circuit 70 for receiving a base band signal. A control signal is loaded from the outside for controlling the direct demodulator circuit 71, the direct modulator circuit 70 and OSC. The base band signals and the control signals are received and transmitted through a input and output port 8 as shown in FIG. 26. It is to be noted that the input and output port 8 here generally shows as either of input, output or control terminal or all of them.

In this example, the OSC includes a dielectric resonator which is installed in the semiconductor chip.

One of the reasons why the circuit blocks are installed in the single semiconductor chip is the use of the direct demodulator circuit which simplifys the circuit arrangement. In a traditional circuit arrangement for ultra high frequency signals, the direct demodulator circuit is not employed, allowing the circuit to remain not simplified. Also, the use of multi-layer wiring contributes to the installation of the circuit blocks in the single chip as will be described later in more details.

Figure 27:
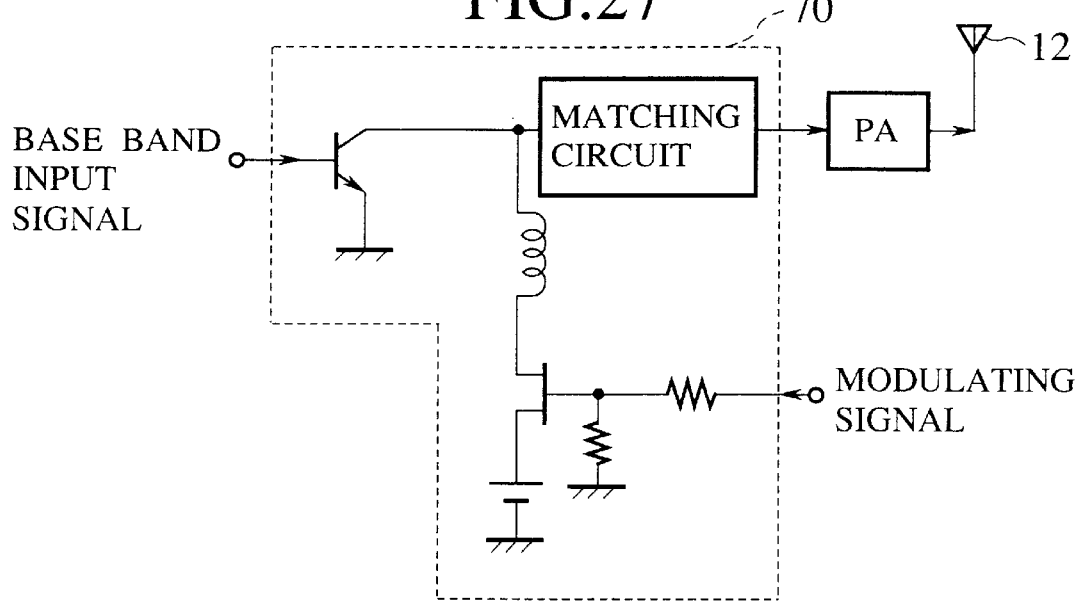
FIG. 27 is a diagram of a direct modulation circuit in the semiconductor chip shown in FIG. 26.

FIG. 27 shows an example of the direct modulator circuit 70 of FIG. 26 in which AM modulation is involved using an FET switching method. A base band signal of interest is modulated by an FET modulator and passed through a matching circuit to the PA. Also, a modulating signal from the OSC is loaded to a resistor.

Figure 28:
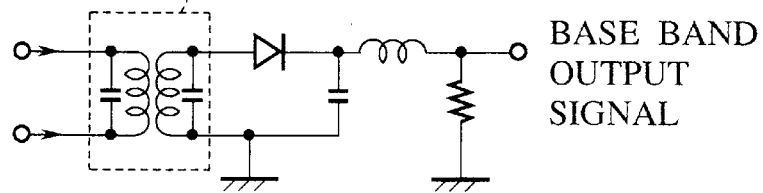
FIG. 28 is a diagram of a direct demodulation circuit in the semiconductor chip shown in FIG. 26.

FIG. 28 shows an example of the direct demodulator circuit 71 in which an input signal from the LNA is processed by a demodulator and tuner circuit 72 and then by a diode detector to form a base band signal which is further delivered.

The demodulator and tuner circuit 72 is provided for enhancing the signal selection and may be replaced with a common tuner circuit. The diode detector may be substituted by a non-linear amplifier.

Figure 29:
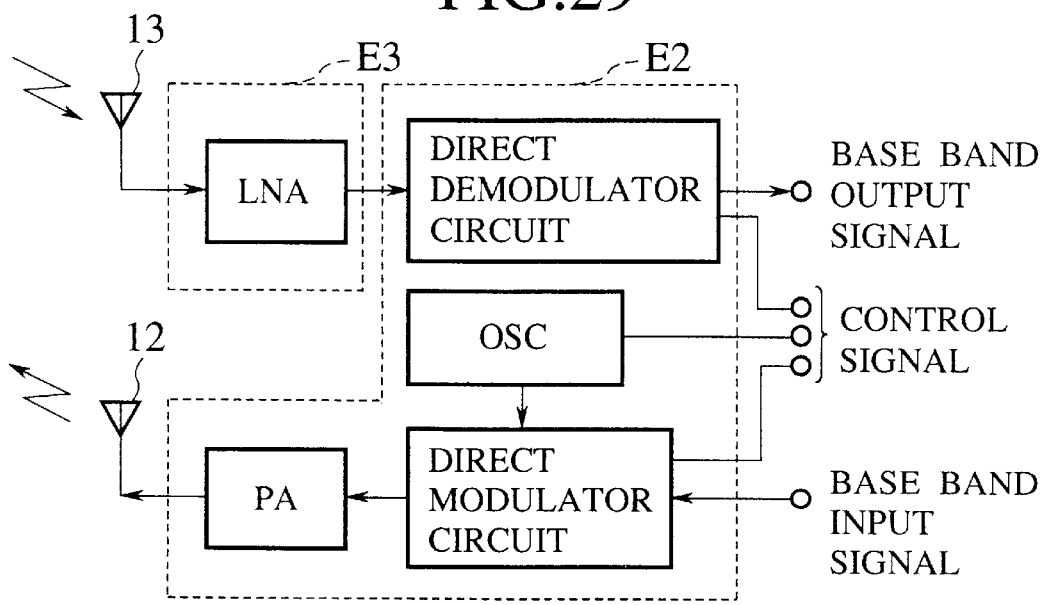
FIG. 29 is a block diagram of a circuit of another example of the semiconductor chip in the radio communication module of the present invention.

Of the radio communication modules of the prescribed embodiments, a few radio communication modules employs two semiconductor chips. An example of the circuit arrangement of the radio communication module using the two semiconductor chips is shown in FIG. 29, where the circuit arrangement E3 of one of the two semiconductor chips includes an LNA and that E2 of the other includes a direct demodulator circuit, an OSC, a direct modulator circuit and a PA. This arrangement with the two semiconductor chips of the circuit arrangements E2 and E3 is capable of preventing the generation of cavity resonance with the shielding effect of its package.

The LNA comprises a single semiconductor chip because it receives a signal directly from the receiver antenna 13 and will produce more possible interference with the other components in the circuit arrangement.

Figure 30:
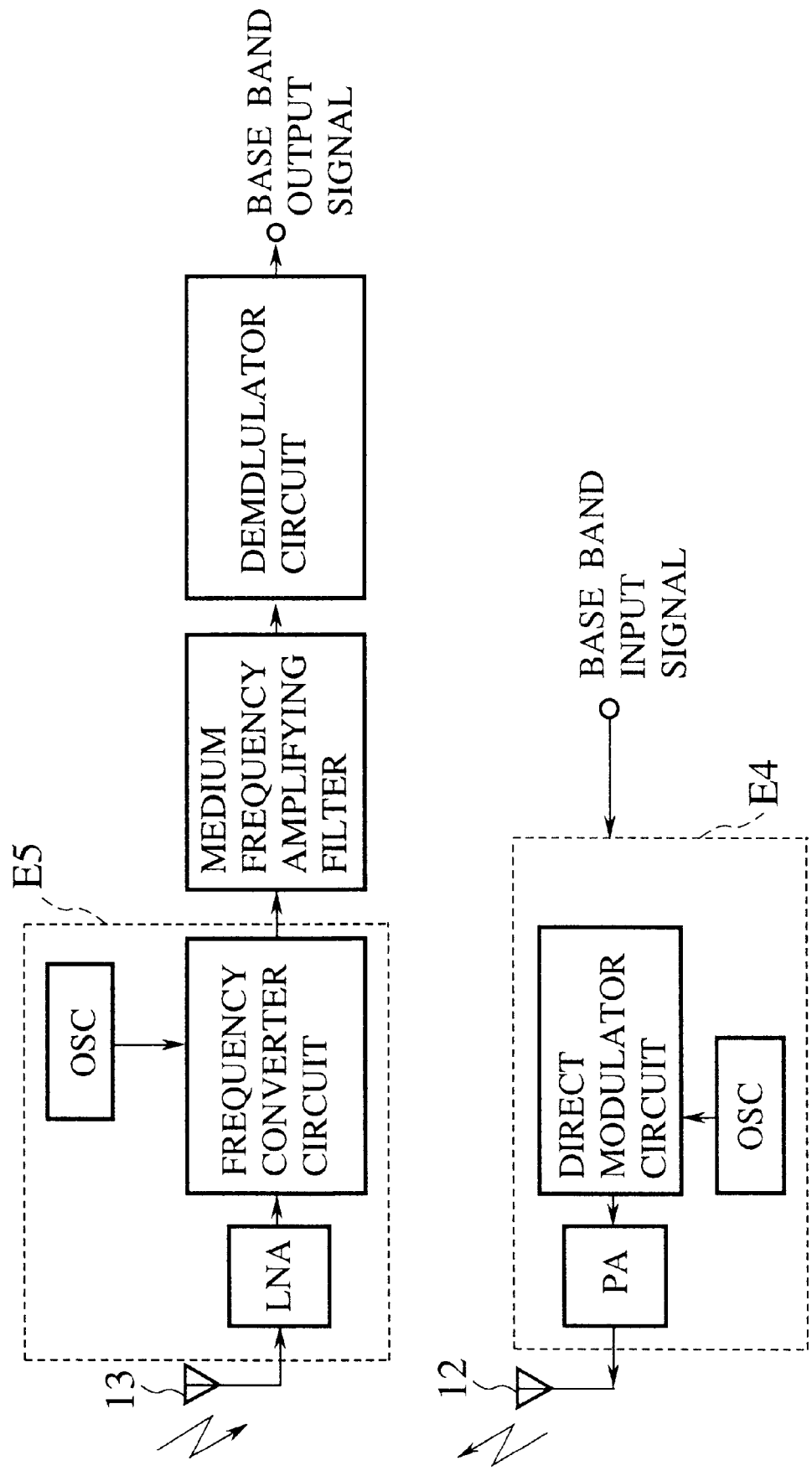
FIG. 30 is a block diagram of a circuit of further example of the semiconductor chips in the radio communication module of the present invention.

FIG. 30 illustrates another circuit arrangement of the radio communication module. Here, the control signal terminals are not shown from FIG. 30 to FIG. 32. This circuit arrangement of the radio communication module has one arrangement E5 of the two semiconductor chips used for signal receiving and the other arrangement E4 for signal transmitting. The circuit arrangement E4 of the transmitter chip is identical in the construction to the transmitter section of the circuit shown in FIG. 26. The receiver chip of the arrangement E5 includes an LNA, an OSC and a frequency converter circuit which is connected to a medium frequency amplifying filter disposed in the outside of the semiconductor chip. The medium frequency amplifying filter is connected to a demodulator circuit from which a base band signal is put out. This circuit arrangement of the radio communication module employs non of the direct demodulator circuit.

Examples of the transmitter module and the receiver module will now be explained.

Figure 31:
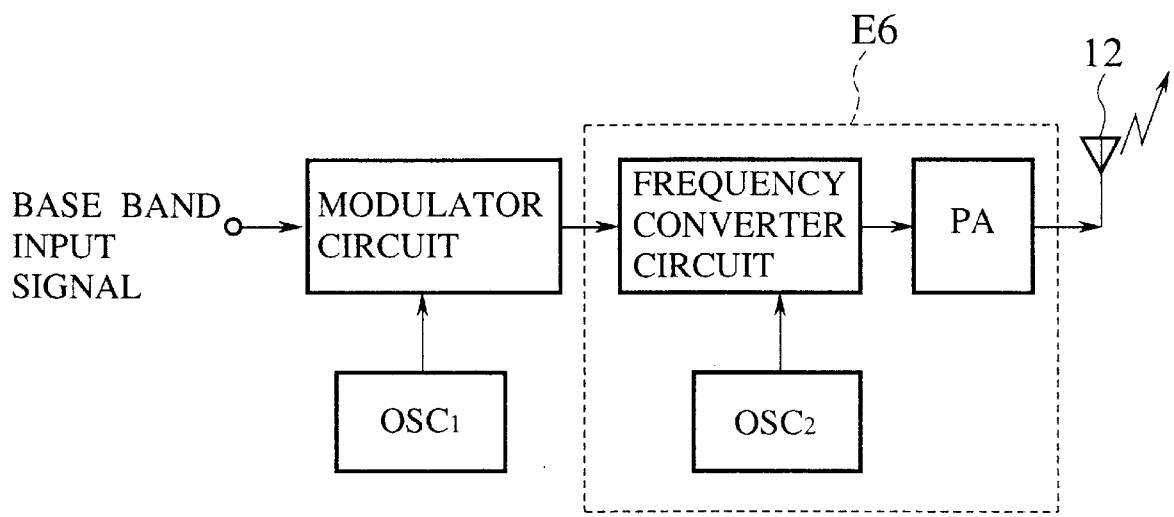
FIG. 31 is a block diagram of a circuit of still further example of the semiconductor chip in the radio communication module of the present invention.

FIG. 31 shows an example of the transmitter module which employs non of the direct modulator circuit for the transmitting means. A base band signal is modulated by a modulator circuit, frequency converted by a frequency converter circuit, and transmitted through a PA to the transmitter antenna 12. There are also provided a first OSC (OSC$_1$) for controlling the modulator circuit and a second OSC (OSC$_2$) for controlling the frequency converter circuit. The frequency converter circuit, the PA and the OSC$_2$ are installed in a semiconductor chip of the circuit arrangement E6.

Figure 32:
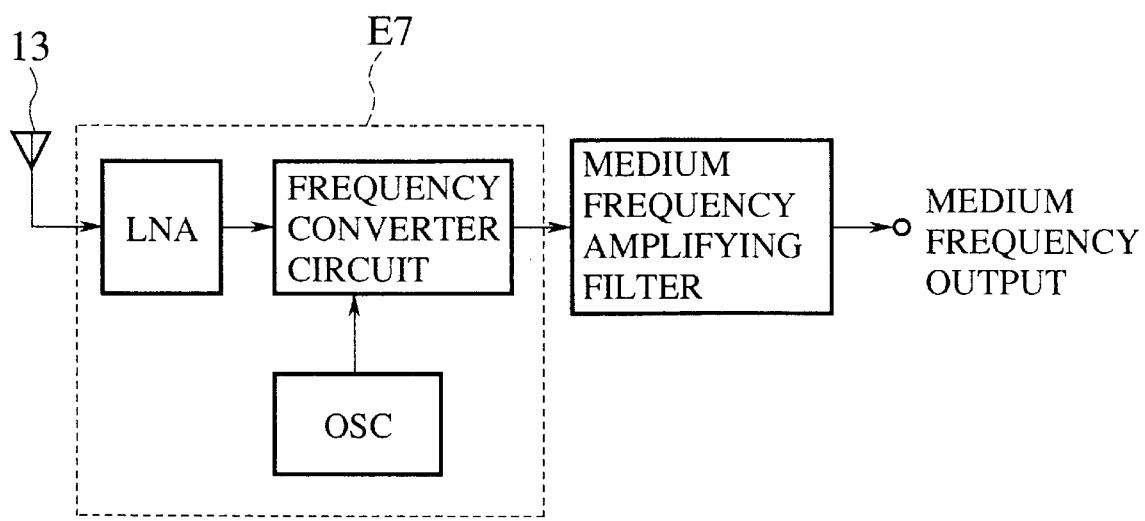
FIG. 32 is a block diagram of a circuit of still further example of the semiconductor chip in the radio communication module of the present invention.

FIG. 32 shows an example of the receiver module which employs non of the direct demodulator circuit. The output of this module is not a base band signal but a medium frequency signal of which frequency is below 1/10 the received frequency. This module is equivalent to the receiver section of the radio communication module shown in FIG. 30 without the demodulator circuit.

Figure 33:
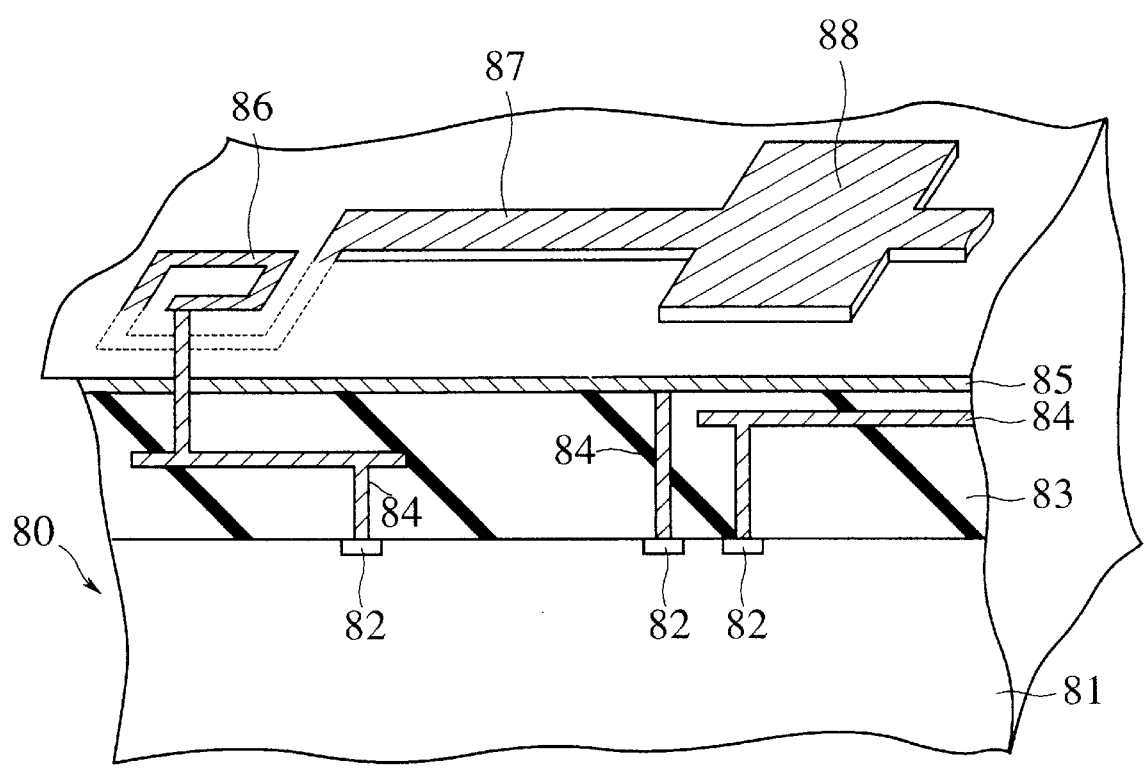
FIG. 33 is a schematic view showing an interior structure of the semiconductor chip in the radio communication module of the present invention.

FIG. 33 illustrates a multi-layer wiring of the semiconductor chip. Although the multi-layer wiring is particularly effective if non of the direct demodulator and modulator circuits is used, it is of course usable in a case of employing the direct demodulator circuit or modulator circuit.

As shown in FIG. 33, a substrate 81 made of a semi-insulating material such as GaAs carries on its surface a variety of elements 82 including active elements and resistor elements such as transistors and diodes, and passive elements such as capacitors and inductors. The substrate 81 may be made of Si substrate. The substrate 81 is formed at surface with an insulating layer 83 which is made of organic resin such as polyimide or benzocyclobutene (BCB, C$_8$ H$_6$) or SiO$_2$ material. If the organic resin is used, the insulating layer will be increased in thickness but low in the dielectric constant and the loss.

The elements 82 are connected with signal lines 84 made of Al, Au, or Cu which extend in two or more layers in the insulating layer 83.

The insulating layer 83 is coated at surface with a grounding conductive layer 85 on which a spiral inductor 86, a microwave transmission line 87, and a transmitter or receiver antenna 88.

The multi-layer wiring in the semiconductor chip enhances the integration of the circuit arrangement hence contributing to the downsizing of the semiconductor chip as well as reducing the number of chips to be installed in a package.

Figure 34:
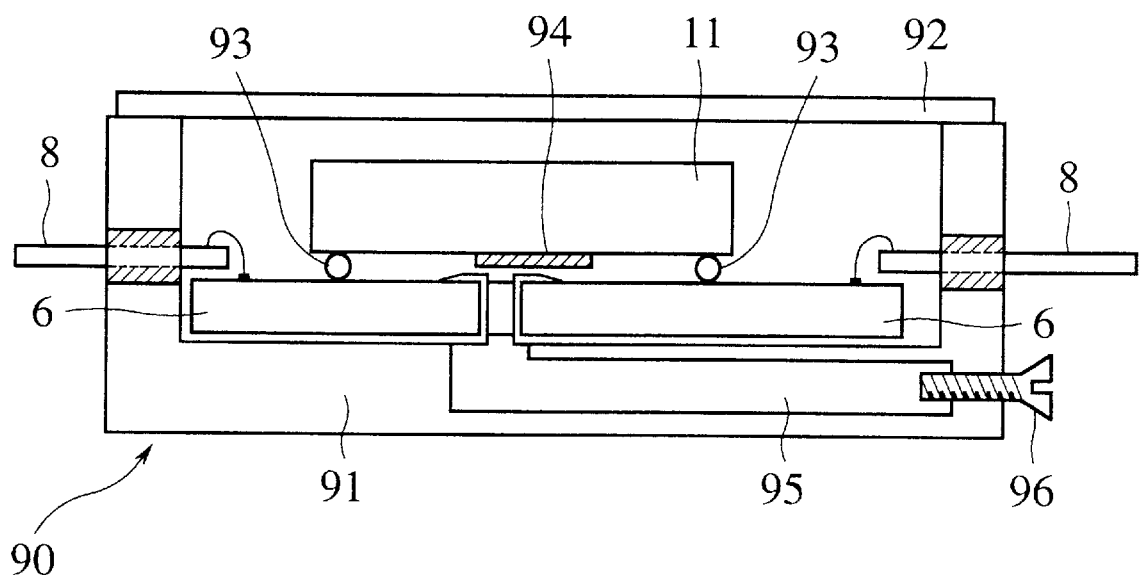
FIG. 34 is a cross sectional view explaining a cavity resonance device in the radio communication module of the present invention.

FIG. 34 shows an example of the radio communication module 90 including a cavity resonator which acts as the OSC, in which a part of the OSC extends outwardly of a semiconductor chip 11 in a package 91.

More specifically, the semiconductor chip 11 is mounted with bumps 93 on a high frequency circuit board 6 by flip-chip manner.

The package 91 has a non-conductive cap 92 of a low dielectric resin material provided thereon for allowing antennas (not shown) mounted on the top of the semiconductor chip 11 to receive and transmit relevant signals. The low dielectric resin material of the cap 92 may be selected, for example, from epoxy, polyimide, teflon, polycarbonate and the like. The material of the cap 92 is not limited to the resin but any other non-conductive materials may be used with equal success.

The cavity resonator 95 is coupled to a microwave transmission line 94 mounted on the bottom of the semiconductor chip 11 and forms the OSC together with active elements and resistors in the semiconductor chip 11. A screw 96 is provided extending from the outside of the package 91 to the cavity resonator 95 so that the resonance frequency is controlled by turning and moving the screw 96 to and from the cavity of the resonator 95 to regulate the dimension of the cavity.

Figure 35A:
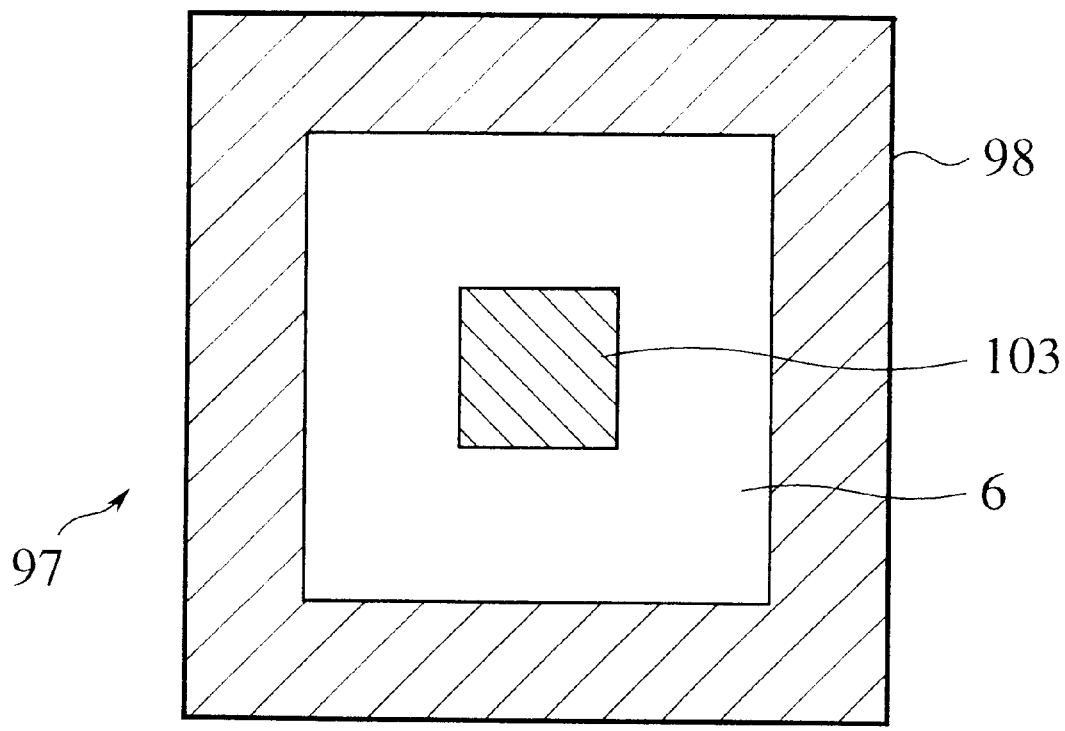
FIG. 35A is a lower view explaining the arrangement of an antenna in the radio communication module of the present invention.
Figure 35B:
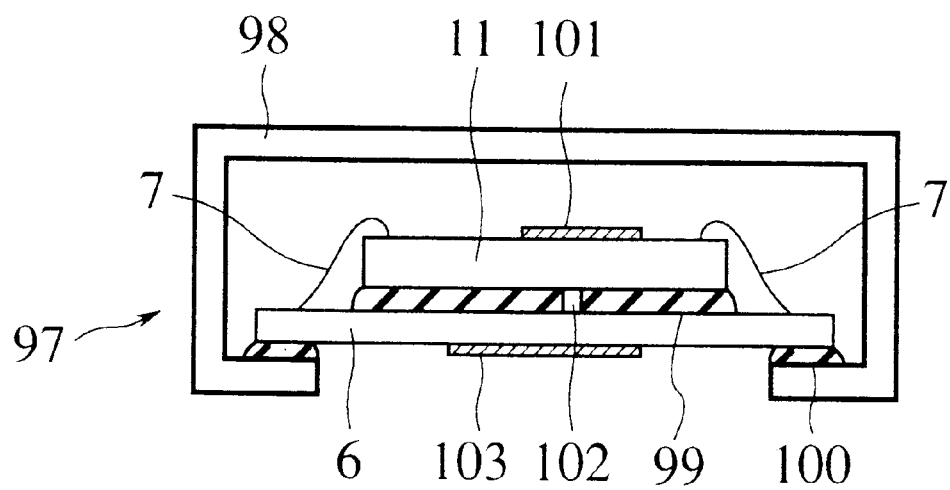
FIG. 35B is a cross sectional view of the same.

Although the unshown antennas are activated with aid of the non-conductive region of the cap 92 or the package 91 in FIG. 34, they may be cooperated with an opening provided in the package 91. The latter is shown in FIG. 35A and 35B. FIG. 35A is a lower view of a radio communication module 97 and FIG. 35B is a cross sectional view of the same.

As shown, a transmitter and/or receiver antenna 103 is mounted not on the upper surface of a semiconductor chip 11 but on the lower surface of a high frequency circuit board 6 thus to confront the opening of a package 98.

Between the semiconductor chip 11 and the high frequency circuit board 6 provided is a buffer layer 99 made of a low dielectric material and surrounding a void 102. Another buffer layer 100 is disposed between the high frequency circuit board 6 and the package 98.

Figure 36A:
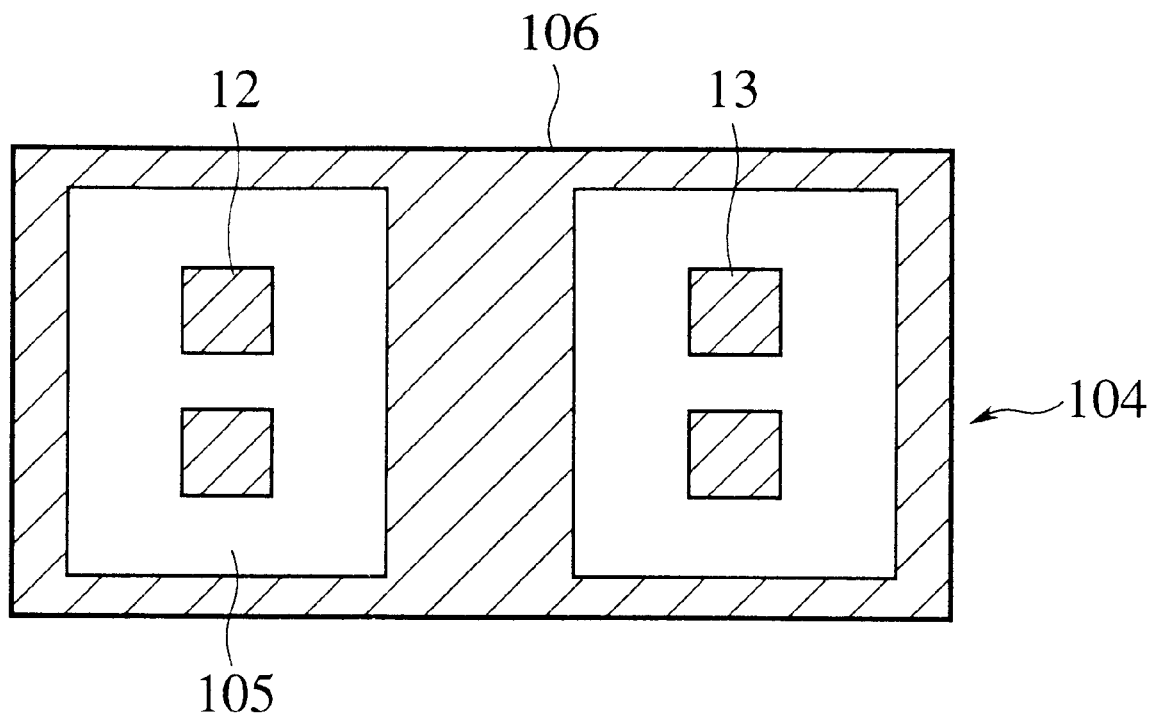
FIG. 36A is a lower view explaining the arrangement of another antenna in the radio communication module of the present invention.
Figure 36B:
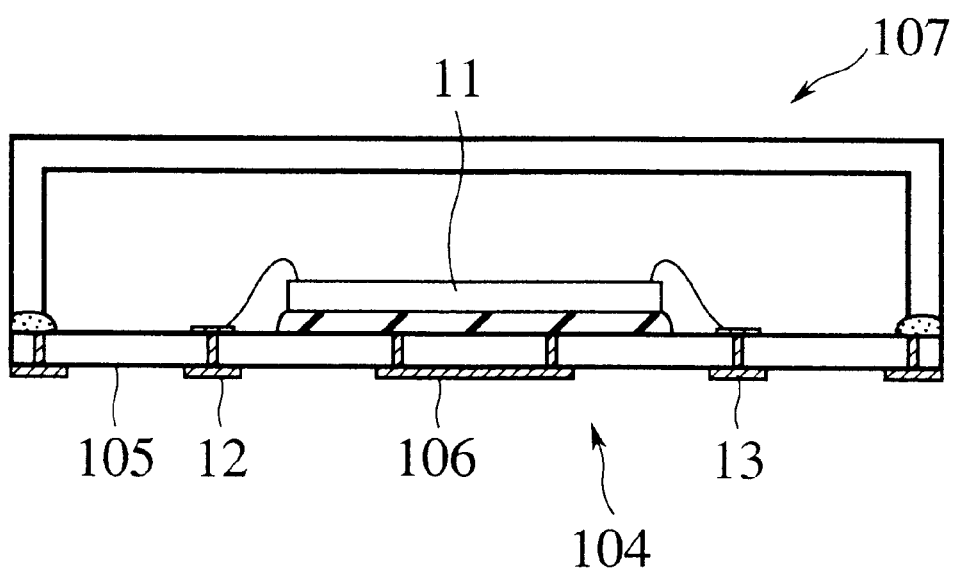
FIG. 36B is a cross sectional view of the same.

FIGS. 36A and 36B illustrate a radio communication module 104 in which a semiconductor chip 11 is mounted on one surface of a substrate 105 and a transmitter antenna 12 and a receiver antenna 13 are mounted on the other surface. FIG. 36A is a plan view and FIG. 36B is a cross sectional view of the same. The substrate 105 has through holes or vias provided therein through which the semiconductor chip 11 are electrically connected to the transmitter antenna 12 and the receiver antenna 13. A metal cap 107 is provided on the surface of the substrate 105 on which semiconductor chip 11 is mounted, for shielding the semiconductor chip 11, and a grounding electrode 106 on the other side for encompassing and separating the transmitter antenna 12 and the receiver antenna 13 from each other. The two antennas 12 and 13 are disposed outside of a package 104 and will thus be free from dispersion and loss.

The antennas 12 and 13 may be accompanied with a conductive pattern, electrodes, and a metal structure for increasing the electrical separation and the directivity. They may also be protected with a film of a low dielectric material.

The resonator used in the OSC of the radio communication module will be explained in more details. Although the following examples of the resonator are of illustrative and not limited to the use in the prescribed embodiments, they contribute to the downsizing of the radio communication modules.

Figure 37A:
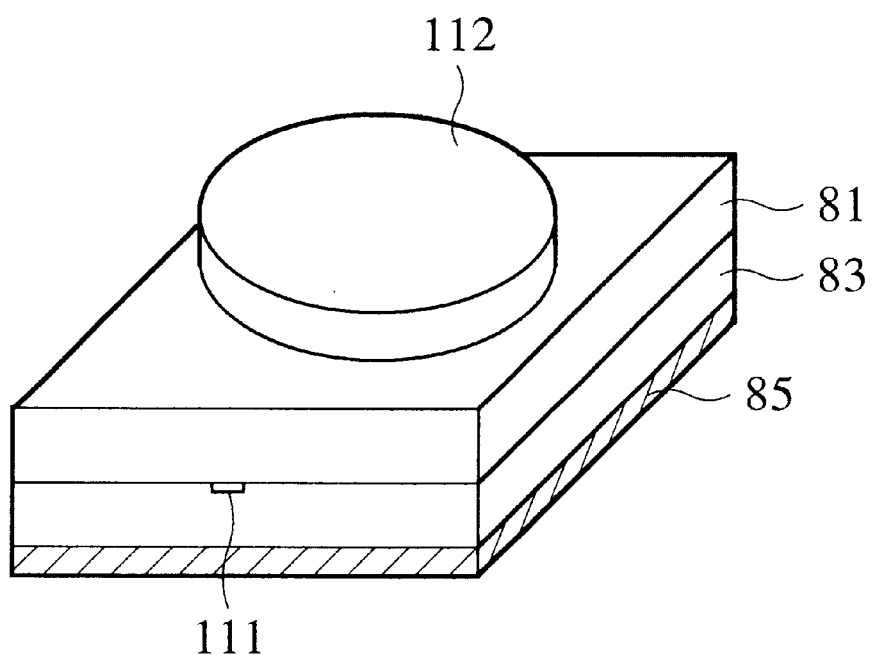
FIG. 37A is a perspective view showing the arrangement of a resonator in the radio communication module of the present invention.
Figure 37B:
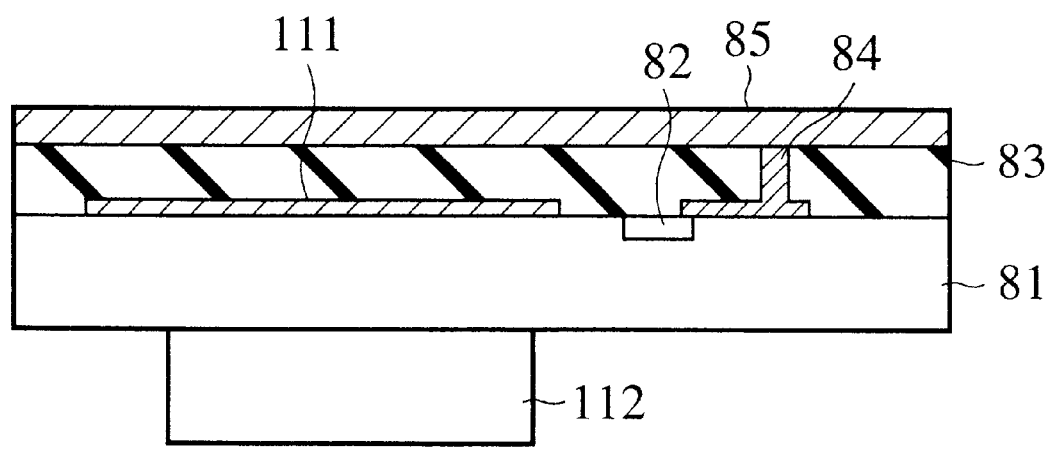
FIG. 37B is a cross sectional view of the same.

FIGS. 37A and 37B show a dielectric resonator 112 mounted on the back surface of a substrate 81. FIG. 37A is a perspective view and FIG. 37B is a cross sectional view of the same. The substrate 81 in which the element 82 is formed at the upper side is provided with transmission lines 84 on the upper surface and is coated with a polyimide layer 83 and a grounding conductive layer 85. The elements 82 are connected by their respective transmission lines 84 to the grounding conductive layer 85. The dielectric resonator 112 is provided on the lower surface of the substrate 81.

As compared with a conventional arrangement in which both a dielectric resonator and a microwave transmission line are mounted on the active-elements-mounted surface of a substrate, the dielectric resonator 112 shown in FIG. 37 is seated to overlap with a microwave transmission line 111 on the substrate 81 thus enhancing its coupling.

Figure 38:
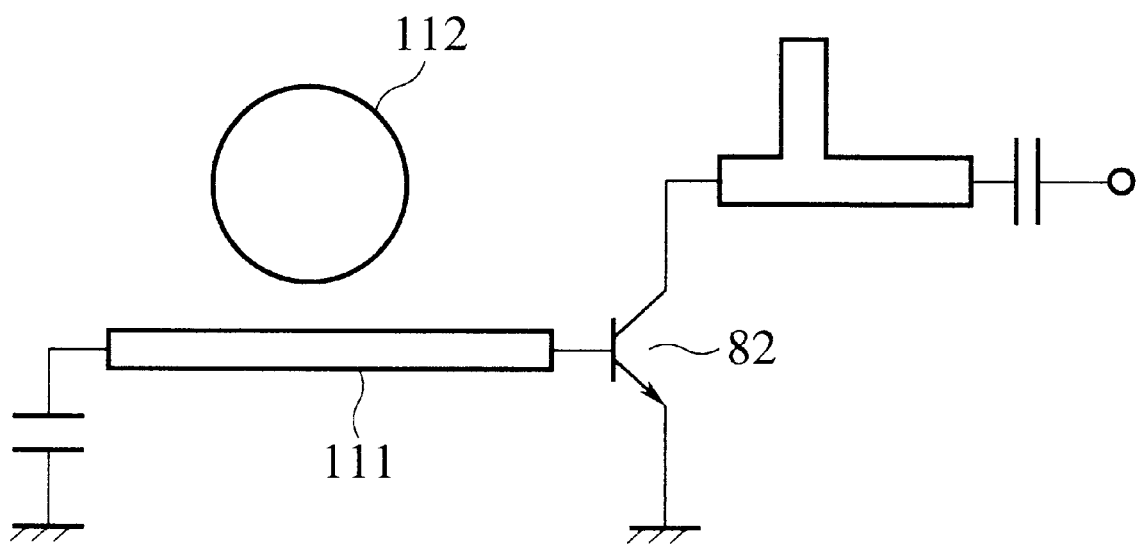
FIG. 38 is a diagram of an oscillator circuit in the radio communication module of the present invention.

FIG. 38 is a diagram of the circuit arrangement on the substrate 81 with a dielectric device shown in FIG. 37.

Figure 39:
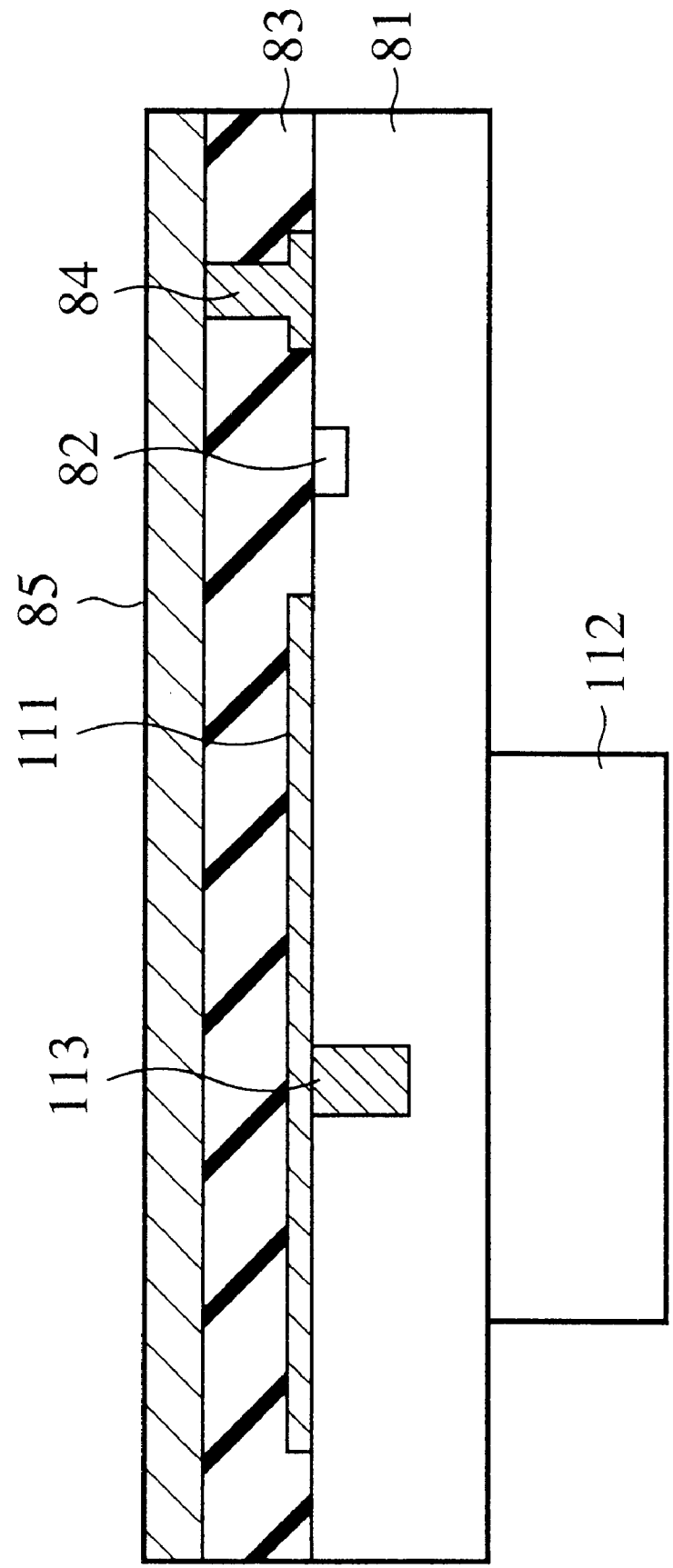
FIG. 39 is a cross sectional view showing a coupling form between the resonator and the substrate in the radio communication module of the present invention.

The arrangement of FIG. 37 may be modified as shown in FIG. 39 where a through hole wiring 113 extending from the microwave transmission line 111 is embedded in the substrate 81. In this construction, the distance and the coupling between the dielectric resonator 112 and the microwave transmission line 111 can be controlled by varying the length of the through hole wiring 113.

Figure 40:
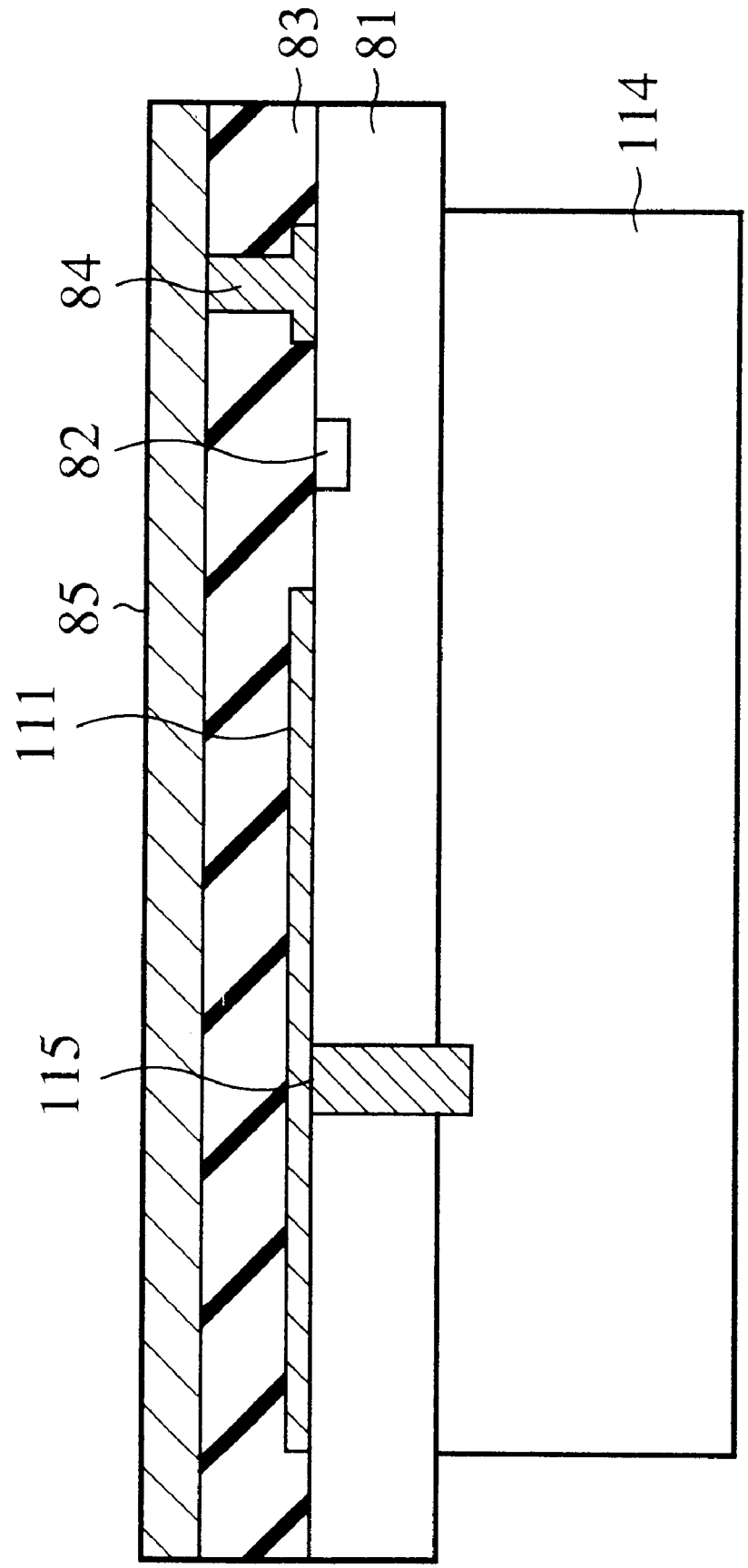
FIG. 40 is a cross sectional view showing another coupling form between the resonator and the substrate in the radio communication module of the present invention.

FIG. 40 shows a cavity resonator 114 substituting the dielectric resonator, in which a through hole wiring 115 extends into the cavity of the resonator 114 for coupling the resonator 114 with a microwave transmission line 111.

Figure 41:
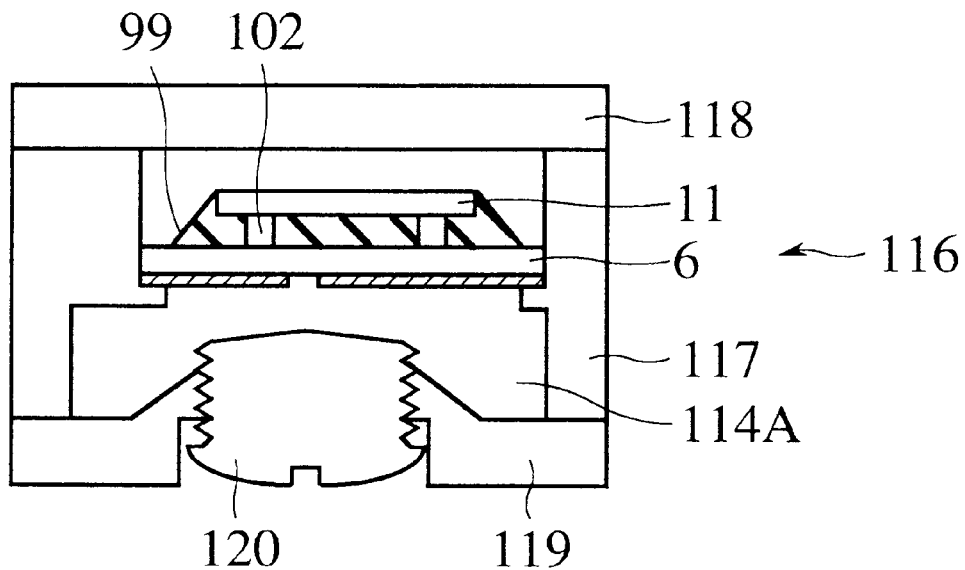
FIG. 41 is a cross sectional view explaining the arrangement of a cavity resonator in the radio communication module of the present invention.

FIG. 41 illustrates a radio communication module 116 in which a cavity resonator 114A is provided to extend over almost the entire lower surface of a high frequency circuit board 6.

A package 117 of the module 116 includes two covers 118 and 119 provided at upper and lower thereof respectively.

As shown, the bottom of the cavity resonator 114A is greater in area than the lower surface of the high frequency circuit board 6 and the resonance frequency of the cavity resonator 114A is smaller than that of a space above the high frequency circuit board 6. Accordingly, the resonance action in the cavity resonator 114A will hardly lead to a resonance in the upper space, thus preventing a semiconductor chip 11 from being affected by undesired resonance.

Figure 42:
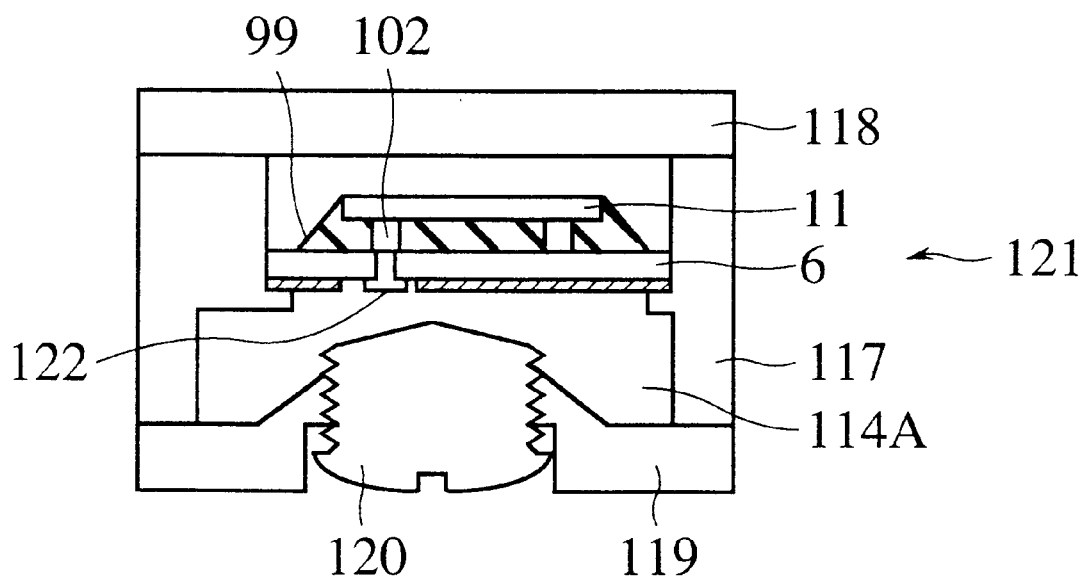
FIG. 42 is a cross sectional view explaining the arrangement of another cavity resonator in the radio communication module of the present invention.

The lower surface of the high frequency circuit board 6 in FIG. 41 is protected with a conductive coating except a particular region through which the upper side of the high frequency circuit board 6 is coupled with the resonator 114A. This may be substituted by a through hole wiring 122 as shown in FIG. 42.

Figure 43:
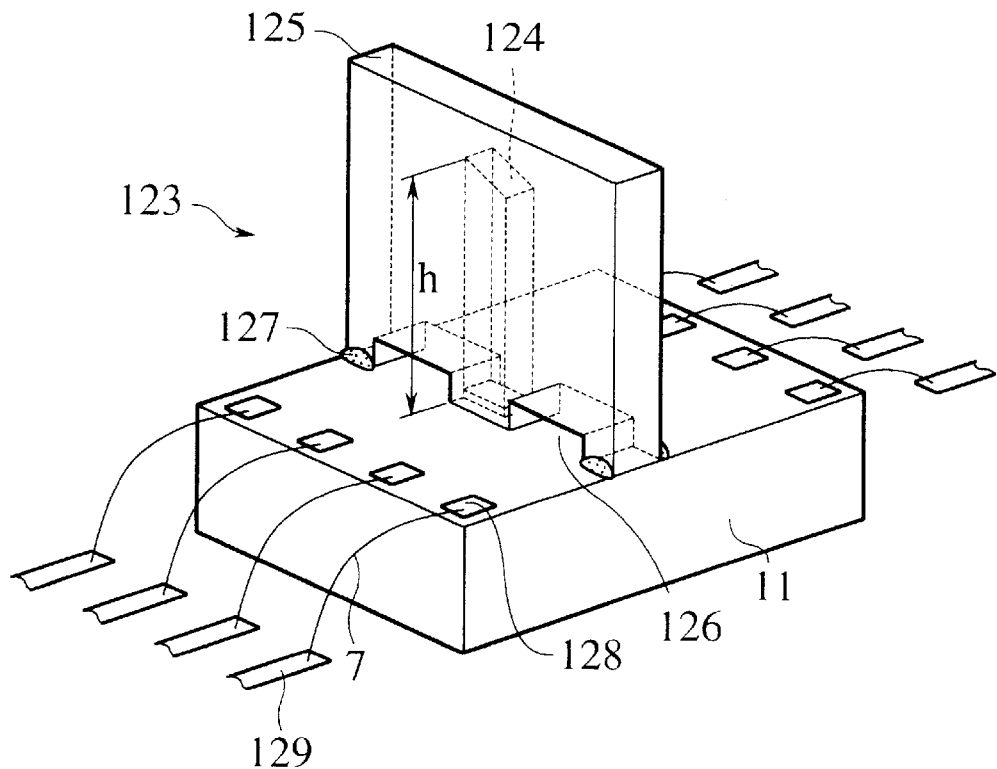
FIG. 43 is a perspective view of the arrangement of a further cavity resonator in the radio communication module of the present invention.

FIG. 43 illustrates an assembly 123 having a cavity resonator 124 formed with a Si substrate and mounted on a semiconductor chip 11.

More specifically, the cavity resonator 124 defined in the Si substrate 125 is mounted by soldering 127 on the semiconductor chip 11. The Si substrate 125 has a notch such that voids 126 are provided between the Si substrate 125 and the semiconductor chip 11. The voids 126 are arranged for reducing the contact area between the Si substrate 125 and the semiconductor chip 11 thus contributing to the downsizing of the semiconductor chip 11. The semiconductor chip 11 has pads 128 and is mounted on a high frequency circuit board with the pads 128 joined by corresponding bonding wires 7 to terminals of a wiring pattern 129 of the circuit board.

Figure 44:
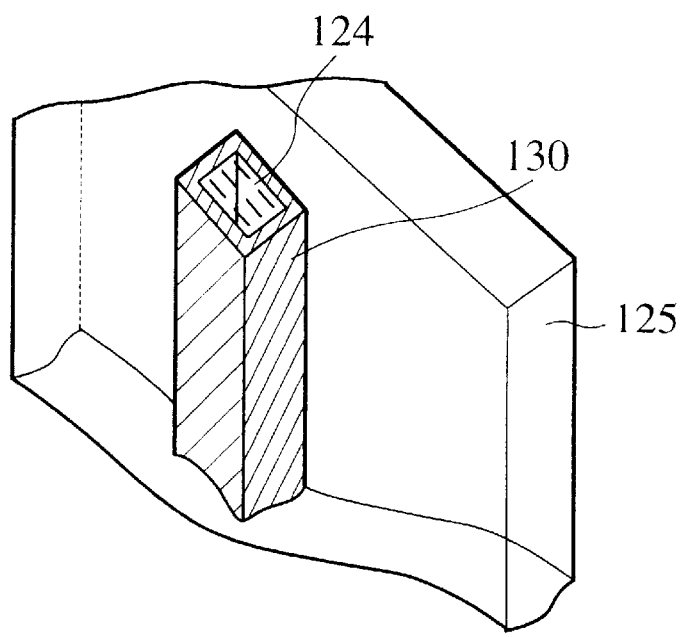
FIG. 44 is an enlarged view of the cavity resonator of FIG. 43.
Figure 45:
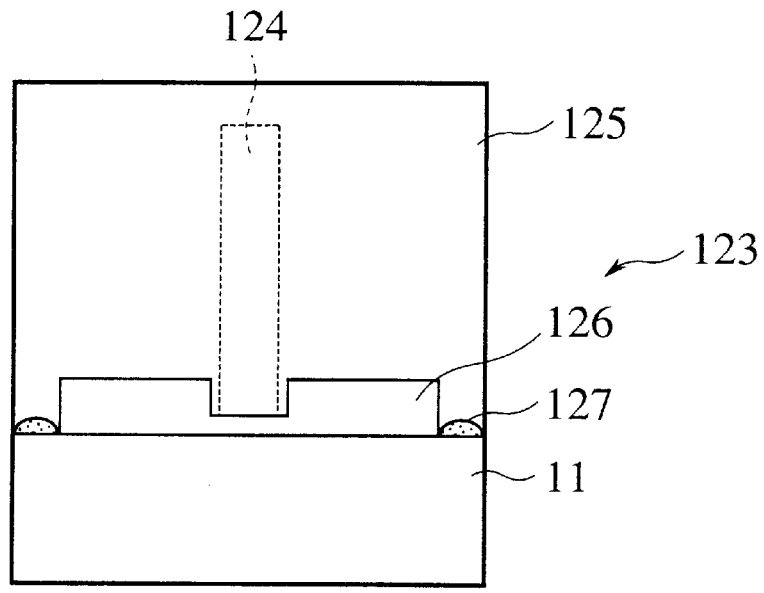
FIG. 45 is a cross sectional view of the cavity resonator of FIG. 43.

FIG. 44 is an enlarged view showing a part of the cavity resonator 124. A conductive layer 130 is provided on the inner wall of the cavity of the Si substrate 125 for producing the cavity resonance. FIG. 45 is a cross sectional view of the cavity resonator 124 mounted on the semiconductor chip 11 of FIG. 43. The Si substrate 125 may be replaced with a crystal body for forming the cavity resonator 124.

The cavity resonator 124 described above has some advantages. Firstly, the cavity in the Si substrate 125 is made by a known anisotropic etching technique and thus has highly accurate dimensions. Secondly, the surfaces at the cavity of the resonator 124 can be finished with high smoothness. Accordingly, the Q value indicating the quality of resonance will be improved.

For having a higher level of the Q value, the conductive layer 130 is preferably made of a highly conductive material such as Cu, Ag and the like.

For producing a resonance of 60 GHz, the cavity resonator 124 shown in FIG. 43 is tailored to have a height h smaller than 2.5 mm.

Figure 46:
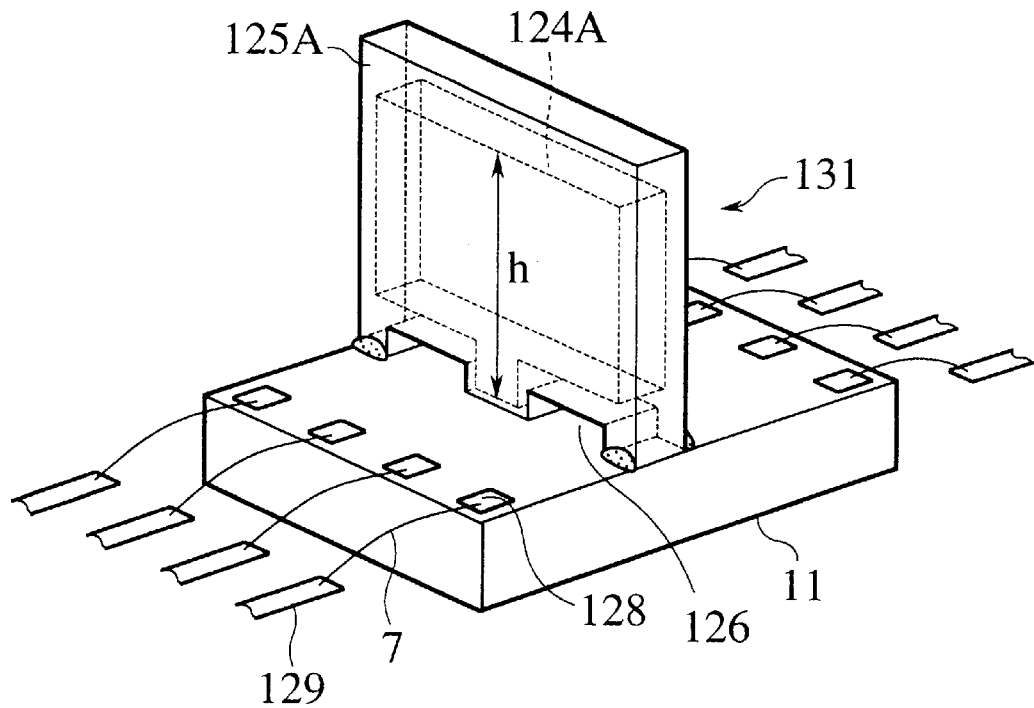
FIG. 46 is a perspective view of the arrangement of a still further cavity resonator in the radio communication module of the present invention.
Figure 47:
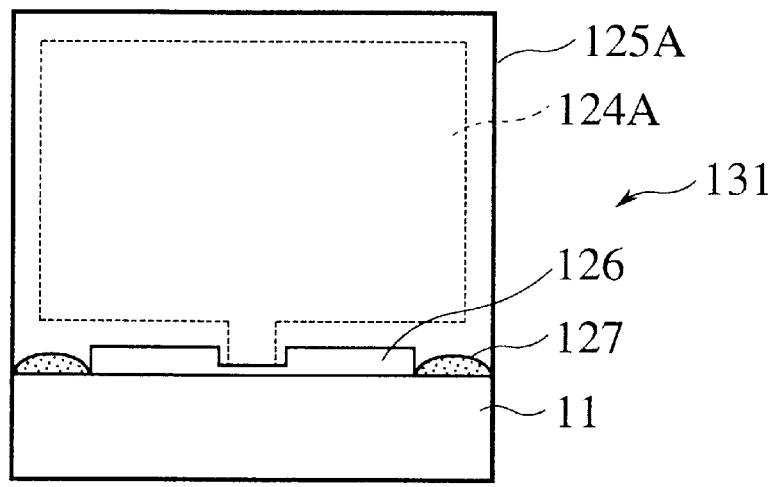
FIG. 47 is a cross sectional view of the cavity resonator of FIG. 46.

The height h may further be reduced if a cavity resonator 124A is formed in the almost entire Si substrate 125 as shown in FIGS. 46 and 47. The cavity resonator 124A of FIGS. 46 and 47 is greater in the area of its conductive layer than the resonator shown in FIGS. 43 to 45 hence increasing the Q value.

Figure 48:
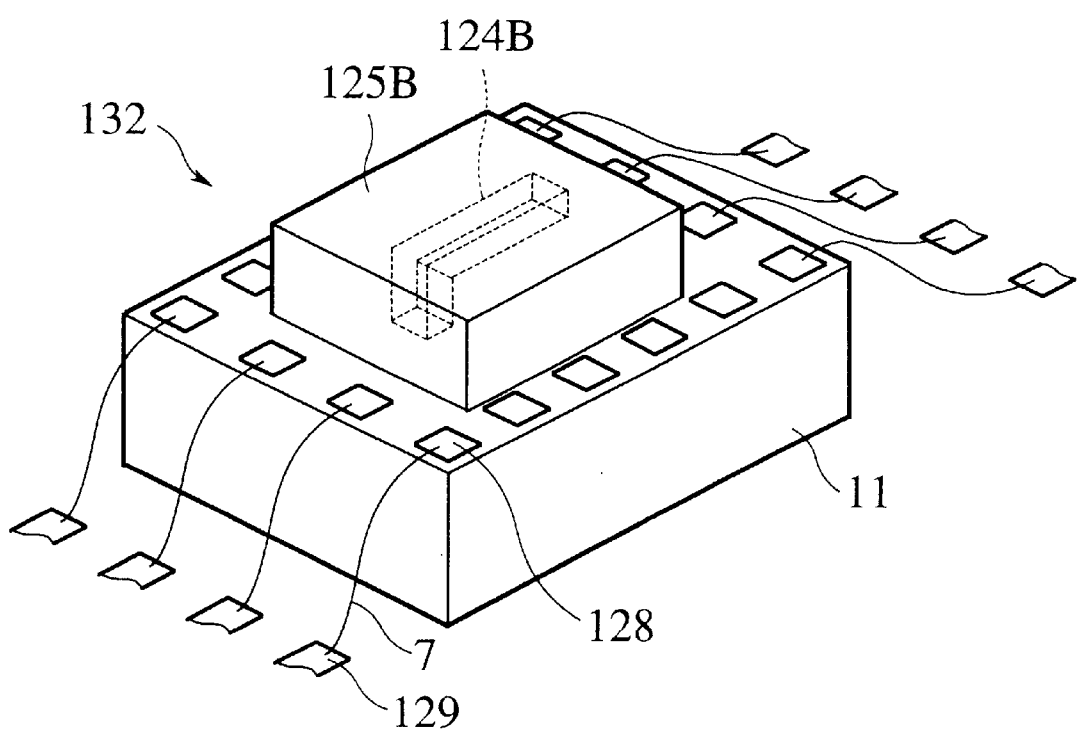
FIG. 48 is a perspective view of the arrangement of a still further cavity resonator in the radio communication module of the present invention.
Figure 49:
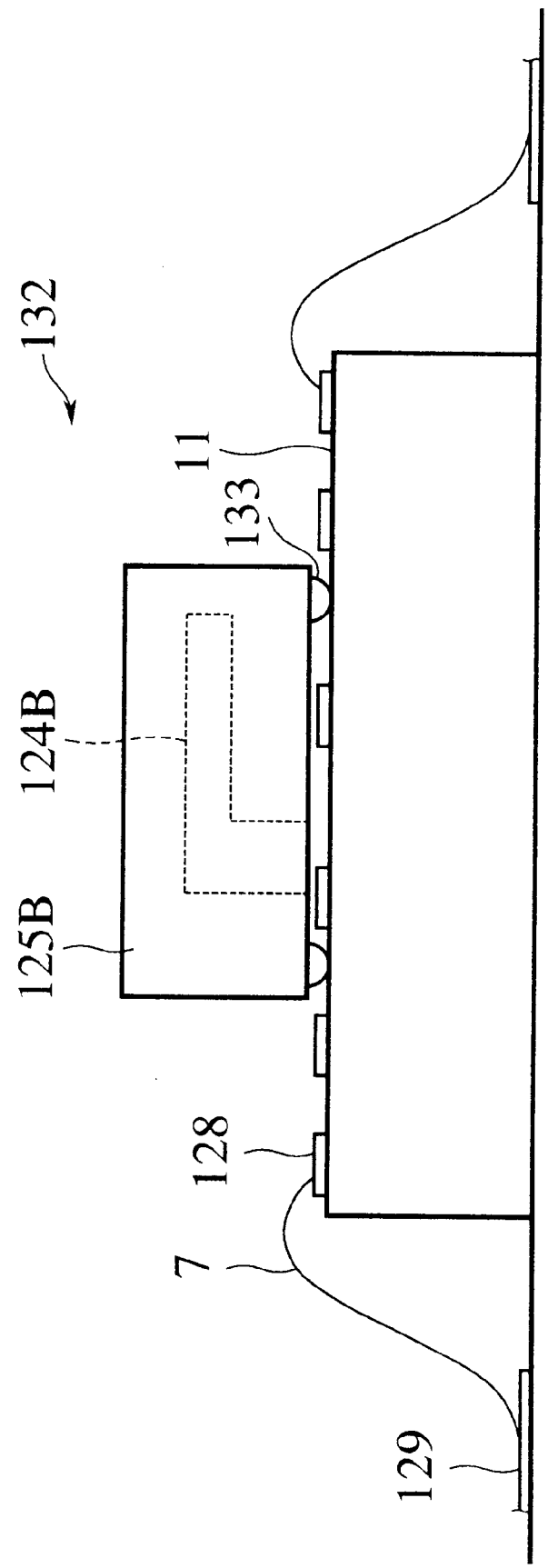
FIG. 49 is a cross sectional view of the cavity resonator of FIG. 48.

Also, another arrangement 132 may be employed as shown in FIGS. 48 and 49, in which a cavity resonator 124B extends horizontally in a horizontally mounted Si substrate 125B thus to further reduce its height h while an Si substrate 125B is mounted by bumps 133 to a semiconductor chip 11.

Figure 50:
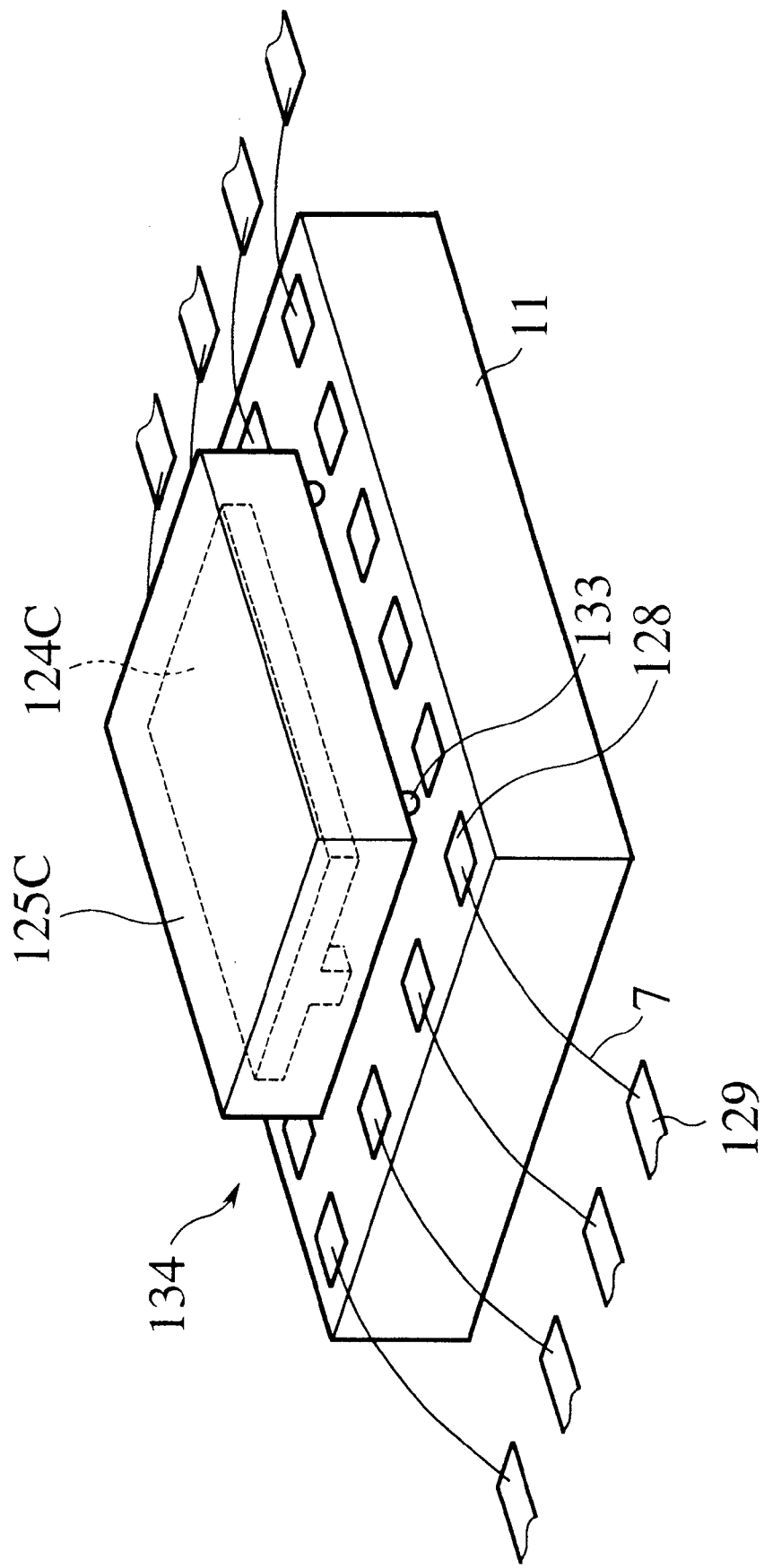
FIG. 50 is a perspective view of the arrangement of a still further cavity resonator in the radio communication module of the present invention.
Figure 51:
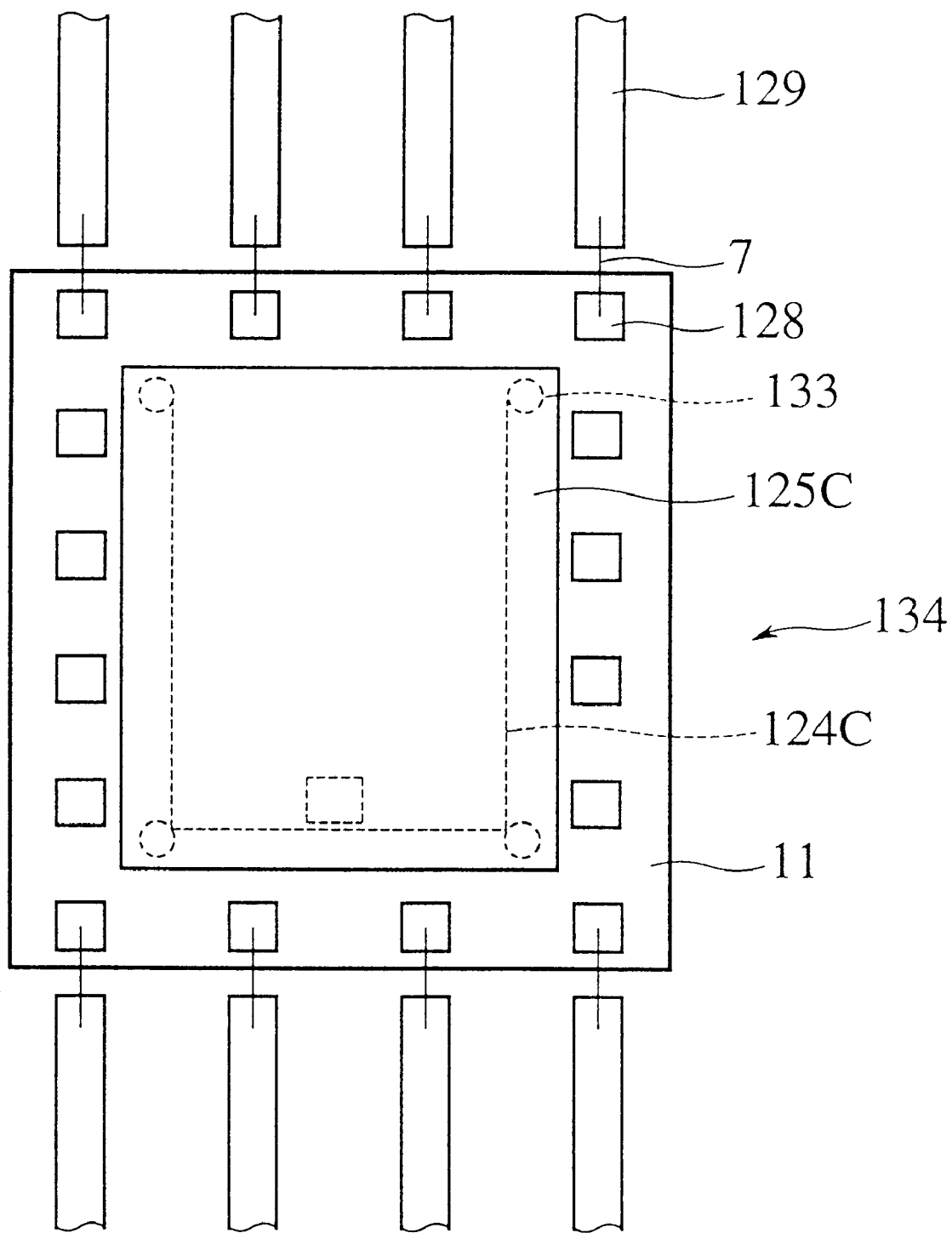
FIG. 51 is a cross sectional view of the cavity resonator of FIG. 50.

A further arrangement 134 may be used as shown in FIGS. 50 and 51 where a cavity resonator 124C extends almost throughout a horizontally-mounted Si substrate 125C.

Figure 52:
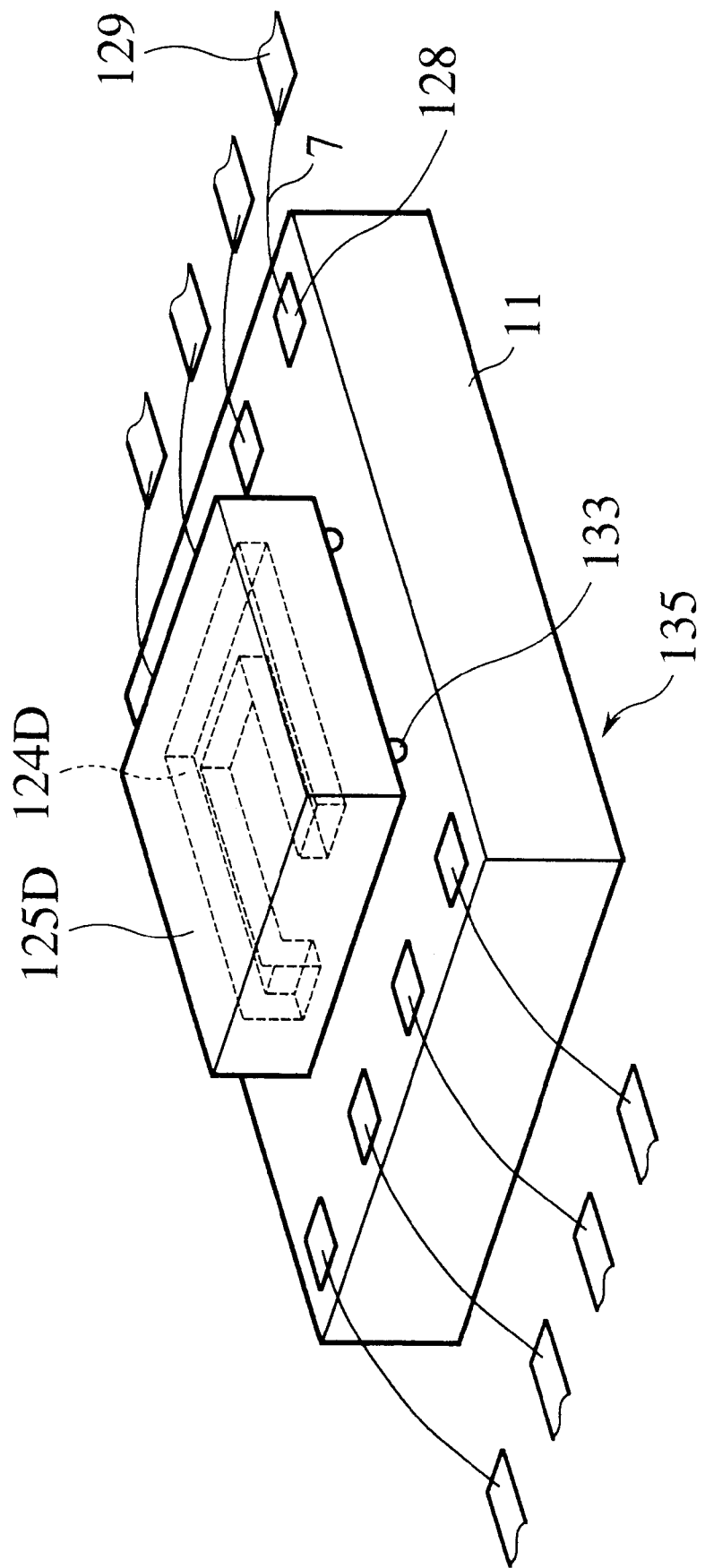
FIG. 52 is a perspective view of the arrangement of a still further cavity resonator in the radio communication module of the present invention.
Figure 53:
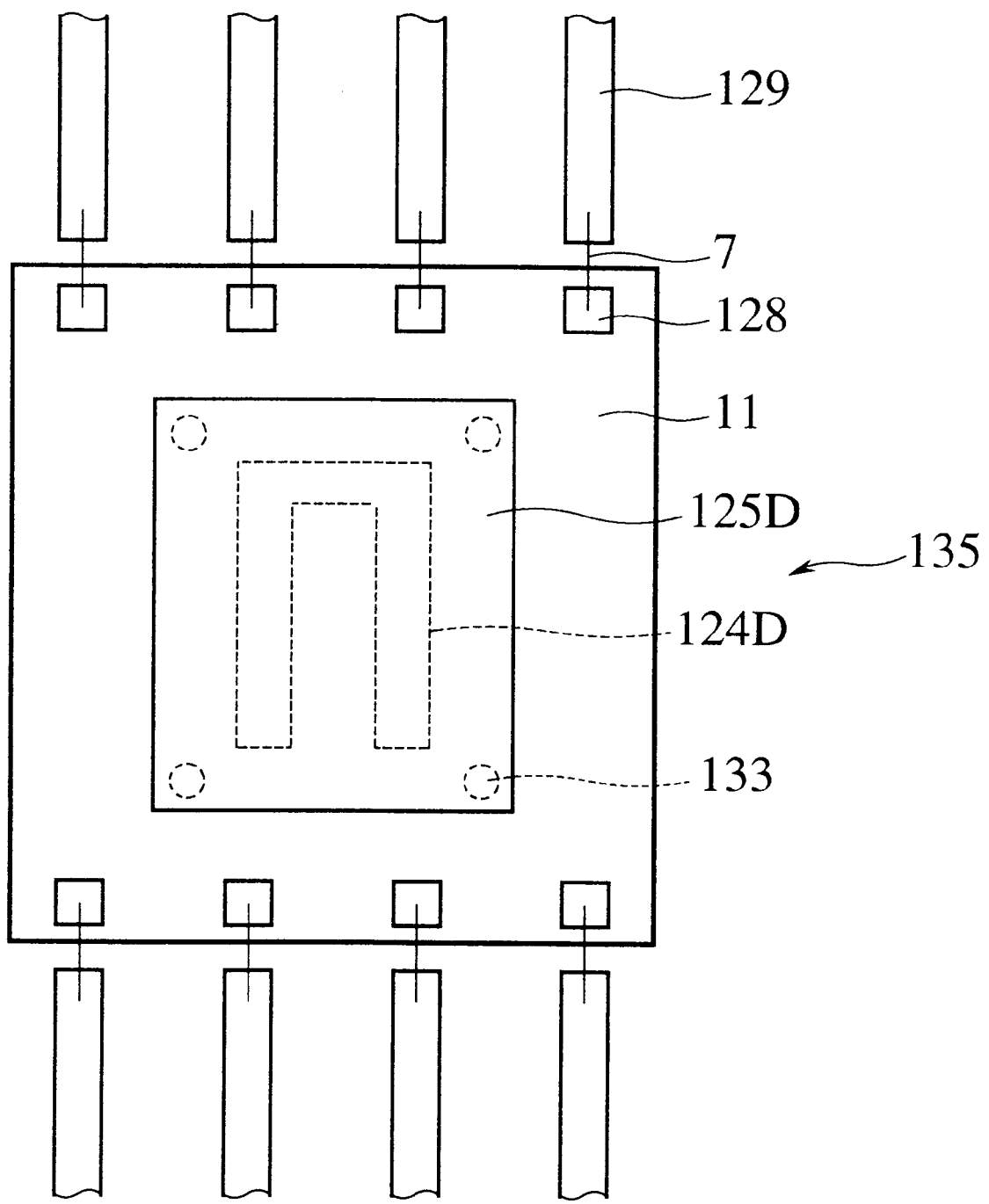
FIG. 53 is an upper view of the cavity resonator of FIG. 52.

A still further arrangement 135 may be possible as shown in FIGS. 52 and 53 where a cavity resonator 124D is formed of a C shape in an Si substrate 125D.

Figure 54:
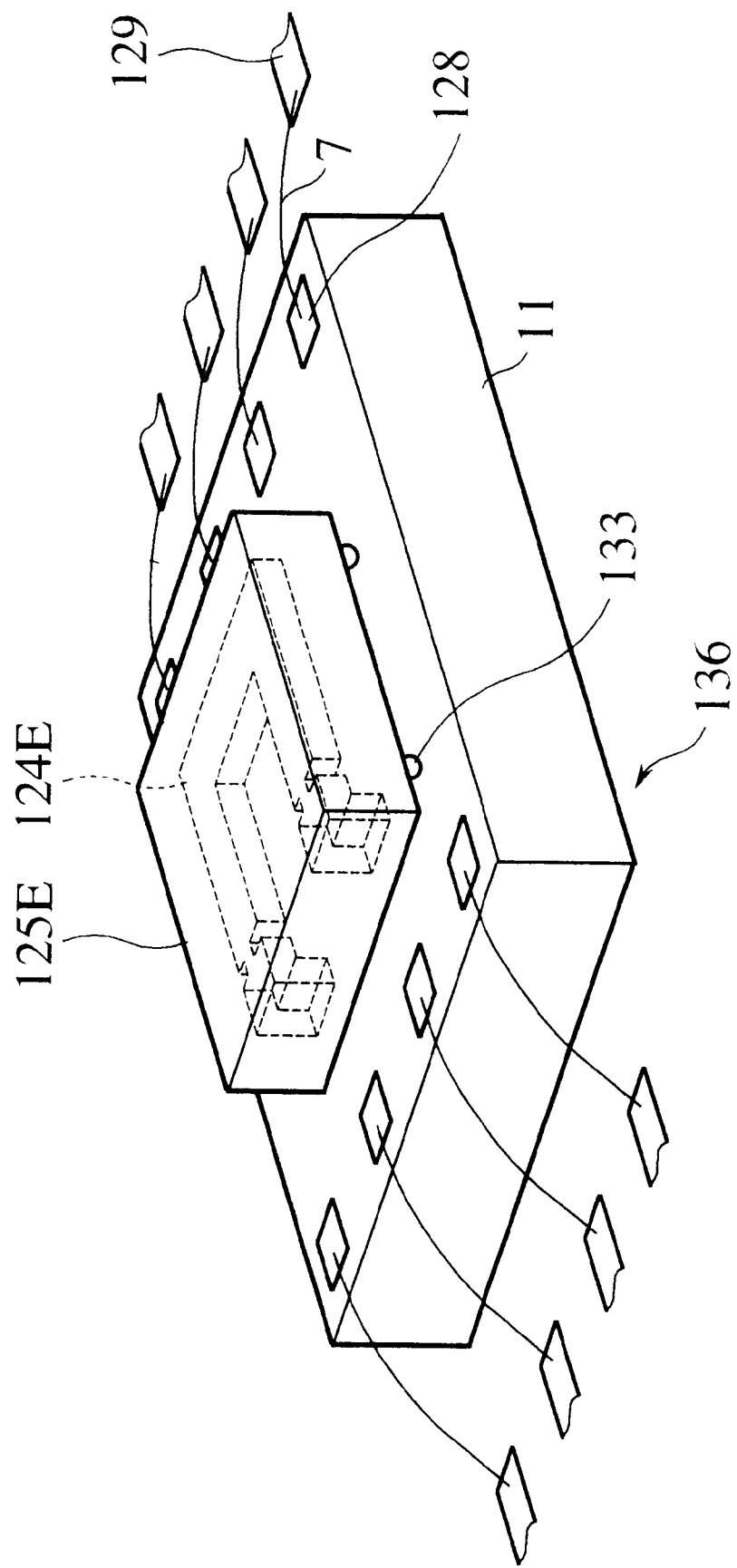
FIG. 54 is a perspective view of the arrangement of a still further cavity resonator in the radio communication module of the present invention.
Figure 55:
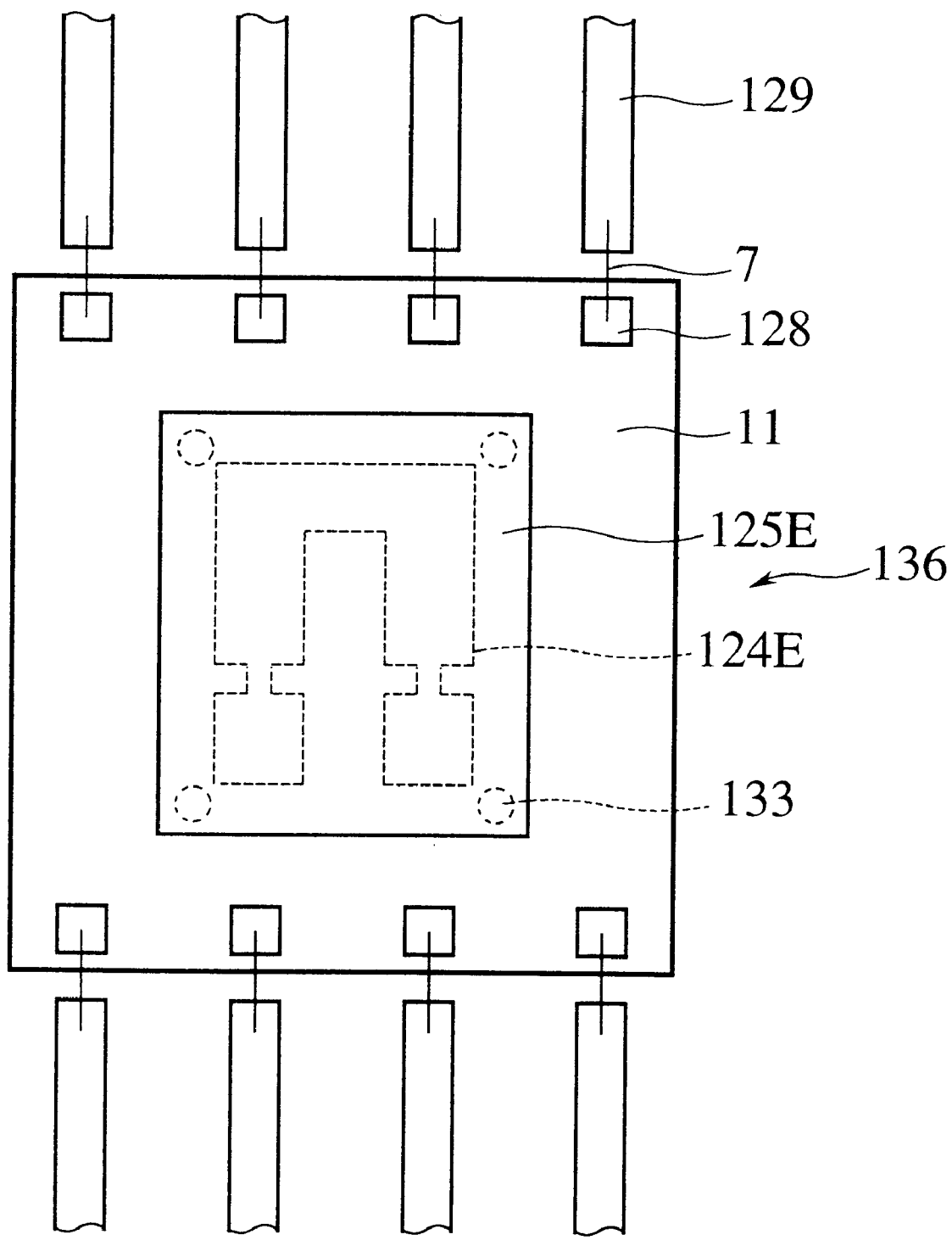
FIG. 55 is an upper view of the cavity resonator of FIG. 54.

A still further arrangement 136 may be employed as shown in FIGS. 54 and 55 where a cavity resonator 124E of a C shape has reduced regions thereof in an Si substrate 125E which serve as a bandpass filter for passive elements. While bandpass filters are commonly provided in a semiconductor chip, the resonator 124E shown in FIGS. 54 and 55 contributes to the downsizing of the corresponding semiconductor chip 11.

Figure 56:
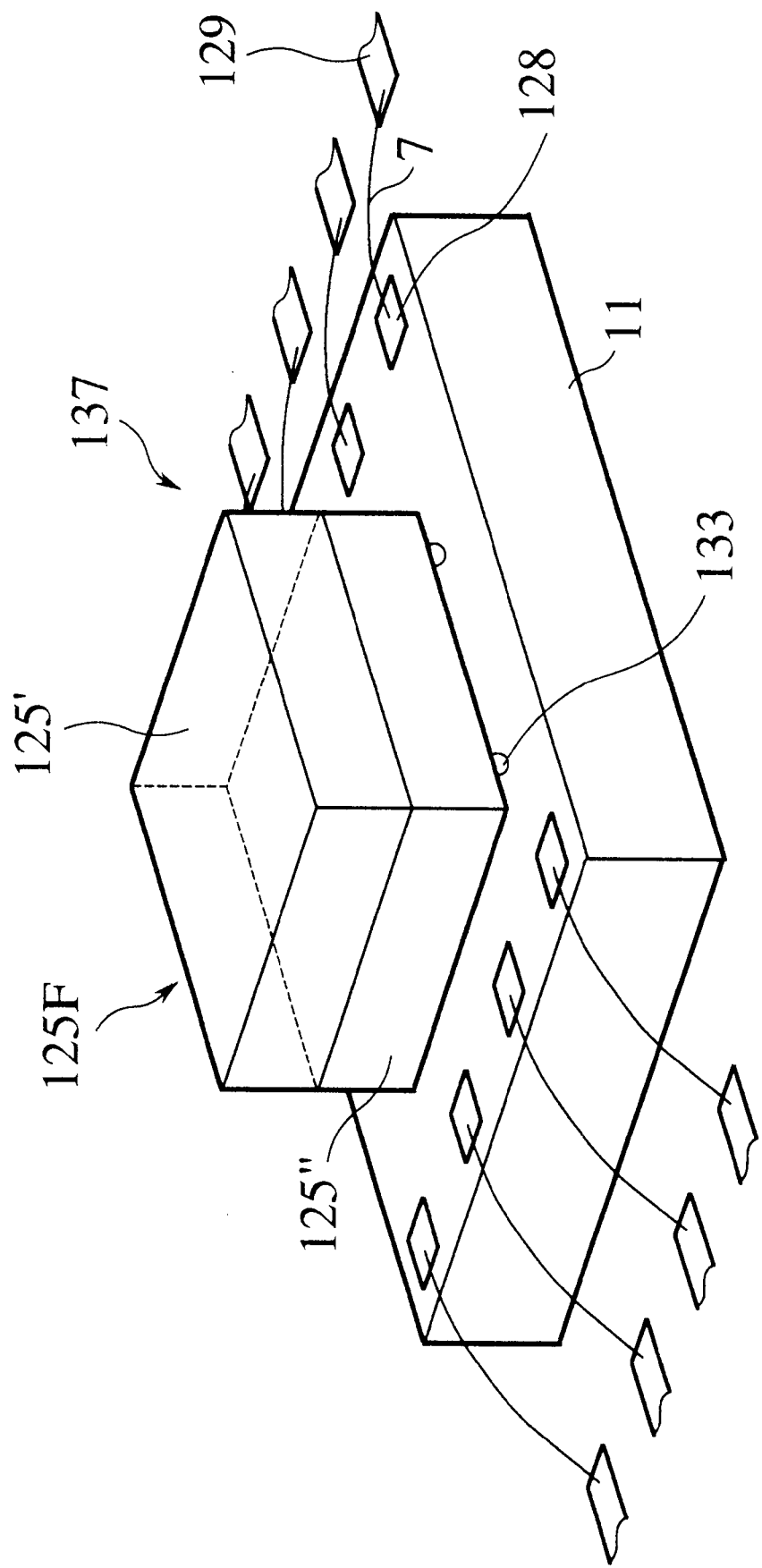
FIG. 56 is a perspective view of the arrangement of a still further cavity resonator in the radio communication module of the present invention.
Figure 57:
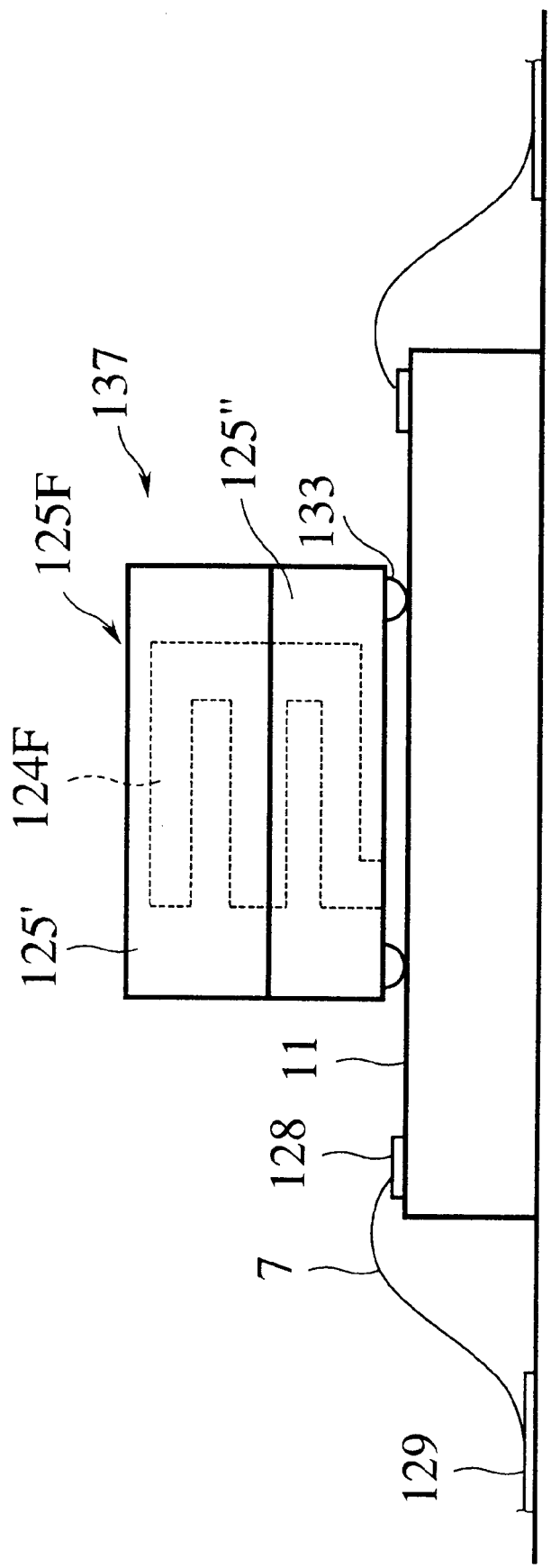
FIG. 57 is a cross sectional view of the cavity resonator of FIG. 56.

The cavity resonator may be formed between a pair of Si substrates 125F placed one over the other. Such an arrangement 137 is shown in FIGS. 56 (the resonator not shown) and 57. The two substrates 125' and 125" allow a cavity resonator 124F to have an elaborate shape and a higher function.

A procedure of producing the cavity resonator in the Si substrate will be explained referring to the cross sectional views of FIGS. 58 to 62.

Figure 58:
FIG. 58 is a cross sectional view for explaining a step of producing the cavity resonator of the radio communication module of the present invention.
Figure 59:
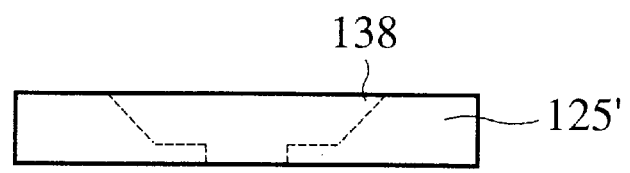
FIG. 59 is a cross sectional view of a step succeeding the step of FIG. 58.

As shown in FIG. 58, the procedure starts with preparing an unprocessed form of the Si substrate 125'. This is followed by making an aperture 138 of an appropriate shape in the Si substrate 125' by anisotropic etching technique as shown in FIG. 59.

Figure 60:
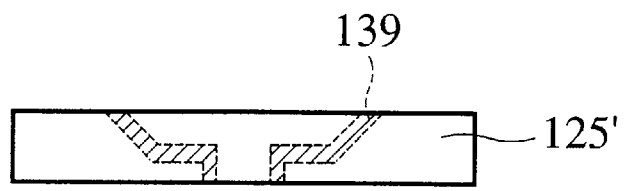
FIG. 60 is a cross sectional view of a step succeeding the step of FIG. 59.
Figure 61:
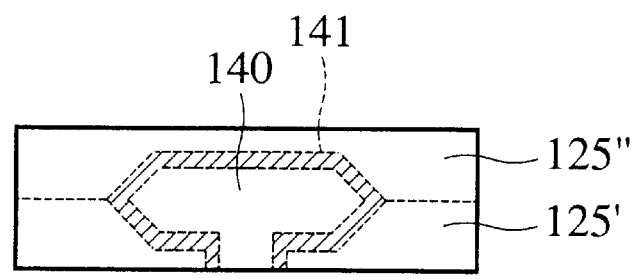
FIG. 61 is a cross sectional view of a step succeeding the step of FIG. 60.

Then, a conductive layer 139 is deposited on the surface of the aperture 138, as shown in FIG. 60. An unprocessed form of the other Si substrate 125" is subjected to the same steps for making a conductive layer 141 deposited on the aperture surface. The two Si substrates 125' and 125" are joined to each other by direct bonding as shown in FIG. 61.

Figure 62:
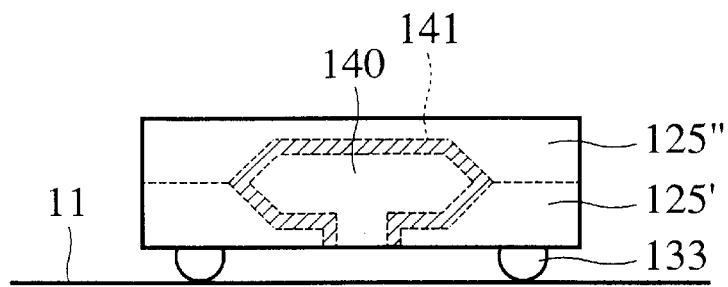
FIG. 62 is a cross sectional view showing the cavity resonator produced by the steps of FIGS. 58 to 61.

This is followed by mounting the Si substrates 125' and 125" by the bumps 133 on the semiconductor chip 11 as shown in FIG. 62.

Figure 63:
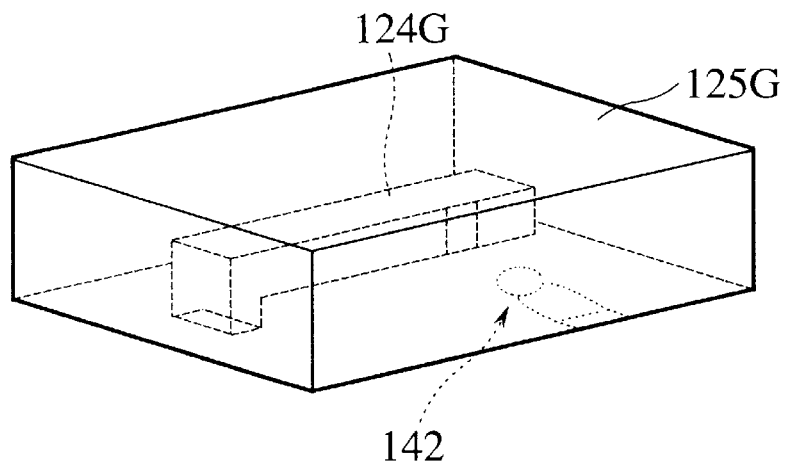
FIG. 63 is a schematic view of a means for controlling the resonance frequency of the cavity resonator in the radio communication module of the present invention.
Figure 64:
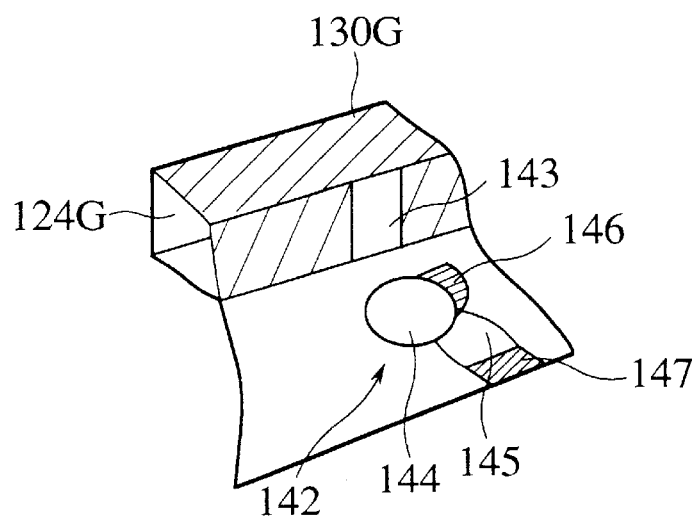
FIG. 64 is an enlarged view of the means for controlling the resonance frequency of the cavity resonator shown in FIG. 63.

The resonance frequency of the cavity resonator as described above can be controlled from the outside by, for example, the controlling means 142 which is shown in FIGS. 63 and 64. FIG. 64 is a partially enlarged schematic view of the cavity resonator 124G shown in FIG. 63.

The controlling means 142 is provided by the process comprising; making a window 143 in a conductive layer 130G of the cavity resonator; depositing near the window 143 an n layer 144 and a p layer 145 which are pn joined to each other; and attaching a pair of electrodes 146 and 147 to the n layer 144 and the p layer 145 respectively. The electrodes 146 and 147 are arranged to extend to the outside of the Si substrate 125G.

A voltage is applied to the two electrodes 146 and 147. The resonance frequency of the drive resonator 124G can thus be controlled by varying the applied voltage.

As set forth above, the embodiments of the present invention allow relevant antennas for a band of ultra high frequencies of quasi-milliwave or higher of which wave length is less than 30 mm to be minimized in the overall dimensions thus to reduce the size of a package and also, to be separately located as a transmitter antenna and a receiver antenna. The transmitter antenna and the receiver antenna have to be physically separated from each other for ensuring clear transmitting and receiving actions and minimizing any loss. In this respect, the transmitter antenna and the receiver antenna according to the present invention are installed together with their relevant semiconductor chip(s) in one single package which is also reduced in the overall size. As the antennas in the package are capable of transmitting and receiving signals through an aperture or a non-conductive region of the package, they hardly affect the function of the other components in the package with protection by the package. For processing the transmitting and received signals, the semiconductor chips in the embodiments may be substituted with vacuum tubes of a miniature size or other type.

It must be understood that the invention is in no way limited to the above embodiments and that many changes may be brought about therein without departing from the scope of the invention as defined by the appended claims.

What is claimed is:

1. An ultra high frequency radio communication apparatus comprising:
    a receiver antenna;
    a transmitter antenna;
    an IC chip electrically connected to the receiver antenna and the transmitter antenna;
    a substrate on which the receiver antenna, the transmitter antenna and the IC chip are mounted;
    an input terminal for inputting a base band input signal to the IC chip;
    an output terminal for outputting a base band output signal from the IC chip;
    a control signal terminal for inputting to the IC chip a control signal for controlling the IC chip; and
    a shielding device having a wave guide structure for producing a shielding space such that the cut-off frequency of the shielding space is higher than the frequency of a carrier signal for radio communication in such a manner that the IC chip is located in the shielding space.

2. The ultra high frequency radio communication apparatus according to claim 1, wherein the wave guide structure encompasses the IC chip with an electrically conductive material.

3. An ultra high frequency radio communication apparatus comprising:
    a package having a constriction portion such that the cut-off frequency of the constriction portion is higher than the frequency of a carrier signal for radio communication;
    a receiver antenna;
    a transmitter antenna;
    an IC chip electrically connected to the receiver antenna and the transmitter antenna;
    an input terminal for inputting a base band input signal to the IC chip;
    an output terminal for outputting a base band output signal from the IC chip;
    a control signal terminal for inputting to the IC chip a control signal for controlling the IC chip; and
    a substrate installed in the package in which the receiver antenna, the transmitter antenna and the IC chip are mounted on the substrate in such a manner that the IC chip is located in the constriction portion.

4. The ultra high frequency radio communication apparatus according to claim 3, wherein the package has an inner space including a first chamber for receiving the receiving antenna, and a second chamber for receiving the transmitter antenna, and the constriction portion has a bore with a first end and a second end in which the first chamber is communicated to the bore at the first end and the second chamber is communicated to the bore at the second end.

5. The ultra high frequency radio communication apparatus according to claim 4, wherein the bore has a wave guide structure encompassing the IC chip with an electrically conductive material.

6. The ultra high frequency radio communication apparatus according to claim 5, wherein the wave guide structure includes an electrically conductive layer formed in the substrate and a box-shaped metal cap which is connected to the electrically conductive layer to encompass the IC chip.

7. The ultra high frequency radio communication apparatus according to claim 4, wherein the constriction portion has a projection member at the first and second ends of the bore for reducing the cross section of the bore at the first and second ends.

8. The ultra high frequency radio communication apparatus according to claim 4, further comprising a heat radiation device for transmitting heat from the IC chip to the package, and the heat radiation device passes through the IC chip to divide the bore of the constriction portion into two parts.

9. The ultra high frequency radio communication apparatus according to claim 3, wherein the IC chip includes an oscillator chip, a transmitter chip and a receiver chip, and the oscillator chip is located at the substantial center of the constriction portion.

10. The ultra high frequency radio communication apparatus according to claim 3, wherein the constriction portion has a heat radiation device for transmitting heat from the IC chip to the package, and the heat radiation device includes a thermal compouund which contact with the IC chip and the package.

11. The ultra high frequency radio communication apparatus according to claim 3, wherein the IC chip comprises a semiconductor chip which includes a low noise high frequency amplifier circuit, a direct demodulator circuit connected to the low noise high frequency amplifier circuit, a direct modulator circuit, an oscillator circuit for controlling the direct modulator circuit, and a power amplifier circuit connected to the direct modulator circuit.

12. The ultra high frequency radio communication apparatus according to claim 3, wherein the IC chip comprises a first semiconductor chip including a low noise high frequency amplifier circuit, and a second semiconductor chip including a direct demodulator circuit connected to the low noise high frequency amplifier circuit, a direct modulator circuit, an oscillator circuit for controlling the direct modulator circuit, and a power amplifier circuit connected to the direct modulator circuit.

13. The ultra high frequency radio communication apparatus according to claim 3, wherein the IC chip comprises a first semiconductorchip and a second semiconductor chip, the first semiconductor chip including a low noise high frequency amplifier circuit, a frequency converter circuit and an oscillator circuit for controlling the frequency converter circuit, and a second semiconductor chip including a direct modulator circuit, an oscillator circuit for controlling the direct modulator circuit, and a power amplifier circuit connected to the direct modulator circuit.

14. The ultra high frequency radio communication apparatus according to claim 3, wherein the oscillator circuit includes a cavity resonator.

15. The ultra high frequency radio communication apparatus according to claim 14, wherein the cavity resonator has a cavity being formed in a silicon material body and having an inner wall covered with a conductor layer.

16. The ultra high frequency radio communication apparatus according to claim 3, wherein the package includes an electrically non-conductive cover cap which covers the receiver antenna, the transmitter antenna and the IC chip which are mounted on the substrate.

17. The ultra high frequency radio communication apparatus according to claim 3, wherein the package has an opening for exposing the receiver antenna and the transmitter antenna to outside of the package.

18. The ultra high frequency radio communication apparatus according to claim 3, wherein the IC chip is connected to the substrate by flip-chip bonding.

19. The ultra high frequency radio communication apparatus according to claim 3, wherein the substrate contains multilayer interconnection, and each of the receiver antenna and the transmitter antenna is connected to the IC chip by a line which is an uppermost wiring layer of the substrate.

20. The ultra high frequency radio communication apparatus according to claim 3, wherein the substrate is selected from the group consisting of an alumina board, an aluminum nitride board, a resin board, a print circuit board and a metal-cored board.

21. The ultra high frequency radio communication apparatus according to claim 3, wherein the substrate has an uppermost patterned metal layer with a thickness equal to or less than 5 $\mu$m.

22. The ultra high frequency radio communication apparatus according to claim 3, wherein the substrate has a pair of opposite surfaces on one of which the IC chip is mounted, and the input terminal, the output terminal and the control signal terminal include bumps which are formed on the other surface of the substrate.

* * * * *